United States Patent
Harada et al.

(10) Patent No.: US 7,968,471 B2
(45) Date of Patent: Jun. 28, 2011

(54) POROUS INSULATING FILM, METHOD FOR PRODUCING THE SAME, AND SEMICONDUCTOR DEVICE USING THE SAME

(75) Inventors: Yoshimichi Harada, Tokyo (JP); Yoshihiro Hayashi, Tokyo (JP); Fuminori Itoh, Tokyo (JP); Kenichiro Hijioka, Tokyo (JP); Tsuneo Takeuchi, Tokyo (JP)

(73) Assignee: NEC Corporation, Tokyo (JP)

(*) Notice: Subject to any disclaimer, the term of this patent is extended or adjusted under 35 U.S.C. 154(b) by 974 days.

(21) Appl. No.: 10/580,606

(22) PCT Filed: Nov. 29, 2004

(86) PCT No.: PCT/JP2004/017697
§ 371 (c)(1),
(2), (4) Date: May 25, 2006

(87) PCT Pub. No.: WO2005/053009
PCT Pub. Date: Jun. 9, 2005

(65) Prior Publication Data
US 2007/0093078 A1 Apr. 26, 2007

(30) Foreign Application Priority Data
Nov. 28, 2003 (JP) .................. 2003-400683

(51) Int. Cl.
*H01L 21/31* (2006.01)
(52) U.S. Cl. ............... 438/780; 257/759; 257/E23.145; 257/E21.273

(58) Field of Classification Search .......... 438/200, 438/680, 778, 787–790; 257/E21.273, 758, 257/759, E23.142, E23.145
See application file for complete search history.

(56) References Cited

U.S. PATENT DOCUMENTS

| | | | |
|---|---|---|---|
| 6,589,644 B1 * | 7/2003 | Yamada et al. | 428/312.6 |
| 6,772,710 B2 * | 8/2004 | Lee | 118/723 HC |
| 7,074,690 B1 * | 7/2006 | Gauri et al. | 438/428 |
| 7,153,580 B2 * | 12/2006 | Rose et al. | 428/446 |
| 7,241,704 B1 * | 7/2007 | Wu et al. | 438/781 |
| 7,491,658 B2 * | 2/2009 | Nguyen et al. | 438/789 |
| 2001/0051447 A1 | 12/2001 | Usami | |
| 2002/0072220 A1 * | 6/2002 | Wang et al. | 438/623 |
| 2002/0155639 A1 | 10/2002 | Ohtake et al. | |

(Continued)

FOREIGN PATENT DOCUMENTS

JP 2001-230244 8/2001

(Continued)

*Primary Examiner* — Matthew C Landau
*Assistant Examiner* — Latanya Crawford
(74) *Attorney, Agent, or Firm* — Whitham Curtis Christofferson & Cook, PC

(57) ABSTRACT

The present invention provides a process of producing a porous insulating film effective as an insulating film constituting a semiconductor device and a process of producing a porous insulating film having high adhesion to a semiconductor material, which is in contact with the upper and lower interfaces of the insulating film. Gas containing molecule vapor of at least one or more organic silica compounds, which have a cyclic silica skeleton in its molecule and have at least one or more unsaturated hydrocarbon groups bound with the cyclic silica skeleton is introduced into plasma to grow a porous insulating film on a semiconductor substrate.

70 Claims, 21 Drawing Sheets

U.S. PATENT DOCUMENTS

| | | | |
|---|---|---|---|
| 2003/0162408 A1* | 8/2003 | Matsuki et al. | 438/758 |
| 2004/0091419 A1* | 5/2004 | Ogihara et al. | 423/702 |
| 2004/0135254 A1* | 7/2004 | Fujita et al. | 257/751 |
| 2004/0137243 A1* | 7/2004 | Gleason et al. | 428/447 |
| 2004/0166240 A1* | 8/2004 | Rhee et al. | 427/255.28 |
| 2004/0166692 A1* | 8/2004 | Loboda et al. | 438/778 |
| 2004/0212114 A1* | 10/2004 | Kashiwagi et al. | 264/30 |
| 2004/0241463 A1* | 12/2004 | Vincent et al. | 428/447 |
| 2004/0253777 A1* | 12/2004 | Miyoshi et al. | 438/200 |
| 2005/0267253 A1* | 12/2005 | Hayashi | 524/588 |
| 2005/0276930 A1* | 12/2005 | Gates et al. | 427/551 |
| 2006/0151884 A1* | 7/2006 | Hara et al. | 257/759 |

FOREIGN PATENT DOCUMENTS

| | | | |
|---|---|---|---|
| JP | 2001-326222 | | 11/2001 |
| JP | 2002-118169 | | 4/2002 |
| JP | 2002-252222 | | 9/2002 |
| JP | 2004-47873 | | 2/2004 |
| JP | 2004047873 A | * | 2/2004 |
| JP | 2004-534400 | | 11/2004 |
| WO | WO 03/005429 | | 1/2003 |
| WO | WO 03/019645 | | 3/2003 |
| WO | WO 2004-008517 | | 1/2004 |

* cited by examiner

F I G. 3
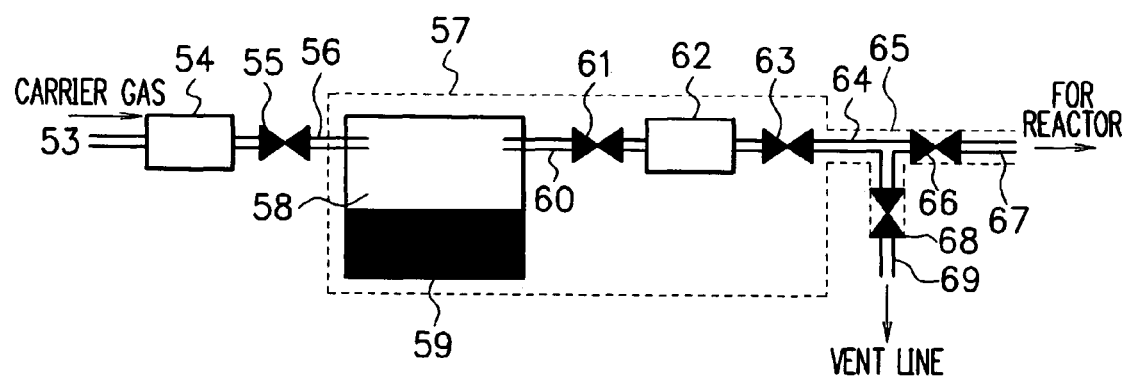

F I G. 13
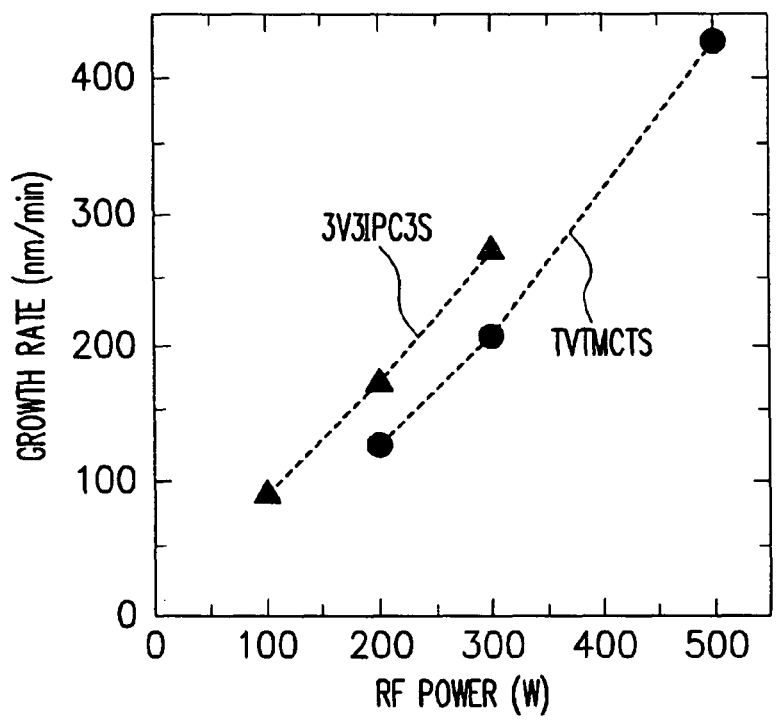
F I G. 14
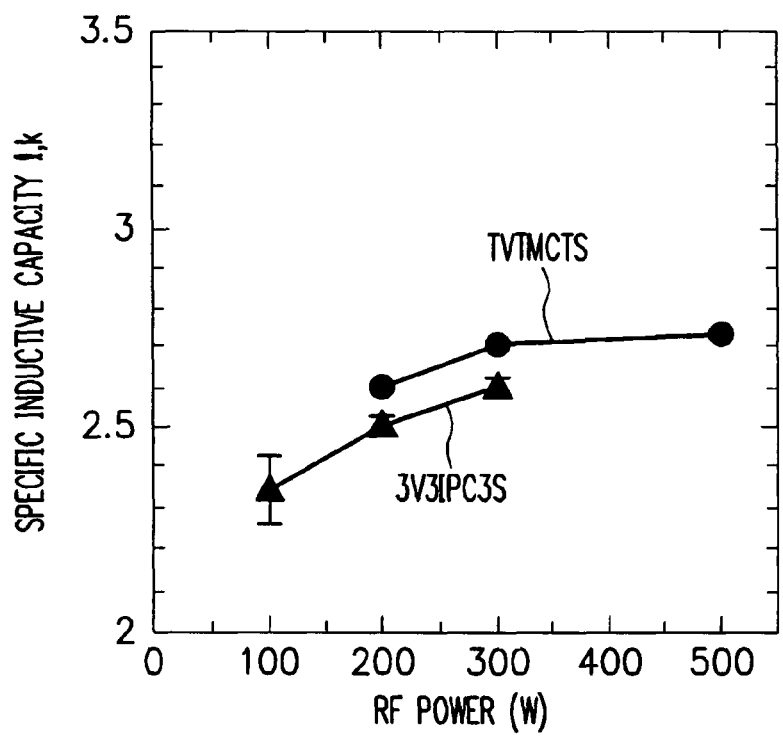

F I G. 18
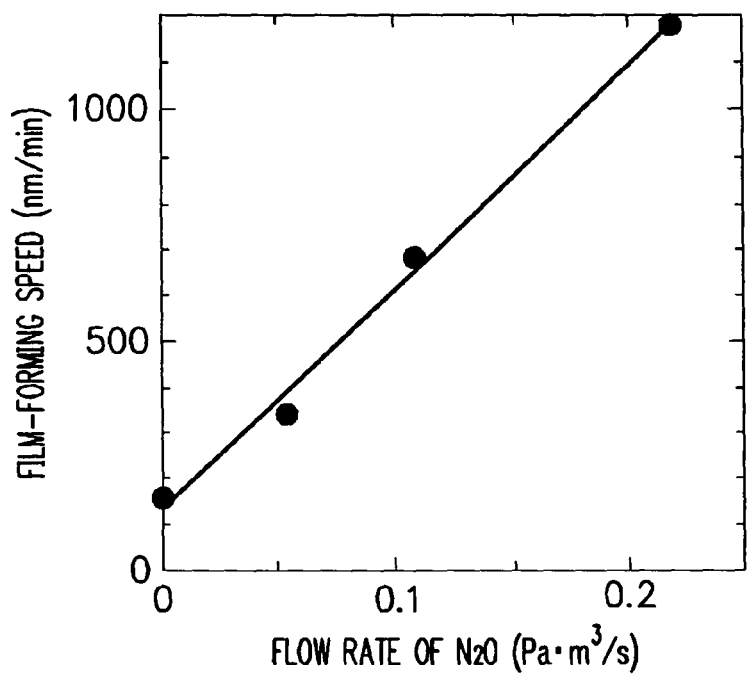
F I G. 19
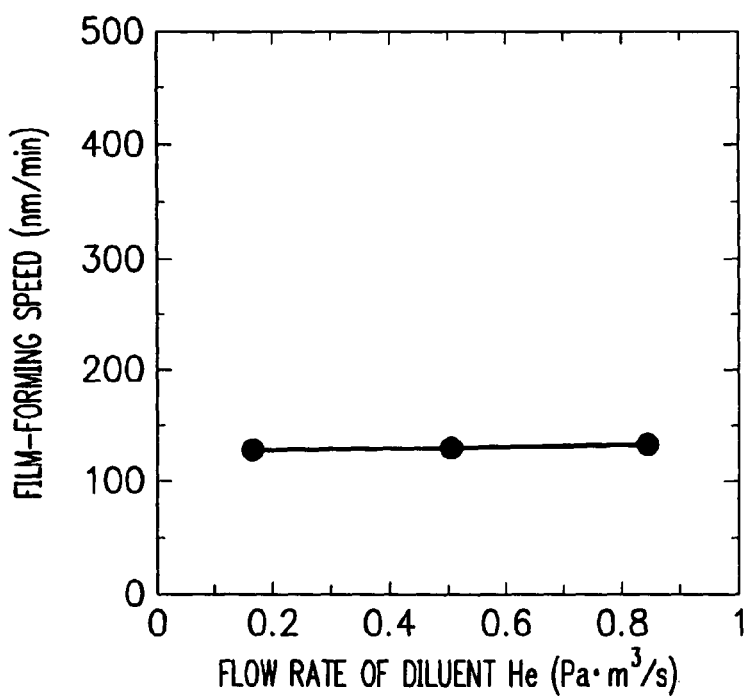

F I G. 30
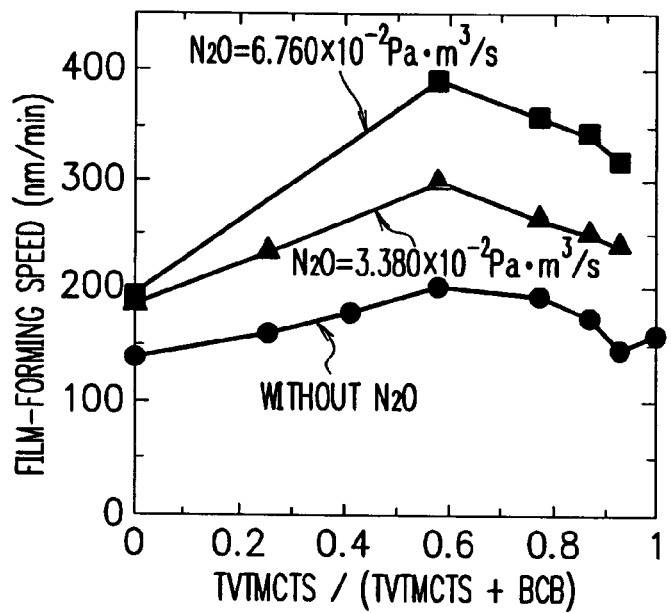
F I G. 31
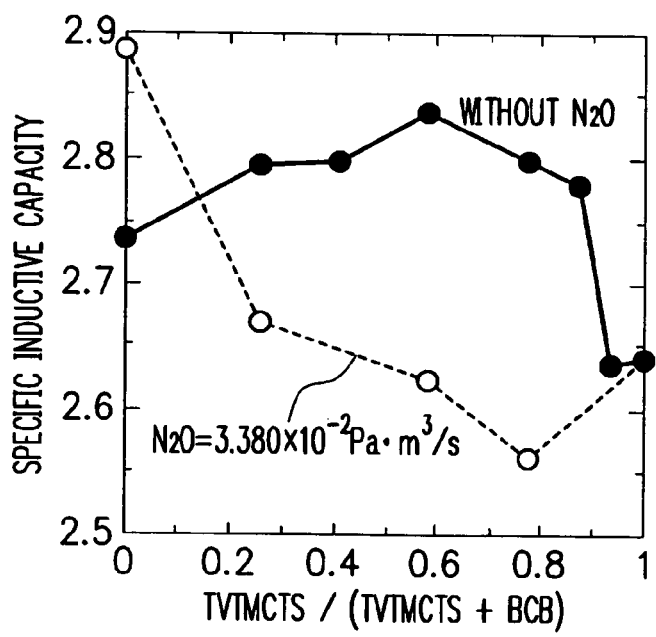

F I G. 34
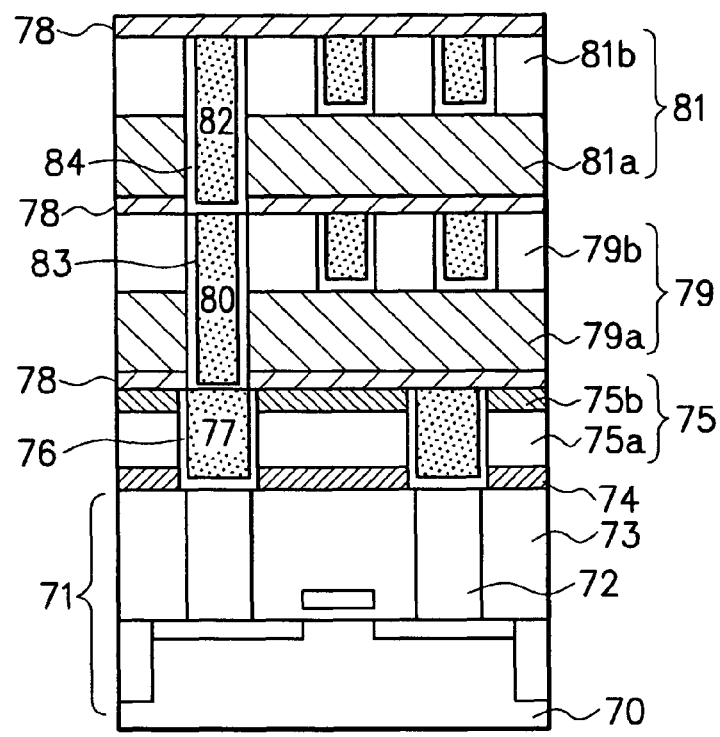
F I G. 35
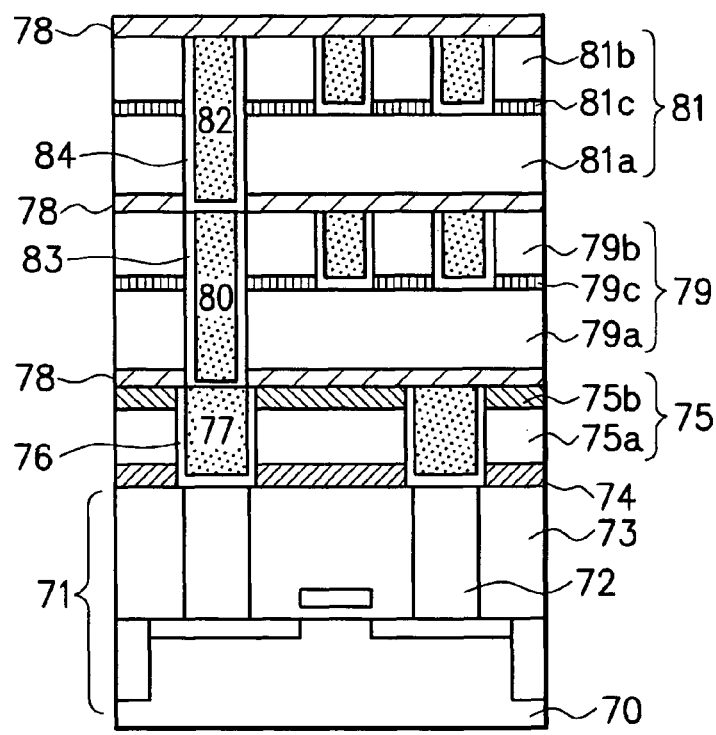

POROUS INSULATING FILM, METHOD FOR PRODUCING THE SAME, AND SEMICONDUCTOR DEVICE USING THE SAME

FIELD OF THE INVENTION

The present invention relates to a porous insulating film usable as an insulating film constituting a semiconductor device, to a method of producing the porous insulating film and to a semiconductor device utilizing the porous insulating film.

BACKGROUND ART

Along with recent technological development, more highly integrated and higher density semiconductors have been developed. This is associated with a tangible increase in wiring delay resulting from a progress in micronization of wiring width and wiring pitch.

The wiring delay is proportional to the product of wiring resistance and capacitance between wires and wiring resistance tends to be increased along with the aforementioned micronization of wiring width. Therefore, an increase in capacitance between wires leads to a remarkable increase in wiring delay, bringing about a deterioration in circuit operation speed resultantly. Therefore, in order to raise the circuit operation speed of a semiconductor device, adoption of low-resistance wiring materials and layer insulting films having a low dielectric constant and establishment of process technologies for producing a semiconductor device by using these materials and films are being sought.

As current wiring materials of a semiconductor integrated circuit, aluminum or aluminum alloys are primarily used. In integrated circuits that are expected to be operated at a higher speed, copper, which is a metal having lower resistance than aluminum, is adopted as wiring material to thereby reduce wiring resistance.

In the meantime, in order to reduce the capacitance between wires, it is necessary to drop the dielectric constant of an insulating film enclosing a wiring member. It is therefore effective to adopt insulating materials having a lower specific inductive capacity than inorganic type materials such as $SiO_2$ (specific inductive capacity is 4), SiON (specific inductive capacity is 4 to 6) and $Si_3N_4$ (specific inductive capacity is 7), which have been utilized so far. Specifically, fluorine-added $SiO_2$ (SiOF), organic type insulating film materials containing a carbon atom or the like are currently utilized as materials having a low dielectric constant.

Although the fluorine-added $SiO_2$ can reduce specific inductive capacity when fluorine in the film is concentrated, it raises a problem that moisture absorption increases. Further, there is another problem that hydrogen fluoride produced by a reaction between moisture and hydrogen corrodes wiring materials and a rise in specific inductive capacity due to desorption of fluorine. Accordingly, the specific inductive capacity obtained substantially by fluorine-added $SiO_2$ is about 3.3 and it is difficult to attain a specific inductive capacity of 3 or less.

On the other hand, examples of the organic type insulating film material containing a carbon atom include organic SOG (spin on glass), polyimides, carbon-added $SiO_2$ (hereinafter referred to as SiOCH) using organic silane gas, or insulating films (hereinafter referred to as a porous film) obtained by making these materials porous. Among these materials, especially, the porous insulating film can attain a specific inductive capacity of 2.8 or less because it contains pores therein and is one of the materials expected to act as interlayer insulating films of ULSI multilayer copper wiring next to the 90 nm generation.

Examples of one of the methods of forming porous insulating films include a spin coating method. In the spin coating method, for example, a solution prepared by mixing a raw material monomer and a pore forming agent is applied by spin coating (the solution is dripped on the surface of a rotating silicon substrate) to form a film on the silicon substrate. Then, the silicon substrate is heated to 350° C. to 450° C. to cause a thermal polymerization reaction and the thermal decomposition dissociation reaction of the pore forming agent in the film, thereby forming a porous insulating film containing pores in the film. This spin coating method is a method that is widely used as the method of forming an insulating film. However, this method has the following problem.

In the spin coating method, a monomer solution prepared by dissolving monomers in an organic solvent is applied by spin coating and uniformed. At this time, about 90% of the solution is splashed off the substrate and becomes a waste solution. Therefore, the utility effect of a raw material is low and the production cost is therefore increased.

Also, in the spin coating method, a heating step for causing a polymerization reaction and a curing reaction of the monomers is required. In this heating step, generally, heat treatment is carried out for several tens minutes to several hours in a furnace kept at a temperature of about 300 to 450° C. and therefore, the throughput of the whole process for producing a device is dropped. Also, when oxygen molecules are present in the air during heating, these oxygen molecules react with the monomers and there is the case where an intended film structure is not obtained. It is therefore necessary to substitute the whole gas of the baking furnace with inert gas to remove oxygen molecules in the air during heating, which is a hindrance to cost reduction.

Moreover, a coating and heating step is carried out in each layer when multilayer wiring is formed and therefore the lowermost wiring layer repeatedly receives heat stress at high temperatures for a long time. This is a cause of a reduction in reliability, especially, of the deterioration of fined copper wiring.

Also, the porous insulating film obtained by a spin coating method has pores continuing to the surface of the film because of its formation principle. In more detail, in the spin coating method, regions where the pore forming agent in the film are thermally decomposed and dissociated are obtained as pores. To achieve this, it needs gas vents through which the heat-decomposed and dissociated gas is emitted from the inside of the film to the outside (film surface). Because the pores in the film are always connected to the gas vents, the pores are continuous pores continuing to the surface of the film. Specifically, in the case of the spin coating method, since the polymerizing and growing step for forming an insulating film by utilizing a thermal reaction is independent of the step of forming pores, the porous insulating film has a structure provided with continuous pores leading to the surface of the film consequently.

However, these continuous pores leading to the surface of the film act as passages through which moisture in the outside air and etching gas or cleaning water used for semiconductor processing penetrate and diffuse. As a result, the characteristics of the porous insulating film changes with time, resulting in an unstable porous film.

As another method of obtaining a porous insulating film, a plasma CVD method forming an amorphous insulating film is taken. In this plasma CVD method, a raw material gas is dissociated and activated in plasma to form an amorphous insulating film. This method has the advantage superior to the coating method in the point of utility efficiency of a raw material and the raw material is made into a thin film more easily than the spin coating method. Also, this method has the advantage that unlike the coating method, it needs no curing step with heating.

However, in the above plasma CVD method, the starting raw material gas is dissociated into an atomic level in plasma and on principle, it is not that a structure reflecting the molecular skeleton of the starting material is grown. For example, when a straight-chain organic silica molecule is dissociated in plasma, some of activated silica molecules are bonded in the plasma gas before they reach a silicon substrate and are accumulated like falling snow to form a bulky porous film on a substrate.

In this case, it is necessary to prolong the time for the activated atoms to stay in plasma in order to promote the linking reaction of the activated atoms in the plasma. Specifically, it is necessary to keep the substrate sufficiently apart from the plasma. However, it is difficult to control the process of forming a film of the activated atom in the plasma and it is difficult to control the structure of a growing porous insulating film. Namely, it is basically difficult to control the size and filling density of pores in the film for obtaining a low dielectric constant. Also, because this method needs large plasma power to dissociate the starting material, it gives rise to the problem that a semiconductor device receives a large damage. Moreover, when the pore diameter is increased to about 3 nm or more, moisture, process gas, chemical solutions and the like easily enter into the insulating film and the strength of the film lowers, with the result that this causes a deterioration in the reliability of the insulating film and lower adaptability to a process of manufacturing a semiconductor device.

Also, when the porous insulating film is utilized as a layer insulating film, it must have high adhesiveness to other semiconductor materials that are in contact therewith. In order to develop the interlayer insulating film having a lower dielectric constant, it is effective to decrease the ratio of polar elements (for example, oxygen and silicon) contained in the film, specifically, to increase the ratio of organic groups in the film. However, if the ratio of polar elements is decreased, the surface density of these polar elements is decreased on the interface between the film and other semiconductor materials and also the film has such a structure that its composition abruptly changes at the contact interface, with the result that it is difficult to maintain high adhesiveness.

Japanese Patent Application Laid-Open No. 2001-230244 named "METHOD OF FORMING INSULATING FILM AND MULTILAYER WIRING" (Patent document 1) aims to lower the specific inductive capacity of an insulating film. The invention efficiently forms a film of benzocyclobutene having high heat resistance by growing plasma polymerization divinylsiloxane-bis-benzocyclobutene on the surface of a semiconductor substrate.

SUMMARY OF THE INVENTION

Problems to be Solved by the Invention

However, the insulating film obtained by the invention described in Patent document 1 does not use a raw material having a cyclic structure as the starting material and it is therefore difficult to limit the density of the insulating film to a lower level. Also, in the invention described in Patent document 1, the specific inductive capacity of the formed insulating film changes depending on the pressure under which the insulating film is grown even if the same raw material is used. Specifically, it is difficult to obtain an insulating film having the same characteristics stably by the invention described in Patent document 1.

As mentioned above, it is difficult to control the specific inductive capacity to a specified value though an insulating film having a low specific dielectric constant can be obtained by conventional technologies.

In view of this situation, the present invention has been made and it is an object of the present invention to provide a process of producing a porous insulating film, which can stably produce an insulating film having a low specific inductive capacity, a porous insulating film produced by this method and a semiconductor device using this porous insulating film as a interlayer insulating film.

Means to Solve the Problem

The inventors of the present invention have repeatedly made studies to solve the above problem and, as a result, found that a porous insulating film having a low dielectric constant and pores in the formed film can be formed in a method of growing a porous insulating film by using, as starting material, an organic silica compound which has a cyclic silica skeleton in its molecule and in which at least one unsaturated hydrocarbon group is bound with the cyclic silica skeleton and by allowing the organic silica compound to run a plasma polymerization reaction or to react with oxidizer gas or hydrogenated silicon gas.

Specifically, in order to attain the above object, the present invention provides, as a first embodiment, a method of producing a porous insulating film, the process comprising introducing gas containing vapor of cyclic organic silica compounds, which have a silicon or oxygen skeleton and at least one unsaturated hydrocarbon group bound with a side chain of the skeleton, into plasma to grow a porous insulating film on a semiconductor substrate.

In the process of producing a porous insulating film according to the first embodiment, at least one cyclic organic silica compound, which has a cyclic silica skeleton in its molecule and has at least one unsaturated hydrocarbon group bound with the cyclic skeleton is used as starting material to allow the organic silica compound to run a plasma polymerization reaction or to react with oxidizer gas or hydrogenated silicon gas, whereby a porous insulating film that has high process stability, allows pores to be easily formed and has a low dielectric constant can be formed.

Also, in order to attain the above object, the present invention provides, as a second embodiment, a method of producing a porous insulating film, the process comprising introducing vapor of cyclic organic silica compounds, which have a silicon or oxygen skeleton and have at least one unsaturated hydrocarbon group bound with a side chain of the skeleton and vapor of straight-chain organic silica compounds, which have a silicon or oxygen skeleton and any one selected from the group consisting of hydrogen, a hydrocarbon group and a hydrocarbon oxide group bound with a side chain of the skeleton, into plasma to grow a porous insulating film on a semiconductor substrate. In the second embodiment of the present invention, it is preferable to change the supply ratio of cyclic organic silica compound to straight-chain organic silica compound during the course of film formation.

According to the method of producing a porous insulating film according to the second embodiment of the present invention, a cyclic organic silica compound and a straight-chain organic silica compound, which has a silicon or oxygen skeleton and has any one selected from the group consisting of hydrogen, a hydrocarbon group and a hydrocarbon oxide group bound with the straight-chain silica skeleton are used to cause a plasma polymerization reaction or a reaction with oxidizer gas or hydrogenated silicon gas, whereby a porous insulating film can be formed where the concentrations of carbon and hydrogen in the film are controlled while maintaining a low dielectric constant. Moreover, the concentration of carbon in the vicinity of the interface between the porous insulating film and a non-porous insulating film which is in contact with the porous insulating film is controlled continuously or stepwise during the course of the process of forming a film, which makes it possible to obtain high adhesion to a semiconductor material that is in contact with the porous insulating film.

In the second embodiment of the present invention, the straight-chain organic silica compound preferably has a structure represented by one of the formulae (1).

[formula 6]

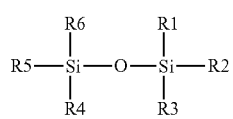

(1)

where $R_1$ to $R_6$, which may be the same or different, respectively represent any one selected from the group consisting of hydrogen, a hydrocarbon group and a hydrocarbon oxide group; or

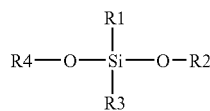

(1)

where $R_1$ to $R_4$, which may be the same or different, respectively represent any one selected from the group consisting of hydrogen, a hydrocarbon group and a hydrocarbon oxide group; or

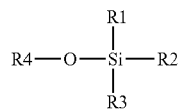

(1)

where $R_1$ to $R_4$, which may be the same or different, respectively represent any one selected from the group consisting of hydrogen, a hydrocarbon group and a hydrocarbon oxide group; or

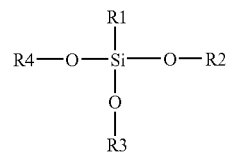

(1)

where $R_1$ to $R_4$, which may be the same or different, respectively represent any one selected from the group consisting of hydrogen, a hydrocarbon group and a hydrocarbon oxide group.

In the above first and second embodiments of the present invention, the cyclic organic silica compounds are preferably cyclosiloxane monomers represented by the formula (2). In the formula (2), each $R_1$ and each $R_2$ are any one of the group consisting of hydrogen, an alkyl group, an alkoxide group, an amino group, alkene, alkyne, a phenyl group and a phenol group, provided that $R_1$ and $R_2$ may be the same or different. It is to be noted that at least one of side chain groups is an unsaturated hydrocarbon group. Also, n is an integer of 2 or more.

[formula 7]

$$\left[ \begin{array}{c} R1 \\ | \\ SiO \\ | \\ R2 \end{array} \right]_n$$

(2) Cyclosiloxane Monomer

In the formula (II), $R_1$ and $R_2$ are any one of the group consisting of hydrogen, an alkyl group, an alkoxide group, an amino group, alkene, alkyne, a phenyl group and a phenol group, provided that $R_1$ and $R_2$ may be the same or different. It is to be noted that at least one of the side chain groups is an unsaturated hydrocarbon group. Also, n is an integer of 2 or more.

Or, in the above first and second embodiments of the present invention, the cyclic organic silica compounds are preferably tetravinyltetramethylcyclotetrasiloxane monomers represented by the formula (3).

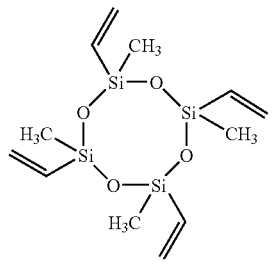

[formula 8]

(3) Tetravinyltetramethylcyclotetrasiloxane

Or, in the above first and second embodiments of the present invention, the cyclic organic silica compounds are preferably trivinyltriisopropylcyclotrisiloxane monomers represented by the formula (4).

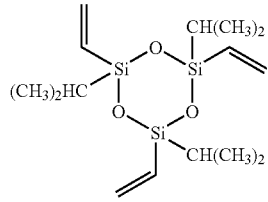

[formula 9]

(4) Trivinyltriisopropylcyclotrisiloxane

Or, in the above second embodiment of the present invention, the cyclic organic silica compounds are preferably tetravinyltetramethylcyclotetrasiloxane monomers represented by the formula (3) and the straight-chain organic silica compounds are preferably divinylsiloxanebenzocyclobutene monomers represented by the formula (5).

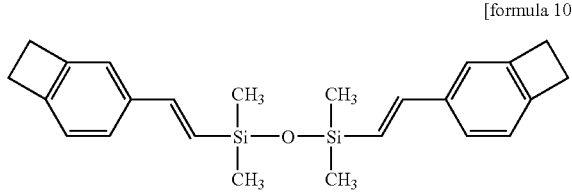

(5) Divinylsiloxanebenzocyclobutene

Or, in the above first and second embodiments of the present invention, the plasma is preferably plasma of rare gas or mixture gas of rare gas and oxidizer gas.

Also, in order to attain the above object, the present invention provides, as a third embodiment, a porous insulating film formed by the method of producing a porous insulating film according to the above first or second embodiment. In the third embodiment of the present invention, the existential ratios of elements in the film is preferably as follows: O/Si=0.8 to 1.2, C/Si=1.5 to 10.0 and H/Si=4.0 to 15.0. The diameter of pores contained in the film is preferably 3 nm or less. Also at least a part of pores contained in the film preferably have almost the same diameters as the skeleton of the cyclic organic silica compound.

Also, in order to attain the above object, the present invention provides, as a fourth embodiment, a semiconductor device comprising using the porous insulating film formed by the process of producing a porous insulating film according to the first or second embodiment of the present invention, as a layer insulating film of a multilayer wiring.

Also, in order to attain the above object, the present invention provides, as a fifth embodiment, a semiconductor device comprising the porous insulating film formed by changing the supply ratio of cyclic organic silica compound to straight-chain organic silica compound during the course of film formation in the process of producing a porous insulating film according the above second embodiment of the present invention, and a non-porous insulating film that is in contact with the porous insulating film at the interface between both films, wherein the relative concentration of carbon atoms in at least the porous insulating film is changed stepwise or continuously in the vicinity of the interface. In the fifth embodiment of the present invention, the straight-chain organic silica compound preferably has a structure represented by the formula (1). Also, the cyclic organic silica compound is preferably a cyclosiloxane monomer represented by the above formula (2). Also, the cyclic organic silica compound is preferably a tetravinyltetramethylcyclotetrasiloxane monomer represented by the formula (3). Further, the cyclic organic silica compound is desirably a trivinyltriisopropylcyclotrisiloxane monomer represented by the formula (4). Further, the straight-chain organic silica compound is preferably a divinylsiloxanebenzocyclobutene monomer represented by the formula (5). Also, the plasma is preferably rare gas or mixture gas of rare gas and oxidizer gas or mixture gas of rare gas and hydrogenated silicon gas.

In the fifth embodiment of the present invention, an insulating film in which the concentration of carbon in the vicinity of the interface between the porous insulating film and the non-porous insulating film that is in contact with the porous insulating film is controlled is introduced as a layer insulating film of a multilayer copper wiring, to thereby reduce the parasitic capacitance of the wiring, thereby realizing a semiconductor device operated at a high speed by a low power.

The process of forming a porous insulating film according to the present invention makes easy the process of introducing fine pores, well controlled, into an interlayer insulating film and also makes it possible to reduce the specific inductive capacity of the insulating film when the porous insulating film is utilized as the interlayer insulating film constituting the above semiconductor device. It is also possible to obtain high adhesiveness by controlling the concentration of carbon in the vicinity of the interface between the porous insulating film and the non-porous insulating film that is in contact with the porous insulating film.

Also, the semiconductor device according to the present invention reduces the parasitic capacitance of the wiring, thereby realizing a semiconductor device operated at a high speed by a low power by introducing the porous insulating film superior in structural stability and adhesiveness as an interlayer insulating film of a multilayer copper wiring.

Effect of the Invention

The present invention can obtain an insulating film having a low specific inductive capacity through a process of producing a porous insulating film, a porous insulating film produced using this process and a semiconductor device using this porous insulating film as a interlayer insulating film.

PREFERRED EMBODIMENT OF THE INVENTION

The present invention relates to a process of forming a porous insulating film to solve the above problem wherein using as starting material a cyclic organic silica compound comprising a cyclic silica skeleton in its molecule and at least one unsaturated hydrocarbon group bound with the cyclic silica skeleton, a vapor of the cyclic organic silica compound is introduced into a low-power plasma to thereby activate the unsaturated hydrocarbon selectively while the cyclic silica skeleton is maintained. In the cyclic organic silica compound, there are fine pores enclosed by the silica skeleton. When this cyclic silica compound is polymerized with another cyclic organic silica molecule through a hydrocarbon group formed of the unsaturated hydrocarbon, a porous insulating film in which the fine pores enclosed within the silica skeleton are linked in a three-dimensional space is formed.

When, as the starting material, an organic silica compound which has at least one unsaturated hydrocarbon group in its molecule and molecular pores in the monomer is introduced into plasma, the organic silica compound is decomposed in the plasma. Because the organic silica compound has an unsaturated hydrocarbon bond, radicals having one or more non-bonded connector are easily generated. Therefore, a polymerization reaction of these radicals proceeds, with the result that a higher film-forming speed can be obtained than that of a cyclic silica compound containing no unsaturated hydrocarbon bond.

If, for example, a mixture gas of the cyclic organic silica compound and a straight-chain organic silica to which unsaturated hydrocarbons are bound is brought into plasma, besides polymerization among cyclic organic silica compounds, a porous insulating film is formed in which fine pores in the cyclic silica skeleton are polymerized through the straight-chain organic silica. When a straight-chain organic silica compound having a higher carbon density relative to a Si atom than the cyclic organic silica compound is used, a porous insulating film richer in carbon is formed. If the supply ratio of the cyclic organic silica molecule gas to the straight-chain organic silica molecule gas is changed during the course of a film forming process, a porous insulating film is obtained in which the composition of carbon is varied in the direction of the thickness of the grown film.

What is of primary importance here is that it is necessary and essential to use plasma preferentially activating the unsaturated hydrocarbon group bound with the cyclic silica skeleton without destroying the cyclic silica skeleton. The plasma of a rare gas, He, Ne, Ar or Kr is effective to selectively activate the unsaturated hydrocarbon. The inventors of the present invention have found a new phenomenon that plasma of a mixture gas prepared by mixing oxidizer gas in the rare gas promotes selective activation of the unsaturated hydrocarbon group and significantly improves the rate of growth of a porous insulating film. Although its exact promotion reaction mechanism has not been clarified so far, it is inferred that a part of carbon atoms in the unsaturated hydrocarbon group is bound with oxygen and extracted as CO or $CO_2$ and the cyclic organic silica compound is polymerized through carbon radicals left unremoved.

The inventors of the present invention have also found a new phenomenon that plasma of a mixture gas prepared by mixing hydrogenated silicon gas in the rare gas also promotes selective activation of the unsaturated hydrocarbon group and significantly improves the rate of growth of a porous insulating film. Although its exact promotion reaction mechanism has not been clarified so far, also in this case, it is inferred that hydrogen radicals are extracted in the plasma from a part of hydrogenated silicon molecules and these hydrogen radicals react with the unsaturated hydrocarbon into hydrocarbon radicals through which the cyclic organic silica compound are polymerized. It is inferred that because the composition of silicon in the film increases slightly, the hydrogenated silicon radicals from which hydrogen is extracted also contributes to the promotion of polymerization of the cyclic organic silica compound.

The process of producing a porous insulating film according to the present invention as mentioned above is characterized by the structure in which fine pores of the cyclic organic silica compound as starting material are used as the pore source and these fine pores are bound through a derivative of the unsaturated hydrocarbon. Accordingly, the pores in the obtained porous insulating film are occupied mainly by those having a pore diameter almost equal to the diameter of a fine pore inside the cyclic skeleton in the starting material.

The cyclic organic silica compound used in the process of producing a porous insulating film having the above structure according to the present invention is a cyclosiloxane monomer represented by the above formula (2) (in the formula, $R_1$ and $R_2$ are selected from the group consisting of hydrogen, an alkyl group, an alkoxide group, an amino group, alkene, alkyne, a phenyl group and a phenol group, and $R_1$ and $R_2$ may be same or different. At least one of the side chain groups is an unsaturated hydrocarbon group, and n is an integer equal to or more than 2).

As to the number n of ring members, preferably n=3 to 4 and more preferably n=3 from the viewpoint of reducing the pore diameter of the porous insulating film. Namely, if n>4, the cyclic structure becomes unstable so that the cyclic organic silica compound is decomposed in plasma and it is therefore difficult to keep its skeleton structure, and also the vapor pressure increases, making it difficult to gasify the organic silica compound. When n=2, the silica skeleton takes a quadrangle and the organic silica compound is hence unstable, so that it is easily decomposed in plasma. The cyclic organic silica obtained when n=3 shows the same natures as the cyclic organic silica obtained when n=4 from the viewpoint of structural stability and gasifying characteristics. However, the cyclic organic silica obtained when n=3 has a smaller pore inside diameter in the cyclic structure. The inside pore diameter of this cyclic organic silica corresponds to the inside pore diameter of the porous insulating film obtained from the starting material. Thus, a new fact has been found that the case where n=3 is more desirable for a layer insulating film of ULSI multilayer wiring in which finer pores are demanded.

Here, examples of the unsaturated hydrocarbon group which is at least one of the side chain groups include a vinyl group ($-C=CH_2$), propenyl group ($-C=CHCH_3$) and ethynyl group ($-C\equiv CH$). Also, examples of the saturated hydrocarbon group which is at least one of the side chain groups include a methyl group ($-CH_3$), ethyl group ($-CH_2CH_3$), propyl group ($-CH_2CH_2CH_3$) and isopropyl group ($-CH(CH_3)_2$) and tertiary butyl group ($-C(CH_3)_3$) which have large steric hindrance. In the case of a side chain having a large steric hindrance, such an effect is obtained that the density of a resulting film is reduced and the specific inductive capacity comes down more.

Specific examples of the organic silica compound when n=4 include tetravinyltetramethylcyclotetrasiloxane monomers represented by the formula (3).

Besides the above, tetravinylcyclotetrasiloxane derivatives represented by the formula (6) (in the formula (6), $R_1$, $R_2$, $R_3$ and $R_4$, which may be the same or different, respectively represent hydrogen, an alkyl group, an alkoxide group, an amino group, alkene, alkyne, a phenyl group, a phenol group or the like) may be used.

[formula 11]

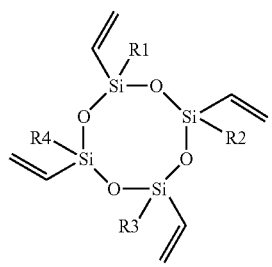

(6) Tetravinylcyclotetrasiloxane Derivative

Further, trivinylcyclotetrasiloxane derivatives represented by the formula (7) (in the formula (7), $R_1$, $R_2$, $R_3$, $R_4$ and $R_5$, which may be the same or different, respectively represent hydrogen, an alkyl group, an alkoxide group, an amino group, alkene, alkyne, a phenyl group, a phenol group or the like) may be used.

[formula 12]

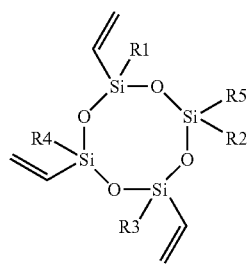

(7) Trivinylcyclotetrasiloxane Derivative

Further, divinylcyclotetrasiloxane derivatives represented by the formula (8) or (9) (in the formulae (8) and (9), $R_1$, $R_2$, $R_3$, $R_4$, $R_5$ and $R_6$, which may be the same or different, respectively represent hydrogen, an alkyl group, an alkoxide group, an amino group, alkene, alkyne, a phenyl group, a phenol group or the like) may also be used.

[formula 13]

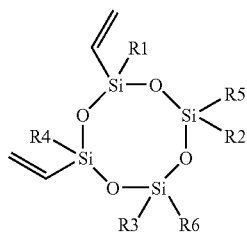

(8) Divinylcyclotetrasiloxane Derivative

[formula 14]

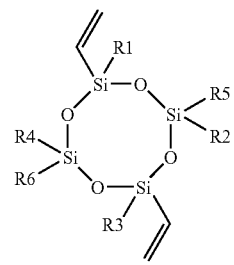

(9) Divinylcyclotetrasiloxane Derivative

Also, vinylcyclotetrasiloxane derivatives represented by the formula (10) (in the formula (10), $R_1$, $R_2$, $R_3$, $R_4$, $R_5$, $R_6$ and $R_7$, which may be the same or different, respectively represent hydrogen, an alkyl group, an alkoxide group, an amino group, alkene, alkyne, a phenyl group, a phenol group or the like) may also be used.

[formula 15]

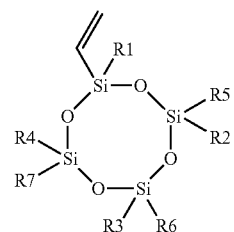

(10) Vinylcyclotetrasiloxane Derivative

The organic silica compound may be likewise pentavinylcyclotetrasiloxane derivatives, hexavinylcyclotetrasiloxane derivatives, heptavinylcyclotetrasiloxane derivatives or octavinylcyclotetrasiloxane derivatives.

The cyclic silica skeleton constituting the organic silica compound as a starting material is not limited to an eight-membered ring obtained when n=4, but may be a four-membered ring (n=2), six-membered ring (n=3) or rings having ten or more members (n=5 or more) and it is only required for these rings to have at least one unsaturated hydrocarbon bond.

Specific examples of the cyclic organic silica compound obtained when n=3 include trivinyltriisopropylcyclotrisiloxane monomers represented by the above formula (4).

Also, trivinylcyclotrisiloxane derivatives represented by the formula (11) (in the formula (11), $R_1$, $R_2$ and $R_3$, which may be the same or different, respectively represent hydrogen, an alkyl group, an alkoxide group, an amino group, alkene, alkyne, a phenyl group, a phenol group or the like) may be used besides the above compounds.

However, at least one of the side chains must be an unsaturated hydrocarbon group. Examples of the unsaturated hydrocarbon group include a vinyl group (—C=$CH_2$), a propenyl group (—C=$CHCH_3$) and an ethynyl group (—C≡CH). Also, examples of the saturated hydrocarbon group include a methyl group (—$CH_3$), an ethyl group (—$CH_2CH_3$), a propyl group (—$CH_2CH_2CH_3$) and an isopropyl group (—$CH(CH_3)_2$) and a tertiary butyl group (—$C(CH_3)_3$), where the last two groups have a large steric hindrance. When a side chain has a large steric hindrance, such an effect is obtained that the density of a resulting film is reduced and the specific inductive capacity more comes down.

[formula 16]

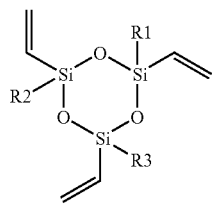

(11) Trivinylcyclotrisiloxane Derivative

Also, besides the above compounds, divinylcyclotrisiloxane derivatives represented by the formula (12) (in the formula (12), $R_1$, $R_2$, $R_3$ and $R_4$, which may be the same or different, respectively represent hydrogen, an alkyl group, an alkoxide group, an amino group, alkene, alkyne, a phenyl group, a phenol group or the like) may be used.

However, at least one of the side chains is an unsaturated hydrocarbon group. Examples of the unsaturated hydrocarbon group which is at least one of the side chain groups include a vinyl group (—C=$CH_2$), a propenyl group (—C=$CHCH_3$) and an ethynyl group (—C≡CH). Also, examples of the saturated hydrocarbon group which is at least one of the side chain groups include a methyl group (—$CH_3$), an ethyl group (—$CH_2CH_3$), a propyl group (—$CH_2CH_2CH_3$) and isopropyl group (—$CH(CH_3)_2$) and tertiary butyl group (—$C(CH_3)_3$), where the last two groups have a large steric hindrance. When a side chain has a large steric hindrance, such an effect is obtained that the density of a resulting film is reduced and the specific inductive capacity more comes down.

[formula 17]

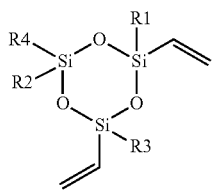

(12) Divinylcyclotrisiloxane Derivative

Also, besides the above compounds, vinylcyclotrisiloxane derivatives represented by the following formula (13) (in the formula (13), $R_1$, $R_2$, $R_3$, $R_4$ and $R_5$, which may be the same or different, respectively represent hydrogen, an alkyl group, an alkoxide group, an amino group, alkene, alkyne, a phenyl group, a phenol group or the like) may be used.

However, at least one of the side chains is an unsaturated hydrocarbon group. Examples of the unsaturated hydrocarbon group which is at least one of the side chain groups include a vinyl group (—C=CH$_2$), a propenyl group (—C=CHCH$_3$) and an ethynyl group (—C≡CH). Also, examples of the saturated hydrocarbon group which is at least one of the side chain groups include a methyl group (—CH$_3$), an ethyl group (—CH$_2$CH$_3$), a propyl group (—CH$_2$CH$_2$CH$_3$) and an isopropyl group (—CH(CH$_3$)$_2$) and a tertiary butyl group (—C(CH$_3$)$_3$), where the last two groups have a large steric hindrance. When a side chain has a large steric hindrance, such an effect is obtained that the density of a resulting film is reduced and the specific inductive capacity drops more.

[formula 18]

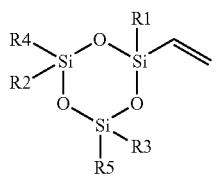

(13) Vinylcyclotrisiloxane Derivative

Moreover, one of the above cyclic organic silica compound raw materials yields a sufficient effect but even if these cyclic organic silica compounds are used in combinations of two or more, a porous insulating film can be grown. Furthermore, a cyclic organic silica compound containing an unsaturated hydrocarbon may be combined with a straight-chain organic silica compound bound with any one selected from the group consisting of hydrogen, a hydrocarbon group and hydrocarbon oxide group at its side chain.

Next, an example of a deposition apparatus (film forming apparatus) used in the process of producing a semiconductor device according to an embodiment of the present invention is shown in FIG. 1.

The pressure in a reaction chamber 1 is reduced by a vacuum pump 9 communicated with the reaction chamber 1 through an exhaust pipe 7, an exhaust valve 22 and a cooling trap 8. A substrate heating part 3, which also acts as a substrate support, is disposed inside the reaction chamber 1 and a semiconductor substrate (substrate on which a film is to be formed) 2 is placed on the substrate heating part 3.

Monomers as starting material are evaporated in a gasifying system 16a and the gasified molecule vapor is supplied together with a carrier gas to the reaction chamber 1 through a valve 21a and a pipe 15. When two types of monomers are used as starting material, the following process involving the above process may be carried out: specifically, a molecule vapor gasified using a gasifying system 16b is fed together with a carrier gas to the pipe 15 through a valve 21b, molecule vapors of two types of the monomers are mixed in the pipe 15 and the mixture gas is supplied to the reaction chamber 1. Also, when three or more types of raw materials are used, plural raw material tanks (not shown), plural raw material supply pipes (not shown), plural gasifying systems (not shown), plural gasified raw material supply pipes (not shown) and the like may be likewise arranged.

In addition, oxidizer gas, hydrogenated silicon gas, diluent gas, purge gas and cleaning gas can be introduced into the pipe 15 through a valve 20 and a flow controller 18 and if necessary, the oxidizer gas is added to the gasified molecule vapor and inert gas is used to dilute the gasified molecule vapor.

The cleaning gas is used to remove adhesive products in the reaction chamber 1. As the cleaning gas, a mixture gas of O$_2$ and fluorocarbon gas is frequently used. However, the cleaning gas is not limited to this mixture gas and any gas may be used insofar as it has the effect of removing the adhesive products. Also, a remote plasma system using NF$_3$ or the like may be utilized in place of the cleaning gas.

As the oxidizer gas, O$_2$, CO$_2$, CO, N$_2$O, NO$_2$ or the like may also be used. Other than the above gases, H$_2$O has an oxidation effect. However, when H$_2$O is used, a Si—OH group is formed in the film. The —OH group contained in this Si—OH bond is affected by heat or reacts with a gas component during a heating process when a multilayer wiring is formed and resultantly enters into a reaction among Si—OH groups or a reaction with hydrogen contained in etching gas to generate H$_2$O. In order to force H$_2$O left in the film to leave the film, heat treatment is performed at 100° C. or more, which brings about an increase in the number of steps, an increase in costs and a reduction in throughput.

Though H$_2$O left in the film leaves the film by heat treatment, this causes the film to shrink when H$_2$O leaves. When H$_2$O is left in the form of a water molecule in the film, this brings about a big rise in the specific inductive capacity of the film because the specific inductive capacity of H$_2$O is about 80. Therefore, it is not preferable to use H$_2$O as the oxidizer.

As the diluent gas, He, Ar, Ne or Xe may be used. The hydrogenated silicon gas is a compound including at least one or more hydrogens that are directly connected to the silicon and not including oxygen, and specific examples of the compound include silane gas (SiH$_4$), trimethylsilane gas (SiH(CH$_3$)$_3$), dimethylsilane gas (SiH$_2$(CH$_3$)$_3$), monomethylsilane gas (SiH$_3$CH$_3$) and disilane (Si$_2$H$_6$).

The pipe 15 is heated and kept at a constant temperature by a heater 19 in such a manner that the partial pressure of the molecule vapor is lower than the equilibrium vapor pressure at the temperature therein to prevent reliquefaction of the molecule vapor. The pipe 15 is also used as a conduit for the inert gas that purges the reaction chamber 1.

The molecule vapor, carrier gas, diluent gas and/or oxidizer gas led into the reaction chamber 1 are mixed and distributed by a shower head 4 that is provided with plural through-holes and disposed in the reaction chamber 1. These gases are then sprayed on the semiconductor substrate (substrate on which a film is to be formed) 2. The shower head is provided with a gas distributing plate (not shown) on the upper part thereof.

A RF power source 13 is connected to the shower head 4 through a feed line 11 and a matching controller 12 to supply RF power between the shower head 4 and the substrate heating part 3 grounded through a grounding conductor 6.

The molecule vapor sprayed on the semiconductor substrate 2 is excited and activated by plasma induced by the power impressed between the shower head 4 and the substrate heating part 3, and adsorbed to the surface of the semiconductor substrate 2 placed on the substrate heating part 3. The activated molecule vapor adsorbed to the surface of the semiconductor substrate 2 enters into a polymerization reaction by the plasma energy and the thermal energy given by the substrate heating part 3 to form an insulating film on the semiconductor substrate 2.

The external wall of the reaction chamber 1 is heated by the heater 5 and the exhaust pipe 7 is heated by a heater 23 in order to prevent adsorption of reaction products. A shower head may also be provided with a heater (not shown) from the same reason as above.

The unreacted molecule vapor is led into the cooling trap 8 through the exhausting valve 22 and the exhaust pipe 7. Because the temperature of the surface of the cooling trap 8 is sufficiently low, the molecule vapor coagulates on the surface and is liquefied and solidified inside the cooling trap 8. As a result, the unreacted molecule vapor is recovered in the cooling trap 8. This results in that only addition gases (carrier gas, oxidizer gas, diluent gas and the like) from which raw material is removed and cleaning gas are fed to the vacuum pump 9.

Also, when the vapor pressure of the monomers used as the starting material is lower than that of tetraethoxysilane (TEOS), it is important to decrease pressure loss along the gasifying system 16a (16b) to the reaction chamber 1 in order to gasify a large volume and to prevent reliquefaction of the gasified starting material. To decrease the pressure loss, it is only required to design the diameter of the pipe extending from the outlet of the gasifying system 16a (16b) to the reaction chamber 1 in such a range that the pressure loss is sufficiently small. More specifically, when a pipe having a diameter of about ¼ to ⅜ inch was used between the gasifying system 16a (16b) and the reaction chamber 1, the pressure loss can be reduced by changing the pipe diameter to ½ inch or more (increasing the diameter of the pipe).

Also, when the diameter of the pipe connecting the gasifying system 16a (16b) with the reaction chamber 1 is increased, plasma is easily induced even in the pipe 15 due to a difference in potential between the shower head 4 shown in FIG. 1 and the pipe 15, with the result that reaction products are adsorbed to the vicinity of the gas introduction part on the upper part of the reaction chamber 1 and to the inside of the pipe 15. In order to prevent this, it is very effective to strengthen the insulation performance between the pipe 15 and the upper part of the reaction chamber 1 by disposing an insulating material such as alumina in the vicinity of the gas introduction part and to coat the inside of the pipe 15 with an insulating material when the pipe 15 is made of metal. It is also effective to make a pipe of insulating material (for example, alumina) instead of metal.

FIG. 2 is a typical explanatory view of the gasifying systems 16a and 16b shown in FIG. 1. Here, FIG. 2 shows the case where the raw material monomers are liquid.

The following explanations are given with monomer. However, the same principle can be applied to dimer or oligomer. Also, when the starting material is gas, it is only necessary that the flow rate be controlled by, for example, a flow controller to supply the raw material gas to the reaction chamber 1.

Monomers 24 filled in a raw material tank 25 is led into a gasification controller 35 through a feeder pipe 27, a valve 42, a flow indicator 32 and a valve 46. A carrier gas 26 is led into a gasification controller 35 through a flow controller 34, a valve 47 and a pipe 53. The raw material 24 led into the gasification controller 35 is mixed with the carrier gas 26 in the pipe 36 inside the gasification controller 35 through a valve 48 that is disposed in the gasification controller 35 and feedback-controlled by the flow indicator 32 and led into a gasifying chamber 37 through a valve 50.

The pressure of the gasifying chamber 37 is reduced and is further heated by a heater 38 and therefore, the raw material 24 led into the gasifying chamber 37 is continuously gasified by this heat energy.

The gasified raw material 24 is heated by a heater 38 and is supplied to the reaction chamber 1 together with the carrier gas 26 through a pipe 30, which is kept at a constant temperature by a heater 40, and through a valve 51 and a pipe 39 while the gas temperature is kept as it is. It is to be noted that the flow controller 34, the valve 47 and the pipe 30 are also used to purge the pipe 36 in the gasification controller 35, the valve 50, the gasifying chamber 37, the discharge pipe 39 of the gasifying chamber, the valve 51, the valve 52 and a vent pipe 41.

FIG. 3 is a view typically showing the structure of a gasifying and supply system that generates and supplies molecule vapor of the raw material when the raw material is solid.

A carrier gas 53 is supplied to a raw material tank 58 through a flow controller 54, a valve 55 and a pipe 56. The raw material tank 58 contains a solid raw material 59 therein and is also heated by a heater 57 to such a temperature that the solid raw material 59 is gasified from a molten state or sublimated from a solid phase state to obtain sufficient saturation vapor pressure.

The gasified molecule vapor of the raw material is fed together with the carrier gas 53 to a gasified raw material supply pipe 64 through a pipe 60, a valve 61, a flow controller 62 and a valve 63 and supplied to the reaction chamber 1 through a valve 66 and a pipe 67.

Also, as to the raw material that can be gasified, any material of monomer, dimer and oligomer can be gasified on the same principle. Further, in the present invention, gas inert to the raw material to be gasified such as helium gas, argon gas or neon gas may be properly used as the carrier gas.

As mentioned above, the molecule vapor of the raw material can be supplied in an intended amount to the reaction chamber by selecting a proper gasifying and supply system in any of a solid, liquid and gas state at ambient temperature.

Next, preferred embodiments of the present invention based on the above principle will be shown to explain the present invention in more detail. It is to be noted that each of these embodiments is an example of the best embodiments. However, the present invention is not limited by these embodiments.

First Embodiment

As a first embodiment to practice the present invention preferably, explained is an insulating film formed using, as starting material, a cyclic organic silica compound raw material which has a cyclic silica skeleton in its molecule, wherein at least one unsaturated hydrocarbon group is bound with the cyclic silica skeleton.

The insulating film according to this embodiment is formed using tetravinyl-tetramethylcyclotetrasiloxane (TVT-MCTS) monomers as one of the cyclic organic silica compound raw material which has a cyclic silica skeleton and in which at least one unsaturated hydrocarbon group is bound with the cyclic silica skeleton in its molecule.

For comparison, other insulating films were also formed using two kinds of material different from that of the insulating film in this embodiment.

One of these insulating films (first comparison insulating film) was formed using tertiary butyltriethoxysilane monomers (TBTES) represented by the formula (14), which is a compound having a straight-chain silica skeleton without an unsaturated hydrocarbon group in its molecule.

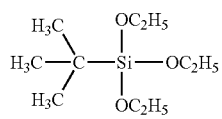

[formula 19]

(14) Tertiary Butyltriethoxysilane

Another insulating film (second comparison insulating film) was formed using tertiary butyldimethylethoxysilane monomers (TBDMES) represented by the formula (15), which is a compound having a straight-chain silica skeleton without an unsaturated hydrocarbon group.

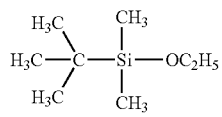

[formula 20]

(15) Tertiary Butyldimethylethoxysilane

As the carrier gas, it is preferable to use Ar, Ne and Xe as well as He, which are inert to the monomers. The flow rate of the carrier gas may be designed such that the partial pressure of the monomers in the gasifying system is smaller than the saturated vapor pressure of the monomers. As the carrier gas, it is considered to use $H_2$ or the like besides the inert gas. However, when $H_2$ is used as the carrier gas, $H_2$ is activated in plasma and enters into an addition reaction with the monomers that is likewise activated in the plasma. Since the carrier gas exists in a larger amount in contrast with the monomers in gas phase, the use of $H_2$ brings about an increase of hydrogen in the film, which is a cause of induction of less stable film characteristics such as a deterioration in heat resistance. Therefore, for example, He, Ne, Ar and Xe, which are inert to the monomers, are preferable as the carrier gas.

When the insulating film according to this embodiment and the first and second comparative insulating films were formed, $8.45 \times 10^{-1}$ Pa·m$^3$/s of helium was supplied as the carrier gas. It is to be noted that the supply amount of gas is a value converted in the standard state (0° C., 1 atom=$1.01 \times 10^5$ Pa). This converted value is used to express the supply amount of gas throughout the following explanation.

Each of the above insulating films was formed as follows: the raw material was gasified in the gasification controller 35 of FIG. 2 and $8.239 \times 10^{-2}$ to $1.099 \times 10^{-1}$ Pa·m$^3$/s of tetravinyltetramethylcyclotetrasiloxane monomers, or, instead of the TVTMCTS monomers, $1.030 \times 10^{-1}$ Pa·m$^3$/s of TBTES monomers or $1.183 \times 10^{-1}$ Pa·m$^3$/s of TBDMES monomers was supplied to form a film.

When the film is formed, besides the carrier gas and the raw material, helium as diluent gas was provided in an amount of $1.690 \times 10^{-1}$ Pa·m$^3$/s and led into the reaction chamber 1. A 200 mm φ silicon substrate (semiconductor substrate) 2 was placed in advance on the substrate heating part 3 kept at 350° C. The pressure in the reaction chamber 1 was reduced to 360 Pa, and high frequency voltage (frequency: 13.56 MHz and RF power: 50 to 700 W) was applied to the shower head 4 having about 300 mm φ to grow an insulating film on the silicon substrate 2 by a plasma polymerization reaction. In this case, the power density of plasma formation corresponded to about 0.05 W/cm$^2$ to 1 W/cm$^2$. It is to be noted that though the temperature of the substrate heating part 3 was set to 350° C., it is preferably designed to be about 200 to 450° C.

FIG. 4 shows the RF power dependency of the film-forming speed (relationship between RF power and film-forming speed) of the insulating film (insulating film according to this embodiment) formed by supplying $8.239 \times 10^{-2}$ Pa·m$^3$/s of TVTMCTS monomers as the raw material, insulating film (first comparison insulating film) formed by supplying $1.030 \times 10^{-1}$ Pa·m$^3$/s of TBTES monomers and insulating film (second comparison insulating film) formed by supplying $1.183 \times 10^{-1}$ Pa·m$^3$/s of TBDMES monomers. The abscissa is the RF power (W) and the ordinate is the film-forming speed (nm/min). The insulating film formed from TVTMCTS containing an unsaturated hydrocarbon group in its molecule exhibited a higher filming speed than the first and second comparison insulating films using TBTES and TBDMES having no unsaturated hydrocarbon group in a molecule though the flow rate of the raw material in the TVTMCTS case was lower than that of the comparison insulating films.

The molecule vapor introduced in plasma is dissociated and activated by the energy supplied from the plasma. At this time, unsaturated hydrocarbon groups bound with the silica skeleton tends to produce a radical having one or more unbound connectors, which act as a "glue" linking molecules, whereby film formation controlled by a polymerization reaction proceeds.

It is inferred that in the case of a compound having no unsaturated hydrocarbon group, it has selectively activated connectors less in number than the compound having an unsaturated hydrocarbon group in a plasma dissociation and therefore, has less unbound connectors, with the result that the film-forming speed is lower.

As a consequence, a film of the silica compound having unsaturated hydrocarbon groups in its molecule is formed at a higher speed than that of the silica compound having no unsaturated hydrocarbon group. Specifically, the insulating film using TVTMCTS monomers having unsaturated hydrocarbon groups in its molecule according to the present invention is formed at a higher rate than the first and second comparison insulating films using TBTES monomers and TBDMES monomers each having no unsaturated hydrocarbon group. Also, the formation of radicals is promoted and a higher film-forming speed can be obtained by increasing RF power.

FIG. 5 shows the RF power dependency of the specific inductive capacity (relationship between specific inductive capacity and RF power) of the insulating film (insulating film according to this embodiment) formed by supplying $8.239 \times 10^{-2}$ Pa·m$^3$/s of TVTMCTS monomers as the raw material, insulating film (first comparison insulating film) formed by supplying $1.030 \times 10^{-1}$ Pa·m$^3$/s of TBTES monomers and insulating film (second comparison insulating film) formed by supplying $1.183 \times 10^{-1}$ Pa·m$^3$/s of TBDMES monomers. The abscissa is the RF power (W) and the ordinate is the specific inductive capacity. Each dielectric constant of the insulating film according to this embodiment and the first and second comparison insulating films was examined and it revealed that when RF power is 200 W or lower, all the films had a specific inductive capacity of 3 or less, which was lower than conventionally utilized insulating films of $SiO_2$ or fluorine-added $SiO_2$.

However, in the case of the first and second comparative insulating films using TBTES monomers and TBDMES monomers, which are silica compounds having no unsaturated hydrocarbon group in its molecule, the specific inductive capacity is increased up to 3 or more when RF power is increased to 300 W or more.

On the other hand, the insulating film using TVTMCTS, which is a silica compound having unsaturated hydrocarbon groups in its molecule, has a smaller increment of the specific inductive capacity than the insulating film using TBTES monomers or TBDMES monomers as the raw material even if RF power is increased. The specific inductive capacity can be kept at 2.8 or less even when RF power is 500 W.

It is inferred that when TBTES or TBDMES monomers are used as the raw material, excessive decomposition of monomers and the dissociation of organic components proceed along with an increase in RF power, which causes a rise in the specific inductive capacity. When TVTMCTS monomers are used as the raw material, film formation is advanced mainly by radicals derived from unsaturated hydrocarbon groups. Consequently, even if RF power is increased, the incorporation of the excessively decomposed monomers and the dissociation of organic components are suppressed. In short, it is inferred that because the film-forming speed is determined not by the supply rate of the raw material but by the rate of activation of the unsaturated hydrocarbon groups and selective growth proceeds according to a polymerization reaction via the unsaturated hydrocarbon groups, the incorporation of the excessively decomposed monomers and the dissociation of organic components are scarcely caused, with the result that the insulating film has an almost fixed specific inductive capacity.

FIG. 6 shows the film-forming speed of an insulating film against the supply amount of raw material when RF power is 200 W (relation between the supply amount of the raw material and the film-forming speed), where the insulating film is formed by using TVTMCTS monomers as the raw material and by changing the supply amount between $2.746 \times 10^{-2}$ Pa·m$^3$/s and $1.099 \times 10^{-1}$ Pa·m$^3$/s. The abscissa is the supply amount of the raw material (Pa·m$^3$/s) and the ordinate is the film-forming speed (nm/min). FIG. 7 shows the specific inductive capacity of an insulating film against the supply amount of the raw material (relation between the supply amount of the raw material and the specific inductive capacity) when RF power is 200 W, where the insulating film is formed by using TVTMCTS monomers as the raw material and by changing the supply amount between $2.746 \times 10^{-2}$ Pa·m$^3$/s and $1.099 \times 10^{-1}$ Pa·m$^3$/s. The abscissa is the supply amount of the raw material (Pa·m$^3$/s) and the ordinate is the specific inductive capacity. As shown in these figures, the insulating film using TVTMCTS monomers according to this embodiment has a constant film-forming speed and a constant specific inductive capacity irrespective of the supply amount of the raw material.

As shown in FIG. 6, the film-forming speed takes a constant value when the supply amount of the raw material is in a range from $2.746 \times 10^{-2}$ Pa·m$^3$/s to $1.099 \times 10^{-1}$ Pa·m$^3$/s. This suggests that when TVTMCTS monomers are used, the film-forming speed is determined not by the supply rate of the raw material but by the rate of the activation reaction.

Also as shown in FIG. 7, the specific inductive capacity is kept at 2.75 or less when the supply amount of the raw material is in a range from $2.746 \times 10^{-2}$ Pa·m$^3$/s to $1.099 \times 10^{-1}$ Pa·m$^3$/s. This, therefore, suggests that the monomers activated by the plasma are polymerized via the unsaturated hydrocarbon groups while the cyclic silica skeleton is retained, and its reaction is not largely dependent on the supply amount of the raw material. In this case, the specific inductive capacity is slightly raised when the supply amount of the raw material is less than $2.746 \times 10^{-2}$ Pa·m$^3$/s. The reason is considered to be that because the concentration of the raw material in the gas phase is reduced when the supply amount of the raw material is less than $2.746 \times 10^{-2}$ Pa·m$^3$/s, the incorporation of excessively decomposed monomers and the dissociation of organic components are caused and the incorporation of these products into the film raises specific inductive capacity.

FIG. 8 shows the relationship between the pressure in the reaction chamber and the film forming speed when the supply amount of tetravinyltetramethylcyclotetrasiloxane (TVTMCTS) monomers is $8.239 \times 10^{-2}$ Pa·m$^3$/s and RF power is 200 W. The abscissa is the pressure (Pa) in the reaction chamber and the ordinate is the specific inductive capacity (nm/min). Here, the pressure in the reaction chamber was changed between 320 Pa and 440 Pa. As illustrated, the film-forming speed is independent of the pressure of the reaction chamber.

FIG. 9 shows the relationship between the pressure in the reaction chamber and the specific inductive capacity when the supply amount of tetravinyltetramethylcyclotetrasiloxane (TVTMCTS) monomers is $8.239 \times 10^{-2}$ Pa·m$^3$/s and RF power is 200 W. The abscissa is the pressure (Pa) in the reaction chamber and the ordinate is the specific inductive capacity. Here, the pressure in the reaction chamber was changed between 320 Pa and 440 Pa. As illustrated, the specific inductive capacity is independent of the pressure of the reaction chamber and therefore takes an almost constant value.

As shown above, it is proved to be preferable that a monomer having unsaturated hydrocarbon groups is used as the raw material like the case of the insulating film according to this embodiment to obtain a high film-forming speed and a low specific inductive capacity.

Specifically, in the case of using tetravinyltetramethylcyclotetrasiloxane (TVTMCTS) monomers as the cyclic organic silica compound which has at least one cyclic silica skeleton in its molecule and in which at least one unsaturated hydrocarbon group is bound with the cyclic silica skeleton, the film-forming speed and specific inductive capacity of a film is less dependent on the flow rate of the raw material, RF power and pressure in the reaction chamber. Specifically, a film having a low dielectric constant and very high process stability can be obtained.

FIG. 10 shows the results when the film structure of the insulating film (insulating film according to this embodiment) formed by supplying $1.099 \times 10^{-1}$ Pa·m$^3$/s of tetravinyltetramethylcyclotetrasiloxane (TVTMCTS) monomers at a RF power of 200 W was examined by Fourier-transform infrared spectroscopic analysis (FT-IR). The abscissa is the wave number (cm$^{-1}$) and the ordinate is the absorption amount (a.u).

The oscillation peaks originated from a Si—O bond (in the vicinity of a wave number of 1040 cm$^{-1}$), a Si—CH$_3$ bond (in the vicinity of a wave number of 800 cm$^{-1}$ and 1250 cm$^{-1}$) and a C—H bond (in the vicinity of a wave number of 3000 cm$^{-1}$) derived from the structure of the raw material, tetravinyltetramethyl-cyclotetrasiloxane monomers, were observed. A weak oscillation peak (in the vicinity of a wave number of 1400 cm$^{-1}$) originated from a Si—H bond was also observed. However, peaks (peaks which appear in the vicinity of a wave number of 910 cm$^{-1}$, 990 cm$^{-1}$, 1400 cm$^{-1}$ and 1800 cm$^{-1}$ when C=C bonds exist) originated from unsaturated hydrocarbon groups, that is, a carbon-carbon double bond (C=C bond) were not observed. Therefore, it may be estimated that the insulating film is formed by a polymerization reaction of the unsaturated hydrocarbon bonds.

As shown in FIG. 10, a spectrum originated from Si—OH (a broad peak which appears in the vicinity of a wave number of 3200 to 3500 cm$^{-1}$ when a Si—OH bond exists) is not observed in the formed film. When the Si—OH bonds exist in the film, a —OH group contained in the Si—OH bond is affected by heat in the heat treating process when multilayer wiring is formed, or reacts with the gas components and enters into a reaction among Si—OH groups or a reaction with hydrogen contained in etching gas, resulting in the formation of $H_2O$. In order to remove $H_2O$ left in the film, heat treatment is carried out at 100° C. or more but this brings about an increase in the number of steps, namely, an increase in costs and a reduction in throughput.

Though $H_2O$ is removed from the film by heat treatment, the film shrinks at the same time. Furthermore, when $H_2O$ is left in the form of a water molecule in the film, this largely raises the specific inductive capacity of the film because the specific inductive capacity of $H_2O$ is about 80. Therefore, it is desirable that the Si—OH bond not be contained in the formed film as suggested by the present invention.

FIG. 11 shows the results of analysis of pores in an insulating film by using a small-angle X-ray scattering method, where the insulating film is formed by supplying $2.746 \times 10^{-2}$ Pa·m$^3$/s or $1.099 \times 10^{-1}$ Pa·m$^3$/s of tetravinyltetramethylcyclotetrasiloxane (TVTMCTS) monomers as the raw material when RF power was 200 W. The abscissa is the diameter (nm) of pore and the ordinate is a pore distribution (nm$^{-1}$). In any of these insulating films, pores were detected in the film to thereby confirm that the formed films were porous insulating films. The maximum distribution diameter of pores in the insulating film was 0.30 nm when the supply amount of the raw material was $2.746 \times 10^{-2}$ Pa·m$^3$/s and 0.48 nm when the supply amount of the raw material was $1.099 \times 10^{-1}$ Pa·m$^3$/s.

When the porous insulating film obtained in this embodiment and another porous insulating film having a pore diameter of 3 nm or more were measured by Thermal Desorption Spectroscopy (TDS), it showed that with the porous insulating film having pores 3 nm or more in diameter, the desorption gas spectrum intensity of $H_2O$ increased five times that of the porous insulating film according to this embodiment. This suggests that if the pore diameter exceeds 3 nm, the moisture absorption of the film is promoted. Therefore, the pore diameter is made to be 3 nm or less and preferably 2 nm or less to thereby improve the moisture absorption characteristics. When the pore diameter is made to be 3 nm or less, this has the advantage that not only the moisture absorption characteristics are improved but also occlusion of process gas and penetration of chemical liquid can be limited.

Table 1 shows the results of a Rutherford back scattering/hydrogen forward scattering (RBS/HFS) method for the composition analysis of elements in the insulating film according to this embodiment which was formed by supplying $1.099 \times 10^{-1}$ Pa·m$^3$/s of tetravinyltetramethylcyclo-tetrasiloxane (TVTMCTS) monomers as the raw material. From the film, Si, O, C and H originated from tetravinyltetramethylcyclotetrasiloxane monomers were detected.

TABLE 1

| Element | Abundance ratio when Si is 1 |
|---|---|
| O | 0.95 |
| C | 2.18 |
| H | 5.52 |

The composition of the monomer is as follows: O/Si=1, C/Si=3 and H/Si=6. Therefore, the formed film has a composition less one carbon atom and one hydrogen atom from that of the monomer. Because an oscillation peak originated from a Si—H bond is observed from the results of the FT-IR measurement shown in FIG. 8, it is inferred that part of Si—CH$_3$ bonds are replaced with Si—H bonds and part of hydrocarbons in vinyl bonds are dissociated, with the result that the number of carbon atoms and hydrogen atoms are decreased. On the other hand, silicon atoms and oxygen atoms are contained in a ratio of almost 1:1 in the formed film, showing that the cyclic silica skeleton is not destroyed but exists in the film.

FIG. 12 shows the results of measurement of the current-voltage characteristic (relation between field intensity and leak current density) of the insulating film formed by using tetravinyltetramethylcyclotetrasiloxane monomers in an amount varied between $2.746 \times 10^{-2}$ Pa·m$^3$/s to $1.099 \times 10^{-1}$ Pa·m$^3$/s when RF power was 200 W. The abscissa is the field intensity (MV/cm) and the ordinate is the leak current density (A/cm$^2$). The leak current was $1 \times 10^{-9}$ A/cm$^2$ or less at a field intensity of 1 MV/cm and the dielectric strength was 5 MV/cm or more, showing that the insulating film had satisfactorily practical properties as a layer insulating film when the multilayer wiring of a MOSFET device is formed.

It has been confirmed from the above results that the insulating film formed using a cyclic organic silica compound, which has a cyclic silica skeleton in its molecule and has at least one unsaturated hydrocarbon group connected to the cyclic silica skeleton, has a structure in which pores are contained in the film and is a porous SiOCH insulating film with a low dielectric constant.

Second Embodiment

In this embodiment, a process was carried out in which a trivinyltriisopropylcyclotrisiloxane (3V3IPC3S) monomer represented by the formula (4) was used as the raw material to grow a layer insulating film. The cyclic organic siloxane of 3V3IPC3S (n=3) contains less cyclic siloxane skeletons than the cyclic organic siloxane of TVTMCTS (formula 7) (n=4). Therefore, the diameter of an inside hole constituted of the cyclic skeleton of 3V3IPC3S is 0.35 nm φ, which is smaller than that (0.45 nm φ) of the cyclic skeleton of TVTMCTS.

Though the unsaturated hydrocarbon which is one side chain of the cyclic siloxane is common to a vinyl group, the other side chain is a methyl group in the case of TVTMCTS and an isopropyl group, which is a bulky side chain, in the case of 3V3IPC3S. Specifically, 3V3IPC3S is characterized by smaller-diameter pores in a cyclic skeleton and more bulky saturated hydrocarbon side chains and unsaturated hydrocarbon side chains.

In the gasification controller shown in FIG. 2, an experiment was made by supplying $8.45 \times 10^{-1}$ Pa·m$^3$/s of helium as the carrier gas during film formation to gasify $1.70 \times 10^{-1}$ Pa·m$^3$/s of 3V3IPC3S for evaluating film forming characteristics. Here, the comparison was made using TVTMCTS, which is the cyclic organic silica obtained when n=4.

In the formation of the film, besides the carrier gas and the raw material, $1.690 \times 10^{-1}$ Pa·m$^3$/s of helium was made to flow as the diluent gas and introduced into the reaction chamber 1. A 200 mm φ silicon substrate (semiconductor substrate) 2 was placed in advance on the substrate heating part 3 kept at 350° C. The pressure in the reaction chamber 1 was reduced to 360 Pa, and high frequency voltage (frequency: 13.56 MHz and RF power: 50 to 700 W) was applied to the shower head 4 having about 300 mm φ to grow an insulating film on the silicon substrate 2 by a plasma polymerization reaction. In this case, the power density of plasma formation corresponded to 0.05 W/cm$^2$ to 1 W/cm$^2$. It is to be noted that though the temperature of the substrate heating part 3 was set to 350° C. here, it is preferable to set the temperature about 200 to 450° C.

FIG. 13 shows the results of measurement of the RF power dependency on the film-forming speed. FIG. 14 shows the results of measurement of the RF power dependency on the specific inductive capacity. Like the case of TVTMCTS as shown in FIG. 6, the film-forming speed is reduced along with a decrease in RF power. However, the specific inductive capacity (k) is also decreased. As compared with TVTMCYS in the same RF power condition, it was confirmed that 3V3IPC3S was improved in film-forming speed and also reduced in the k value. It was confirmed that in the case of 3V3IPC3S, the specific inductive capacity was also dropped to 2.3 when RF power was dropped to 100 W. It is considered that the use of the 3V3IPC3S monomer having a more bulky organic group enables a reduction in density and also in k value.

FIG. 15 shows each FTIR spectrum of the films formed using 3V3IPC3S and TVTMCTS at a RF power of 200 W. The absorption peak in the vicinity of 2850 to 3000 $cm^{-1}$, which was originated from a C—H bond, was higher in the case of 3V3IPC3S. A peak relating to a C—$CH_3$ bond which only the side chain of 3V3IPC3S had was observed in the vicinity of 1500 $cm^{-1}$. As to a Si—$CH_3$ bond, which was specific to TVTMCTS on the other hand, it was confirmed that TVTMCTS had a higher absorption peak. The FTIR analysis shows that basically, a film reflecting the structure of a 3V3IPC3S monomer is formed and it may be understood that an insulating film having a low dielectric constant can be attained by introducing a bulky organic group without, missing its original aim.

FIG. 16 shows the results of the Raman spectroscopic analysis obtained from the cyclic organic silica 3V3IPC3S and the straight-chain organic silica. From the Raman spectrum obtained from the straight-chain organic silica, it is found that the film is structured of randomly arranged Si—O skeletons. On the other hand, the presence of a Si—O cyclic skeleton obtained when n=3 was confirmed in the film of the cyclic organic silica 3V3IPC3S. Specifically, it was confirmed that the cyclic siloxane skeleton obtained when n=3 in the cyclic organic silica 3V3IPC3S was retained in the film. Although in all the films using the cyclic organic silica, the cyclic siloxane skeleton of the raw material was retained in the film, the cyclic siloxane skeleton obtained when n=3 or 4 existed most stably.

FIG. 17 shows the distribution of pores in the film that was found by using a small-angle X-ray scattering method. When the cyclic organic silica TVTMCTS obtained when n=4 was used as the raw material, the average pore diameter was about 0.6 nm φ. When the 3V3IPC3S obtained when n=3 was used as the raw material, the average pore diameter was about 0.3 nm φ. Specifically, it was confirmed that smaller pores were distributed in the film when the 3V3IPC3S obtained when n=3, which had smaller-diameter pores in the skeleton of the raw material, was used. It was proved to be possible to control the structure of pores obtained through a plasma polymerization reaction by controlling the structure of the cyclic organic silica skeleton of raw material.

Third Embodiment

As a third embodiment of the present invention, an insulating film obtained when using tetravinyltetramethylcyclotetrasiloxane monomers as starting material and nitrous oxide ($N_2O$) as oxidizer gas will be explained.

In this embodiment, $8.450\times10^{-1}$ Pa·$m^3$/s of helium was supplied as the carrier gas. The tetravinyltetramethylcyclotetrasiloxane monomers were gasified in the gasification controller 35 shown in FIG. 2 and supplied in an amount of $1.099\times10^{-1}$ Pa·$m^3$/s. Helium of $1.690\times10^{-1}$ Pa·$m^3$/s acting as diluent gas was led into the reaction chamber 1. In addition, $N_2O$ of $5.408\times10^{-2}$ Pa·$m^3$/s to $2.197\times10^{-1}$ Pa·$m^3$/s was led into the reaction chamber 1.

In the reaction chamber 1, the semiconductor substrate 2 was placed in advance on the substrate heating part 3 kept at 350° C. The pressure in the reaction chamber 1 was reduced to 360 Pa, and high frequency voltage (frequency: 13.56 MHz and RF power: 200 W) was applied to the shower head 4 to generate plasma, thereby growing an insulating film on the silicon substrate 2. A film was thus formed in the same manner as in the first embodiment except that $N_2O$ was added.

FIG. 18 shows the relation between the film-forming speed and the amount of $N_2O$ to be added. The abscissa is the amount of $N_2O$ to be supplied (Pa·$m^3$/s) and the ordinate is the film-forming speed (nm/min). As illustrated, the film-forming speed is increased in proportion to the amount of $N_2O$ to be added. This is an important effect from the viewpoint of improving throughput and raw material costs. In short, the throughput and raw material utilization efficiency can be improved by adding $N_2O$ in the formation of the film.

FIG. 19 shows the relation between the film-forming speed and the flow rate of diluent helium gas. The abscissa is the flow rate of diluent helium gas (Pa·$m^3$/s) and the ordinate is the film-forming speed (nm/min). As clearly seen from the figure, the film-forming speed is kept constant even if the amount of diluent helium gas is increased.

Although an exact promotion reaction mechanism whereby the film-forming speed is improved by the use of $N_2O$ has not been clarified so far, it is inferred that a certain number of carbon atoms in the unsaturated hydrocarbon group are bound with oxygen atoms and extracted as CO or $CO_2$, and the cyclic organic silica compound is polymerized through carbon radicals left there. When the amount of helium is increased, such an "extraction" reaction is not caused and therefore, the film-forming speed is almost unchanged.

Here it is necessary and essential to use plasma preferentially activating the unsaturated hydrocarbon group bound with the cyclic silica skeleton without destroying the cyclic silica skeleton. In order to activate the unsaturated hydrocarbon, it is effective to raise the energy of the plasma, namely, to use larger RF power. However, in order to activate the unsaturated hydrocarbon group preferentially, the RF power is restricted as small as possible insofar as an enough film-forming speed is obtained. More specifically, it is desirable to set the RF power to about 100 W to 500 W. This brings about such a subsidiary effect that plasma damage to the undercoat becomes small.

The range of $N_2O$ in this experiment is up to $2.197\times10^{-1}$ Pa·$m^3$/s. However, it is clear that the film-forming speed can be improved by adding $N_2O$ in an amount exceeding $2.197\times10^{-1}$ Pa·$m^3$/s. Specifically, the insulating film according to this embodiment is featured by the introduction of a mixture gas consisting of vapor of the cyclic organic silica compound, which has a cyclic silica skeleton in its molecule and has at least one unsaturated hydrocarbon group bound with the cyclic silica skeleton, and an oxidizer gas into plasma, where the mixing ratio is a secondary issue.

FIG. 20 shows the results of the Fourier-transform infrared spectroscopic analysis (FT-IR) for the film structure of the insulating film formed by adding $N_2O$ in an amount of $5.408\times10^{-2}$ Pa·$m^3$/s, $1.099\times10^{-1}$ Pa·$m^3$/s or $2.197\times10^{-1}$ Pa·$m^3$/s. The abscissa is the wave number ($cm^{-1}$) and the ordinate is the absorption amount (a.u). The oscillation peaks originated from a Si—O bond (in the vicinity of a wave number of 1040 $cm^{-1}$), a Si—$CH_3$ bond (in the vicinity of wave numbers of 800 $cm^{-1}$ and 1250 $cm^{-1}$) and a C—H bond (in the vicinity of a wave number of 3000 cm$^{-1}$) derived from the structure of a tetravinyltetramethylcyclotetrasiloxane monomer were observed. Other than the above, a weak oscillation peak (in the vicinity of a wave number of 1400 cm$^{-1}$) originated from a Si—H bond was also observed. However, peaks originated from the unsaturated hydrocarbon group, namely, a carbon-carbon double bond (C═C bond), which appear in the vicinity of a wave number of 910 cm$^1$, 990 cm$^{-1}$, 1400 cm$^{-1}$ and 1800 cm$^{-1}$ when a C═C bond exists, were not observed.

As also clearly seen from FIG. 20, the insulating films according to this embodiment exhibited almost the same spectrum irrespective of the amount of N$_2$O to be added. Further, this spectrum is almost equal to the spectrum of the insulating film according to the first embodiment as shown in FIG. 10 and therefore, it can be confirmed that the insulating film according to this embodiment has almost the same film structure as the film to which N$_2$O is not added as shown in FIG. 10 (namely, the insulating film according to the first embodiment). It is therefore inferred that the insulating film according to this embodiment is formed by a polymerization reaction of the unsaturated hydrocarbon bonds in the same manner as the insulating film according to the first embodiment.

Also, a spectrum originated from Si—OH (a broad peak which appears in the vicinity of the wave number ranging from 3200 to 3500 cm$^{-1}$ when a Si—OH bond exists) is not observed in the formed film. When the Si—OH bond exists in the film, a —OH group contained in the Si—OH bond is affected by heat in the heat treating process when multilayer wiring is formed, or reacts with the gas components and enters into a reaction among Si—OH groups or a reaction with hydrogen contained in etching gas, resulting in the formation of H$_2$O. In order to remove H$_2$O left in the film, heat treatment is carried out at 100° C. or more, which increases the number of steps, namely, increases costs and decreases throughput.

Though H$_2$O is forced out of the film by heat treatment, the film shrinks at the same time. Furthermore, when H$_2$O is left in the form of a water molecule in the film, this largely raises the specific inductive capacity of the film because the specific inductive capacity of H$_2$O is about 80. Therefore, it is undesirable that the Si—OH bond be contained in the formed film.

FIG. 21 shows the results of analysis of pores in an insulating film formed by supplying 1.099×10$^{-1}$ Pa·m$^3$/s of N$_2$O by using a small-angle X-ray scattering method. The abscissa is the diameter (nm) of pore and the ordinate is the distribution of pore (nm-1). At the maximum distribution, pores of 0.40 nm diameter were detected from the film and it was therefore confirmed that the insulating film according to this embodiment was a porous insulating film containing pores.

Table 2 shows the results of the composition analysis of elements in the insulating film that was formed by supplying 1.099×10$^{-1}$ Pa·m$^3$/s of N$_2$O by the Rutherford back scattering/hydrogen forward scattering (RBS/HFS) method. From the film, Si, O, C and H originated from a tetravinyltetramethylcyclotetrasiloxane monomer were detected. Also, the insulating film of this embodiment had the same composition ratio as the film shown in the first embodiment where no N$_2$O was added.

TABLE 2

| Element | Abundance ratio when Si is 1. |
|---------|-------------------------------|
| O       | 1.15                          |
| C       | 2.35                          |
| H       | 5.16                          |

The above results of analysis hints that the film is formed by a reaction through the unsaturated hydrocarbon group in the same manner as the insulating film shown in the first embodiment even if N$_2$O is added. It is inferred that if N$_2$O is introduced as addition gas, a certain number of carbon atoms in the unsaturated hydrocarbon group are bound with oxygen atoms in plasma and extracted as CO or CO$_2$, and cyclic organic silica compounds are polymerized through carbon radicals left there.

Therefore, in contrast to the composition of the monomer: O/Si=1, C/Si=3 and H/Si=6, the formed film has a composition less one carbon atom and one hydrogen atom from that of the monomer. Furthermore, because an oscillation peak originated from a Si—H bond is observed from the results of the FT-IR measurement shown in FIG. 20, it is inferred that some of Si—CH$_3$ bonds are replaced with Si—H bonds and thus the number of carbon atoms and hydrogen atoms is less than those contained in the monomer composition. On the other hand, silicon atoms and oxygen atoms are contained in a ratio of almost 1:1 in the insulating film according to this embodiment, showing that the cyclic silica skeleton is not destroyed but exists in the film as the case of the first embodiment where no N$_2$O is added.

FIG. 22 shows the results of measurement of the specific inductive capacity of the insulating film formed under the condition that the supply amount of tetravinyltetramethylcyclotetrasiloxane monomer was 1.099×10$^{-1}$ Pa·m$^3$/s, the amount of N$_2$O to be added was 5.408×10$^{-2}$ Pa·m$^3$/s, 1.099× 10$^{-1}$ Pa·m$^3$/s or 2.197×10$^{-1}$ Pa·m$^3$/s, and RF power was 200 W. The abscissa is the amount of N$_2$O (Pa·m$^3$/s) to be added and the ordinate is the specific inductive capacity. Dielectric constants of the insulating films were examined and as a result, all the films respectively had a specific inductive capacity of about 2.6 to 2.7 irrespective of the supply amount of N$_2$O, which was a lower dielectric constant than conventional insulating films using SiO$_2$ or fluorine-added SiO$_2$.

It may be therefore inferred that even if N$_2$O is added during the course of the film formation when RF power is about 200 W, the cyclic silica skeleton is not destroyed, but the unsaturated hydrocarbon group bound with the cyclic silica skeleton is preferentially activated, so that film formation proceeds mainly based on the radicals originated from the unsaturated hydrocarbon group in the same manner as in the case without N$_2$O. Consequently, it is inferred that the increase in the amount of N$_2$O to be added leads to the result that activated monomers are increased and an addition reaction or substitution reaction via the unsaturated hydrocarbon group allow selective growth of the film to proceed, so that the formed film is grown on a basic skeleton, the cyclic silica skeleton, making it difficult to incorporate excessively decomposed monomers and to cause desorption of organic components, with the result that the specific inductive capacity takes a constant value.

FIG. 23 shows the results of measurement of the current-voltage characteristic of the insulating film formed under the condition that the supply amount of tetravinyltetramethyl-cyclotetrasiloxane monomer was 1.099×10$^{-1}$ Pa·m$^3$/s, the amount of N$_2$O to be added was 5.408×10$^{-2}$ Pa·m$^3$/s, 1.099× 10$^{-1}$ Pa·m$^3$/s or 2.197×10$^{-1}$ Pa·m$^3$/s and RF power was 200 W. The abscissa is the field intensity (MV/cm) and the ordinate is the leak current density (A/cm$^2$). The leak current is 1×10$^{-9}$ A/cm$^2$ or less at a field intensity of 1 MV/cm and the dielectric strength is 5 MV/cm or more, showing that the insulating film has satisfactorily practical properties as a layer insulating film for the multilayer wiring of a MOSFET device.

It has been confirmed from the above results that the insulating film has a structure in which pores are contained in the film and is a porous SiOCH insulating film having a low dielectric constant.

Fourth Embodiment

As a fourth embodiment of the present invention, an insulating film obtained when using trivinyltriisopylcyclotrisiloxane (3VIPC3S) monomers as starting material and silane (SiH$_4$) as hydrogenating silicon gas, which is addition gas, will be explained.

In this embodiment, $8.450 \times 10^{-1}$ Pa·m$^3$/s (500 sccm) of helium was supplied as carrier gas. Also, trivinyltriisopylcyclotrisiloxane monomers were gasified in the gasification controller 35 shown in FIG. 2 and $1.099 \times 10^{-1}$ Pa·m$^3$/s of SiH$_4$ was introduced into the reaction chamber 1.

In the reaction chamber 1, the semiconductor substrate 2 was placed in advance on the substrate heating part 3 kept at 350° C. The pressure in the reaction chamber 1 was reduced to 360 Pa, and high frequency voltage (frequency: 13.56 MHz and RF power: 200 W) was applied to the shower head 4 to generate plasma, thereby growing an insulating film on the silicon substrate 2. A film was thus formed in the same manner as in the second embodiment except that SiH$_4$ was added.

FIG. 24 shows the relation between the film-forming speed and the amount of SiH$_4$ to be added. The abscissa is the amount of SiH$_4$ to be supplied (Pa·m$^3$/s) and the ordinate is the film-forming speed (nm/min). As is illustrated, the film-forming speed is increased in proportion to the amount of SiH$_4$ to be added. This is an important effect from the viewpoint of improving throughput and raw material costs. Namely, the throughput and raw material utilization efficiency can be improved by adding SiH$_4$ in the formation of the film. The film-forming speed was kept constant even if the diluent helium gas was increased. Although an exact reaction promotion mechanism whereby the film-forming speed is improved by SiH$_4$ has not been well understood so far, it is inferred that a certain number of carbon atoms in the unsaturated hydrocarbon group are bound with hydrogen radicals dissociated from SiH$_4$, and the cyclic organic silica compound is polymerized through carbon radicals. When the amount of helium was increased, the film-forming speed was almost unchanged.

The upper limit of SiH$_4$ in this examination is $1.69 \times 10^{-1}$ Pa·m$^3$/s. However, it is clear that the film-forming speed can be further improved by adding SiH$_4$ beyond $1.69 \times 10^{-1}$ Pa·m$^3$/s. Namely, the insulating film according to this embodiment is featured by the introduction of a mixture gas consisting of vapor of the cyclic organic silica compound, which has a cyclic silica skeleton in its molecule and has at least one unsaturated hydrocarbon group bound with the cyclic silica skeleton, and a hydrogenated silicon into plasma, where the mixing ratio is not specifically determined.

FIG. 25 shows the relation between the specific inductive capacity (k) of the obtained insulating film and the amount of SiH$_4$. In the reaction chamber 1, the semiconductor substrate 2 was placed in advance on the substrate heating part 3 kept at 350° C. The pressure in the reaction chamber 1 was reduced to 360 Pa, and high frequency voltage (frequency: 13.56 MHz and RF power: 200 W) was applied to the shower head 4 to generate plasma, thereby growing an insulating film on the silicon substrate 2. A film was thus formed in the same manner as in the second embodiment except that SiH$_4$ was added. The specific inductive capacity tended to be somewhat reduced by adding SiH$_4$. Pores having a maximum distribution at a diameter of 0.40 nm were detected in all the films by a small-angle X-ray scattering method and it was therefore confirmed that the insulating film according to this embodiment was a porous insulating film containing pores.

From the results of composition analysis by a Rutherford back scattering/hydrogen forward scattering (RBS/HFS) method, the composition ratio of carbon and hydrogen tends to be increased, namely there is such a tendency that the ratio of hydrocarbons is slightly increased. However, the composition of the film is not largely changed even if SiH$_4$ gas is added. The Fourier-transform infrared spectroscopic analysis (FT-IR) in FIG. 26 also shows that the absorption spectrum and the structure and composition of the film are not largely changed even if SiH$_4$ is added.

TABLE 3

| Atomic ratio | 3V3IPC3S Raw material | He = 8.45 × 10$^{-1}$ Pa · m$^3$/s SiH$_4$ = 0 Pa · m$^3$/s | He = 8.45 × 10$^{-1}$ Pa · m$^3$/s SiH$_4$ = 0.67 Pa · m$^3$/s | He = 8.45 × 10$^{-1}$ Pa · m$^3$/s SiH$_4$ = 1.35 Pa · m$^3$/s |
|---|---|---|---|---|
| Si = 1.0 | 1.0 | 1.0 | 1.0 | 1.0 |
| O/Si | 1.0 | 1.12 | 1.13 | 1.12 |
| C/Si | 5.0 | 2.89 | 3.05 | 3.06 |
| H/Si | 10.0 | 6.10 | 6.84 | 6.70 |

Specifically, silane (SiH$_4$) acting as the hydrogenated silicon gas, which is addition gas to trivinyltriisopylcyclotrisiloxane (3V3IPC3S) monomer, produces the effect of promoting a plasma polymerization reaction without giving a large influence on the structure and chemical composition of the insulating film. Although the details of the reason are not clarified, it is considered that hydrogen radicals dissociated from the SiH$_4$ gas in the plasma reacts on a vinyl group that is the unsaturated hydrocarbon side chain of 3V3IPC3S to form radicals, thereby promoting a plasma polymerization reaction. It may be therefore inferred that even if SiH$_4$ is added when RF power is about 200 W, the cyclic silica skeleton is not destroyed, but the unsaturated hydrocarbon group bound with the cyclic silica skeleton is preferentially activated, so that film formation proceeds mainly based on the radicals originated from the unsaturated hydrocarbon group in the same manner as in the case without SiH$_4$.

For this, it is inferred that the increase in the amount of SiH$_4$ to be added leads to the result that activated monomers are increased and an addition reaction or substitution reaction via the unsaturated hydrocarbon groups allow selective growth of the film to proceed, so that the formed film is grown on a basic skeleton, the cyclic silica skeleton, making it difficult to incorporate excessively decomposed monomers and to cause desorption of organic components, with the result that the specific inductive capacity takes a constant value.

In order to activate the unsaturated hydrocarbon, it is effective to raise the energy of the plasma, in other words, to use larger RF power. However, to activate the unsaturated hydrocarbon group preferentially, it is effective to keep the RF power as small as possible insofar as a sufficient film-forming speed is obtained. The increase in film-forming speed by the addition of SiH$_4$ gas implies that a film is formed using lower RF power and this brings about such a subsidiary effect that plasma damage to the undercoat is made small.

Though silane gas (SiH$_4$) is used as the hydrogenated silicon gas this time, it is essential in this embodiment that hydrogenated silicon is dissociated in plasma to generate hydrogen radicals. Any hydrogenated silicon gas may be used insofar as it contains at least one or more hydrogens that are directly connected to a silicon atom. For example, trimethylsilane gas ($SiH(CH_3)_3$), dimethylsilane gas ($SiH_2(CH_3)_3$), monomethylsilane gas ($SiH_3(CH_3)$ or disilane ($Si_2H_6$) can also produce the same effect.

Fifth Embodiment

As a fifth embodiment of the present invention, an insulating film obtained by using trivinyltriisopylcyclotrisiloxane (3V3IPC3S) monomers as starting material and nitrous oxide ($N_2O$) as oxidizer gas, which is addition gas, will be explained.

In this embodiment, $8.450 \times 10^{-1}$ Pa·m³/s (500 sccm) of helium was supplied as carrier gas. Trivinyltriisopylcyclotrisiloxane monomers were gasified in the gasification controller 35 shown in FIG. 2 and supplied in an amount of $1.099 \times 10^{-1}$ Pa·m³/s. Diluent gas, $1.690 \times 10^{-1}$ Pa·m³/s of helium, was led into the reaction chamber 1. In addition, $3.38 \times 10^{-2}$ Pa·m³/s to $1.35 \times 10^{-1}$ Pa·m³/s of $N_2O$ was led into the reaction chamber 1.

In the reaction chamber 1, the semiconductor substrate 2 was placed in advance on the substrate heating part 3 kept at 350° C. The pressure in the reaction chamber 1 was reduced to 360 Pa, and high frequency voltage (frequency: 13.56 MHz and RF power: 200 W) was applied to the shower head 4 to generate plasma, thereby growing an insulating film on the silicon substrate 2. A film was thus formed in the same manner as in the second embodiment except that $N_2O$ was added.

FIG. 27 shows the relation between the film-forming speed and the amount of $N_2O$ to be added. The abscissa is the amount of $N_2O$ to be supplied (Pa·m³/s) and the ordinate is the film-forming speed (nm/min). As is illustrated, the film-forming speed is increased in proportion to the amount of $N_2O$ to be added. This is an important effect from the viewpoint of improving throughput and raw material costs. Namely, the throughput and raw material utilization efficiency can be improved by adding $N_2O$ in the formation of the film.

The film-forming speed was kept constant even if the diluent helium gas was increased. Although an exact promotion reaction mechanism whereby the film-forming speed is improved by the use of $N_2O$ has not been clarified so far, it is inferred that a certain number of carbon atoms in the unsaturated hydrocarbon group are bound with oxygen atoms and extracted as CO or $CO_2$, and the cyclic organic silica compound is polymerized through carbon radicals left there. When the amount of helium was increased, the film-forming speed was almost unchanged.

The upper limit of $N_2O$ in this examination is $1.69 \times 10^{-1}$ Pa·m³/s. However, it is clear that the film-forming speed can be improved by adding $N_2O$ beyond $1.69 \times 10^{-1}$ Pa·m³/s. Specifically, the insulating film according to this embodiment is featured by the introduction of a mixture gas consisting of vapor of the cyclic organic silica compound, which has a cyclic silica skeleton in its molecule and has at least one unsaturated hydrocarbon group bound with the cyclic silica skeleton, and an oxidizer gas into plasma, wherein the mixing ratio is not limited.

FIG. 28 shows the relation between the specific inductive capacity (k) of the obtained insulating film and the amount of $N_2O$ to be added. In the reaction chamber 1, the semiconductor substrate 2 was placed in advance on the substrate heating part 3 kept at 350° C. The pressure in the reaction chamber 1 was reduced to 360 Pa, and high frequency voltage (frequency: 13.56 MHz and RF power: 200 W) was applied to the shower head 4 to generate plasma, thereby growing an insulating film on the silicon substrate 2.

A film was thus formed in the same manner as in the second embodiment except that $N_2O$ was added. The specific inductive capacity tended to be somewhat reduced by adding $N_2O$. Pores having a maximum distribution at a diameter of 0.40 nm were detected in all the films by a small-angle X-ray scattering method and it was therefore confirmed that the insulating film according to this embodiment was a porous insulating film containing pores.

The composition analysis of elements contained in the film through a Rutherford back scattering/hydrogen forward scattering (RBS/HFS) method shows that composition ratio of carbon and hydrogen tends to be somewhat increased. However, the composition of the film is not largely changed even if $N_2O$ gas is added. The Fourier-transform infrared spectroscopic analysis (FT-IR) in FIG. 29 also shows that the absorption spectrum of the film is not largely changed even if $N_2O$ is added, which suggests that the structure and composition of the film are not largely changed.

TABLE 4

| Atomic ratio | 3V3IPC3S Raw material | He = 8.45 × 10⁻¹ Pa·m³/s $N_2O$ = 0 Pa·m³/s | He = 8.45 × 10⁻¹ Pa·m³/s $N_2O$ = 0.67 Pa·m³/s | He = 8.45 × 10⁻¹ Pa·m³/s $N_2O$ = 1.35 Pa·m³/s |
|---|---|---|---|---|
| Si = 1.0 | 1.0 | 1.0 | 1.0 | 1.0 |
| O/Si | 1.0 | 1.12 | 1.15 | 1.21 |
| C/Si | 5.0 | 2.89 | 3.10 | 3.33 |
| H/Si | 10.0 | 6.10 | 6.98 | 7.74 |

Specifically, $N_2O$ as oxidizer gas, which is addition gas to trivinyltriisopylcyclotrisiloxane (3V3IPC3S) monomers used as starting material, produces the effect of promoting a plasma polymerization reaction without giving a large influence on the structure and chemical composition of the insulating film. The details of the reason have not been clarified. However, it is necessary and essential to use plasma preferentially activating the unsaturated hydrocarbon group bound with the cyclic silica skeleton without destroying the cyclic silica skeleton. The inventors of the present invention have found a new phenomenon that plasma of mixture gas prepared by mixing oxidizer gas with rare gas promotes selective activation of the unsaturated hydrocarbon group and significantly improves the growth rate of the porous insulating film.

Although an exact promotion reaction mechanism whereby the film-forming speed is improved by the use of $N_2O$ has not been clarified so far, it is inferred that a certain number of carbon atoms in the unsaturated hydrocarbon group are bound with oxygen atoms and extracted as CO or $CO_2$, and the cyclic organic silica compound is polymerized through carbon radicals left there.

It may be therefore inferred that even if $N_2O$ is added when RF power is about 200 W, the cyclic silica skeleton is not destroyed but the unsaturated hydrocarbon group bound with the cyclic silica skeleton is preferentially activated, so that film formation proceeds mainly based on the radicals originated from the unsaturated hydrocarbon group in the same manner as in the case without $N_2O$. It is further inferred that the increase in the amount of $N_2O$ to be added leads to the result that activated monomers are increased and an addition reaction or substitution reaction via the unsaturated hydrocarbon group allows selective growth of the film to proceed, so that the formed film grows on the cyclic silica skeleton as a basic skeleton, making it difficult to incorporate excessively decomposed monomers and to cause desorption of organic components, with the result that the specific inductive capacity takes a constant value.

In order to activate the unsaturated hydrocarbon, it is effective to raise the energy of the plasma, in other words, to use larger RF power. However, in order to activate the unsaturated hydrocarbon group preferentially, the RF power is kept as small as possible insofar as a sufficient film-forming speed is obtained. The increase in the film forming speed which is obtained by adding $N_2O$ gas implies that a film can be formed using lower RF power. This brings about such a subsidiary effect that plasma damage to the undercoat is made small.

$N_2O$ was used as the oxidizer gas this time. However, the essentials of this embodiment are to generate oxygen radicals in plasma. Therefore, it is only necessary to contain at least an oxygen atom. The same effect can be obtained also by oxygen, carbon monoxide (CO), carbon dioxide ($CO_2$), an alcohol (ROH, where R is a hydrocarbon) or phenol (PhOH, where Ph is a phenyl group). Examples of the alcohol include methyl alcohol, ethyl alcohol, normal propyl alcohol, isopropyl alcohol, normal butyl alcohol and isobutyl alcohol. Also, the oxidizer gas may be a mixture oxidizer gas of $N_2O$ or oxygen and an alcohol or phenol.

Sixth Embodiment

A sixth embodiment of the present invention will be explained. An insulating film according to this embodiment was formed by using tetravinyltetramethylcyclotetrasiloxane monomers as the cyclic organic silica compound which has a cyclic silica skeleton in its molecule and has at least one unsaturated hydrocarbon group bound with the cyclic silica skeleton, and divinylsiloxanebenzocyclobutene monomers represented by the above formula (5) as the straight-chain organic silica compound which has a straight-chain silica skeleton in its molecule and has at least any one selected from the group consisting of hydrogen, a hydrocarbon group and a hydrocarbon oxide group bound with the side chain of the straight-chain silica skeleton. Molecular vapor of both monomers was mixed and nitrous oxide ($N_2O$) was added as oxidizer gas.

In this embodiment, a divinylsiloxanebenzocyclobutene monomer is used as the straight-chain silica compound, which has unsaturated hydrocarbon bond in its side chain and has any one selected from hydrogen, a hydrocarbon group and a hydrocarbon oxide group bound with the side chain thereof. However, a straight-chain organic silica compound containing no unsaturated hydrocarbon bond in its side chain may be used. In this case, it is preferable that at least one of these straight-chain organic silica compounds contains an unsaturated hydrocarbon bond like the cyclic organic silica compound from the viewpoint of improving film-forming speed, namely, throughput.

As carrier gas, $5.070 \times 10^{-1}$ $Pa \cdot m^3/s$ of helium was supplied to the tetravinyltetramethylcyclotetrasiloxane monomer and $8.450 \times 10^{-1}$ $Pa \cdot m^3/s$ of helium was supplied to the divinylsiloxanebenzocyclobutene monomer.

The tetravinyltetramethylcyclotetrasiloxane monomers were gasified in the gasification controller 16a shown in FIG. 1 and supplied in an amount of 0 to $1.099 \times 10^{-1}$ $Pa \cdot m^3/s$. Also, the divinylsiloxanebenzocyclobutene monomers were gasified in the gasification controller 16b shown in FIG. 1 and supplied in an amount of $7.605 \times 10^{-3}$ $Pa \cdot m^3/s$. Moreover, together with these raw materials supplied was 0 to $6.760 \times 10^{-2}$ $Pa \cdot m^3/s$ of $N_2O$. These components were mixed in the pipe 15 shown in FIG. 1 and then led into the reaction chamber 1. In the reaction chamber 1, a substrate was placed in advance on a substrate heating part kept at 350° C. The pressure in the reaction chamber 1 was reduced to 360 Pa, and high frequency voltage (frequency: 13.56 MHz and RF power: 200 W) was applied to the shower head to generate plasma, thereby growing an insulating film on the silicon substrate.

FIG. 30 shows dependency of the film-forming speed on the ratio of the monomers to be supplied (relation between the ratio of the monomers to be supplied and the film-forming speed) when the insulating film was formed using the tetravinyltetramethylcyclotetrasiloxane (TVTMCTS) monomers and the divinylsiloxanebenzocyclobutene (BCB) monomers. The abscissa is the ratio of the amount of the TVTMCTS to the total amount of the monomers to be supplied and the ordinate is the film-forming speed (nm/min). The formation of the film by using the mixture gas of the TVTMCTS monomer and the BCB monomer more improves the film-forming speed as compared with the case of using only the tetravinyltetramethylcyclotetrasiloxane monomers ((TVTMCTS/(TVTMCTS+BCB))=1) or only the divinylsiloxanebenzocyclobutene monomers ((TVTMCTS/(TVTMCTS+BCB))=0). The film-forming speed can be improved by adding $N_2O$ as the oxidizer gas.

It has been also found by the inventors of the present invention that the film-forming speed reaches a maximum when the supply ratio of both monomers is close to 1:1.

When the TVTMCTS monomers and the BCB monomers are supplied at the same time, the film-forming speed is dominated by activation of the TVTMCTS monomers within a region where the TVTMCTS monomers possess the majority and is therefore close to that obtained when only the TVTMCTS monomers are used. In a range rich in the BCB monomers, on the other hand, the film-forming speed is dominated by activation of the BCB monomers and is therefore close to that obtained when only the BCB monomers are used.

It is inferred that when the supply ratio of TVTMCTS monomer to BCB monomer is set to 1:1, a polymerization reaction derived from unsaturated groups contained in both monomers is most promoted whereby the film-forming speed reaches a maximum.

FIG. 30 shows the results up to $6.760 \times 10^{-2}$ $Pa \cdot m^3/s$ of $N_2O$. However, it is obvious that the film-forming speed is improved by further increasing the amount of $N_2O$. These effects are effective to better the throughput of a device and to drop the cost of raw material.

FIG. 31 shows the relation between the supply ratio of monomers and the specific inductive capacity. The abscissa is the ratio of the amount of TVTMCTS to the total amount of the monomers to be supplied and the ordinate is the specific inductive capacity. The inventors have found that when $N_2O$ is not used, the specific inductive capacity reaches a maximum when the supply ratio is close to 1:1.

The divinylsiloxanebenzocyclobutene (BCB) monomer has a Si—O skeleton with a bulky organic side chain. Therefore, when only the BCB monomers and helium (carrier gas) are used to form a film, the bulky organic group is incorporated into the film, so that the abundance ratio of silicon and oxygen, which are polar atoms, becomes small and it is therefore possible to obtain a low specific inductive capacity.

When only the tetravinyltetramethylcyclotetrasiloxane (TVTMCTS) monomer and helium (carrier gas) are used ((TVTMCTS/(TVTMCTS+BCB))=1), molecular pores formed by the Si—O skeleton are efficiently incorporated into the film, whereby a low dielectric constant can be obtained in spite of a smaller organic content compared with that of the BCB film ((TVTMCTS/(TVTMCTS+BCB))=0). It is inferred that when both the TVTMCTS monomers and the BCB monomers are supplied, Si—O and an organic group derived from the BCB monomers "enter into" pores formed by the TMTMCTS monomers, whereby the formed film becomes more densified than that formed with only one kind of monomers. The specific inductive capacity of the film relates to the density of the film: the specific inductive capacity is increased along with an increase in the film density. Therefore, when the TVTMCTS monomers and the BCB monomers are supplied in equal amounts, a polymerization reaction originated from unsaturated hydrocarbon groups contained in both monomers is most promoted, specifically, leading to one of the most densified film and as a result, the specific inductive capacity reaches a maximum.

In the meantime, when $3.380 \times 10^{-2}$ Pa·m$^3$/s of N$_2$O was supplied together with the tetravinyltetramethylcyclotetrasiloxane (TVTMCTS) monomers and the divinylsiloxanebenzocyclobutene monomers, the specific inductive capacity took a local minimum value. When the flow rate of the TVTMCTS monomers was $2.746 \times 10^{-2}$ Pa·m$^3$/s (TVTMCTS/(TVTMCTS+BCB)=0.783), the specific inductive capacity took the minimum value 2.55 and this is lower than that of the insulating film produced with only the TVTMCTS monomer.

When a film is formed using only the TVTMCTS monomers, the film is formed by an addition reaction or substitution reaction via the unsaturated hydrocarbon group, irrespective of N$_2$O, if RF power is controlled enough not to break the cyclic silica skeleton as shown in the second embodiment. The specific inductive capacity is independent of the amount of N$_2$O to be added and is almost a constant value ranging from about 2.6 to 2.7.

When only the BCB monomers are used to form a film, the specific inductive capacity is raised to about 2.9 by adding N$_2$O though the specific inductive capacity when N$_2$O is not added is about 2.7. The reason is considered to be that N$_2$O acts as an oxidizer to promote the oxidation of the monomer and desorption of organic groups, resulting in the formation of a film having many Si—O bonds. Specifically, when the BCB monomers and N$_2$O exist together in plasma, many organic groups dissociated from the BCB monomers exist in the plasma. When the TVTMCTS monomers, the BCB monomers and N$_2$O are introduced simultaneously into the reaction chamber and appropriate RF power is applied to these components, the TVTMCTS monomers are activated while the cyclic silica skeleton is maintained, whereas the BCB monomers are excessively decomposed and bulky organic groups are dissociated. It is inferred that at this time, the bulky organic groups dissociated from the BCB monomers work like a "pore forming agent" where it is bound with the cyclic silica skeleton of TVTMCTS or forms a spatial "clearance" when TVTMCTSs are combined among them, to thereby form three-dimensional pores in the film, so that a lower specific inductive capacity can be obtained in contrast with the case of using no N$_2$O.

When the flow rate of N$_2$O is high, the dissociation of a BCB monomer further progresses, which brings about an increase in film density in this case. In order to drop the specific inductive capacity, it is considered that there is an optimum ratio between the flow rate of the TVTVCTS monomers, the flow rate of the BCB monomers and the flow rate of N$_2$O.

FIG. 32 shows the results of analysis of the composition of the insulating film formed using the tetravinyl-tetramethyl-cyclotetrasiloxane monomers (TVTMCTS) and the divinyl-siloxanebenzocyclobutene monomers (BCB), where the analysis was made by a Rutherford back scattering/hydrogen forward scattering (RBS/HFS) method. The abscissa is the ratio of the monomers to be supplied and the ordinate is the relative concentration of each element.

Each concentration of hydrogen and carbon in the film can be arbitrarily changed along with the supply ratio. Specifically, by changing the amounts of the tetravinyltetramethyl-cyclotetrasiloxane monomers, the divinylsiloxanebenzocyclobutene monomers and N$_2$O to be supplied, it is possible to easily form a film in which density of hydrogen and oxygen changes stepwise or continuously in the direction of the thickness of the film and the effective specific inductive capacity of the whole film is reduced.

For example, as shown in FIG. 33, $1.099 \times 10^{-1}$ Pa·m$^3$/s of tetravinyltetramethylcyclotetrasiloxane (TVTMCTS) monomers and $1.099 \times 10^{-1}$ Pa·m$^3$/s of N$_2$O were supplied in the initial film-forming stage, and then, the flow rate of TVTMCTS monomer was changed to $2.746 \times 10^{-2}$ Pa·m$^3$/s and at the same time, $7.605 \times 10^{-3}$ Pa·m$^3$/s of divinylsiloxane-benzocyclobutene monomers and $3.38 \times 10^{-2}$ Pa·m$^3$/s of N$_2$O were supplied. Then, in the final stage, $1.099 \times 10^{-1}$ Pa·m$^3$/s of TVTMCTS monomers and $1.099 \times 10^{-1}$ Pa·m$^3$/s of N$_2$O were supplied. Meanwhile, RF power (13.56 MHz, 200 W) was applied to the shower head 4.

By carrying out a series of these processes continuously, a film can be formed at one time, where the concentrations of carbon/hydrogen at the upper and lower surfaces of the film are lower than inside the film and the film is formed at a high speed. At this time, the effective specific inductive capacity of the whole film is smaller than that obtained using TVTMCTS monomers and N$_2$O.

Also, in the same manner as above, tetravinyltetramethyl-cyclotetrasiloxane (TVTMCTS) monomers, divinylsiloxanebenzocyclobutene monomers (BCB) and N$_2$O were supplied in the initial film-forming stage, then the supply of the BCB monomers were stopped and in the final film-forming stage, the BCB monomers were supplied again, to make it easy to more raise the concentrations of carbon and hydrogen on the upper and lower surfaces of the film than those of the inside of the film.

Moreover, the carbon concentration and the hydrogen concentration in the film can be controlled stepwise or continuously by supplying the tetramethylcyclotetrasiloxane monomers, the divinylsiloxanebenzocyclobutene monomers and N$_2$O in a pulse form or in a lump form.

The insulating film according to this embodiment is also effective to improve adhesiveness to the neighboring semiconductor material.

In order to lower the dielectric constant of a layer insulating film, it is effective to reduce the ratio of polar elements (oxygen and silicon) contained in the film, namely, to increase the ratio of organic groups in the film. However, if the ratio of polar elements such as oxygen and silicone is reduced, the surface density of polar elements present at the interface between the film and other semiconductor substrate material is reduced and the composition is sharply changed at the contact interface, with the result that it is difficult to retain high adhesiveness.

In the insulating film according to this embodiment, an organic silica compound, which has a cyclic silica skeleton in its molecule and has at least one unsaturated hydrocarbon group bound with the cyclic silica skeleton, and a straight-chain organic silica compound, which has a straight-chain silica skeleton in its molecule and has any one selected from the group consisting of hydrogen, a hydrocarbon group and a hydrocarbon oxide group bound with the side chain of the straight-chain skeleton are used as the raw material. The ratio of these organic silica compounds to be supplied is, for example, appropriately controlled. As a result, different insulating films can be formed continuously in the same reaction chamber. Moreover, since the concentration of carbon in the insulating film can be arbitrarily controlled, it is easy to improve the adhesion of the insulating film to the neighboring semiconductor material by stepwise or continuously varying the film composition of the insulating film in the vicinity of both the upper and lower interfaces or one of the interfaces between the insulating film and the other semiconductor material.

Seventh Embodiment

A MOSFET device produced by forming multilayer wiring using the insulating films according to the above first to sixth embodiments will be explained as a seventh embodiment. FIG. 34 is a sectional view typically showing an example of a multilayer wiring structure in the MOSFET device.

Explanations will be given as to the procedures for forming a multilayer wiring structure having the above structure. First, a MOSFET device is formed on a silicon substrate 70. This is accomplished using the usual procedures involving the following steps: oxidation of the silicon substrate 70, formation of a nitride film, formation of a photoresist (PR), exposure, developing and etching of the PR film, peeling of the PR film, formation of a field oxide film (element isolation region), etching, formation of a gate oxide film, formation of gate electrodes and formation of source and drain regions.

Next, an inorganic layer insulating film 73 is formed on the MOSFET device formed according to the above procedures. Thereafter, a part of the inorganic layer insulating film 73 is removed to form holes leading to the drain region and source region respectively. Thereafter, a conductive material (tungsten or copper) layer is formed on the entire surface of the inorganic layer insulating film 73 and then, unnecessary parts are removed in order for the holes formed in the inorganic layer insulating film 73 to act as a contact plug (via) 72.

Next, a copper diffusion barrier layer 74 and a first layer insulating film 75 comprising a first porous insulating film 75a and a first layer hard mask 75b are formed on the MOSFET in which the via 72 is formed.

Next, a PR film is formed on the first layer insulating film 75. The PR film is exposed to light along a wiring pattern and then developed so that the part of the PR film is removed where wiring grooves are to be formed. After that, dry etching is carried out using the PR film as a mask to partially remove the first layer insulating film 75 and the copper diffusion barrier layer 74, thereby forming the wiring grooves on the unmasked part. After the wiring groove is formed, the PR film is removed.

Next, a copper diffusion barrier metal 76 and a copper film are formed on the entire surface of the MOSFET device including the inside of the formed wiring grooves and excess parts of these layers are removed by CMP to complete a first layer copper wiring 77.

After the first layer copper wiring 77 is formed, a first via layer insulating film 79a is formed on the copper wiring 77 and a second layer insulating film 79b is further laminated to form a second layer insulating film 79. Then, a copper diffusion barrier layer 78 is formed on the second layer insulating film 79.

After the copper diffusion barrier layer 78 is formed, a PR film is formed on the copper diffusion barrier layer. The PR film is exposed to light along a wiring pattern and a via pattern and then developed. The part of the PR film is removed where a second layer wiring 80 or a first via 85 is to be formed afterward. After that, dry etching is carried out using the PR film as a mask to partially remove the first via layer insulating film 79a and the second wiring layer insulating film 79b, thereby forming wiring grooves and a via hole at the unmasked parts.

Next, a copper diffusion barrier metal 83 and a copper film are formed on the entire surface of the MOSFET device including the formed via hole and the inside of the wiring groove and excess parts of these layers are removed by CMP to complete a second layer copper wiring 80 and a first via.

After the first via is formed, a second via layer insulating film 81a is formed on the first via and a third wiring layer insulating film 81b is laminated on the second via layer insulating film 81a to form a third layer insulating film 81. Then, a copper diffusion barrier layer 78 is formed on the third layer insulating film 81.

After the copper diffusion barrier layer 78 is formed, a PR film is formed on it. The PR film is exposed to light along a wiring pattern and a via pattern, and then developed. The part of the PR film is removed where a third layer wiring 82 or a second via is to be formed afterward. After that, dry etching is carried out using the PR film as a mask to partially remove the second via layer insulating film 81a and the second wiring layer insulating film 81b, thereby forming a wiring groove and a via hole at the unmasked parts.

Next, a copper diffusion barrier metal 84 and a copper film are formed on the entire surface of the MOSFET device including the formed via hole and the inside of the wiring groove and excess parts of these layers are removed by CMP to complete a third layer copper wiring 82 and a second via. A multilayer wiring structure as shown in FIG. 34 is formed by such procedures.

In the case of making a multilayer structure, for example, the step of forming a layer insulating film and a copper diffusion barrier layer, the step of forming a wiring groove and a via hole and the step of forming wiring and a via may be carried out repeatedly.

In the structure shown in FIG. 34, the insulating film according to the third embodiment is applied to a wiring layer and the insulating film according to the second embodiment is applied to a via layer to form a dual damascene wiring structure.

When the dual damascene wiring structure is formed, it is preferable that the etching selectivity of insulating materials applied to the wiring layer and the via layer be high (in other words, a difference in etching speeds between the wiring layer and the via layer is large). Since in the above-explained method of producing a multilayer structure insulating film, the concentrations of carbon and hydrogen can be easily controlled, the etching selectivity is easily raised.

For example, a Si—O bond in the film can be usually dry-etched by $CF_x$ gas. Organic components can be also dry-etched by a mixture gas of $N_2$ and $H_2$, or $O_2$. When the concentrations of carbon and hydrogen in a SiOCH film are different from each other, it is possible to control the etching selectivity by using a mixture gas of $N_2$, $H_2$ and $CF_x$ or $O_2$, Ar and CF and by changing the supply ratio of each gas and the type of $CF_x$ gas.

Therefore, a high etching selectivity can be obtained by laminating the insulating film (the insulating films according to the first and second embodiments) produced using tetravinyltetramethylcyclotetrasiloxane (TVTMCTS) monomers or TVTMCTS monomers and $N_2O$ on the insulating film (the insulating film according to the third embodiment) produced using TVTMCTS monomers and divinylsiloxanebenzocyclobutene (BCB) monomers, or TVTMCTS monomers, BCB monomers and $N_2O$, where the insulating film has a high carbon concentration.

Also, as explained in the above third embodiment, the supply ratio of the raw material having a cyclic silica structure to the raw material having a straight-chain silica structure is changed during the course of film formation, whereby insulating films differing in composition can be formed continuously. Accordingly, because the wiring layer and the via layer can be formed continuously in the same chamber even in the multilayer wiring structure shown in FIG. 34, the etching selectivity and throughput can be improved at the same time by forming continuously insulating films differing in the concentration of carbon.

In this embodiment, the insulating film according to the second embodiment is used as the via layer and the insulating film according to the third embodiment that has a higher carbon concentration than the via layer is used as the wiring layer. However, it is clear that the same effect will be obtained even by using the insulating film according to the second embodiment as the wiring layer and the insulating film according to the third embodiment that has a higher carbon concentration than the via layer as the wiring layer.

Also, in this embodiment, the porous insulating film explained in the above each embodiment is used for the wiring layer and the via layer. However, it is effective to use the porous insulating film according to any one of the above embodiments for either one of the wiring layer and the via layer, from the viewpoint of decreasing effective specific inductive capacity.

Eighth Embodiment

Explanations will be given of an eighth embodiment relating to a MOSFET device to which the insulating film according to any one of the first to sixth embodiments is applied as an etching stopper layer disposed between a via layer and a wiring layer in a multilayer wiring structure.

FIG. 35 is a sectional view typically showing an example of a multilayer wiring structure in the MOSFET device. In the structure shown in this figure, two types of insulating films differing in carbon concentration from each other are used. An insulating film having a higher carbon concentration than any of the insulating films used as the wiring layer and the via layer is disposed as the etching stopper layer between the wiring layer and the via layer to form a dual damascene wiring structure.

The procedures for forming the multilayer wiring laminate structure shown in FIG. 35 are the same as those explained in the above fourth embodiment. The procedures are, however, different from those in the fourth embodiment in the point that when the via layer insulating films 79a and 81a are formed, the wiring layer insulating films 79b and 81b are formed after the etching stopper layers 79c and 81c are formed and the etching stopper layers 79c and 81c are removed at the place where a via hole is to be formed in the step of forming a wiring groove and a via hole.

It is to be noted that the same effect is obtained also by arranging insulting films having a higher carbon concentration as the wiring layer and the via layer, and an insulating film having a lower carbon concentration than the wiring layer and the via layer as the etching stopper layer. Moreover, as shown in FIG. 36, insulating films differing in carbon concentration may be applied as the wiring layer and the via layer without any problem insofar as a satisfactory etching selectivity is obtained.

The above multilayer wiring laminate structure also allows the continuous formation of the wiring layer and the via layer in the same reaction chamber. Therefore, etching selectivity and throughput can be improved at the same time by continuously forming insulating films differing in carbon concentration.

Also, the porous insulating film according to any one of the above first to sixth embodiments may be used as at least one of the wiring layer and the via layer, and an inorganic insulating film may be used as the etching stopper layer, which is effective to drop the effective specific inductive capacity of the whole multilayer wiring.

Ninth Embodiment

Explanations will be given of a ninth embodiment relating to a MOSFET device to which the insulating film according to any one of the first to sixth embodiments is applied as a layer that improves the adhesiveness to other semiconductor materials in a multilayer wiring structure.

FIG. 37 is a sectional view typically showing an example of a multilayer wiring structure in the MOSFET device.

An insulating layer with carbon concentration of the peripheral part differing from that of the center part is stepwise or continuously inserted into the interface between the wiring layer and the via layer. It is possible to control the composition only in the vicinity of the interface with the semiconductor material, which is in contact with the upper and lower sides of the layer insulating film, to thereby improve the adhesion at the upper and lower interfaces.

The procedures for forming the multilayer wiring laminate structure shown in FIG. 37 are the same as those explained in the above fourth embodiment. However, when the first layer insulating film 75 is formed and the copper diffusion barrier film 74 is formed, the first layer porous insulating film 75a is formed after an adhesion strengthening layer 95 is formed and then, a first layer hard mask 75b is formed after an adhesion strengthening layer 95 is formed. Then, in the step of forming the wiring groove, the adhesion strengthening layer 95 at the part where the wiring groove is formed is also removed.

Also, the adhesion strengthening layer 95 is provided in places between the copper diffusion barrier film 78 and the via layer insulating films 79a and 81a, between the via layer insulating films 79a and 81a and the etching stopper layer 78 and between the etching stopper layer 78 and the wiring layer insulating films 79b and 81b. When a wiring groove or a via hole is formed, the adhesion strengthening layer 95 at the positions where these layers are to be formed is removed.

As the raw material used are an organic silica compound which has a cyclic silica skeleton in its molecule and has at least one unsaturated hydrocarbon group bound with the cyclic silica skeleton, and a straight-chain organic silica compound which has a straight-chain silica skeleton in its molecule and has at least one unsaturated hydrocarbon group bound with the straight-chain skeleton. This makes it possible to control the composition so as to alleviate causes to drop the adhesion of an interface such as the surface density of polar elements (oxygen, silicon or the like) and a sharp change in composition at the interface in contact with other semiconductor materials. Therefore, the film composition in the vicinity of the upper and lower interfaces, or in the vicinity of either one of the interfaces where the insulating film is in contact with other semiconductor materials is changed stepwise or continuously, whereby the adhesion to the semiconductor material is improved.

Also, FIG. 37 shows one example of a structure in which the concentration of carbon is controlled stepwise on all interfaces of the wiring layer and via layer to improve adhesiveness. However, it is unnecessary to stepwise control the carbon concentration on all interfaces to improve adhesiveness. A sufficient effect is obtained even if the control of carbon concentration is applied to only a part of the interfaces.

Furthermore, it is very effective measures that the interface composition is controlled so as to obtain a satisfactory etching selectivity between the wiring layer and the via layer and this composition controlled layer is utilized as the etching stopper layer from the viewpoint of an improvement in throughput, process controllability and an improvement in adhesiveness.

Tenth Embodiment

Explanations will be given of a tenth embodiment relating to a MOSFET device having a single damascene wiring structure where the insulating film according to any one of the first to sixth embodiments is applied to the wiring layer and the via layer. FIG. 38 is a sectional view typically showing one example of a multilayer wiring structure in the MOSFET device. The MOSFET device according to this embodiment can reduce the effective specific inductive capacity of a multilayer wiring by applying a porous insulating film to a layer insulating film.

Explanations will be given of the procedures for forming the multilayer wiring structure of the above structure. The procedures from formation of the MOSFET device on a silicon substrate 70 to formation of the first layer copper wiring 77 are the same as those in the fourth embodiment.

After the formation of the first layer copper wiring 77 is finished, a copper barrier film 78 is formed on the copper wiring 77, a first via layer insulating film 79*a* is further formed and a second via layer insulating film hard mask 79*d* is further formed. After the second via layer insulating film hard mask 79*d* is formed, a PR film is formed on the hard mask. The PR film is exposed to light along a via pattern and then developed to remove the PR film only at the part where a first via 85 is to be formed. After that, dry etching is carried out using the PR film as a mask to partially remove the second via layer insulating film hard mask 79*d*, the first via layer insulating film 79*a* and the copper diffusion barrier layer 78 to form a via hole within an unmasked part.

Next, a copper diffusion barrier metal 83 and a copper film are formed on the entire surface of the MOSFET device including the inside of the formed via hole and excess parts of these films are removed by CMP to form a first via 85.

After the formation of the first via 85 is finished, a copper diffusion barrier film 78 is formed on the first via 85, a second wiring layer insulating film 79*b* is further formed and a second wiring layer insulating film hard mask 79*e* is further formed. After the second wiring layer insulating film hard mask 79*e* is formed, a PR film is formed on the hard mask. The PR film is exposed according to a wiring pattern and then developed to remove the PR film at the part where a second layer copper wiring 80 is to be formed afterward. After that, dry etching is carried out using the PR film as a mask to partially remove the second wiring layer insulating film hard mask 79*e*, the second wiring layer insulating film 79*b* and the copper diffusion barrier layer 78 to form a wiring groove on the unmasked part.

Next, a copper diffusion barrier metal 83 and a copper film are formed on the formed entire surface of the MOSFET device including the inside of the wiring groove and excess parts of these films are removed by CMP to form a second layer copper wiring 80.

After the formation of the second copper wiring 80 is finished, a copper diffusion barrier film 78 is formed on the copper wiring 80, a second via layer insulating film 81*a* is further formed and a third via layer insulating film hard mask 81*d* is further formed. After the third via layer insulating film hard mask 81*d* is formed, a PR film is formed on the hard mask. The PR film is exposed along a via pattern and then developed to remove the PR film only at the part where a second via 86 is to be formed afterward. After that, dry etching is carried out using the PR film as a mask to partially remove the third via layer insulating film hard mask 81*d*, the second via layer insulating film 81*a* and the copper diffusion barrier layer 78 to form an unmasked partial via hole.

Next, a copper diffusion barrier metal 84 and a copper film are formed on the entire surface of the MOSFET device including the inside of the formed via hole and excess parts of these films are removed by CMP to form a second via 86.

After the formation of the second via 86 is finished, a copper diffusion barrier film 78 is formed on the second via 86, a third wiring layer insulating film 81*b* is further formed and a third wiring layer insulating film hard mask 81*e* is further formed. After the third wiring layer insulating film hard mask 81*e* is formed, a PR film is formed on the hard mask. The PR film is exposed according to a wiring pattern and then developed to remove the PR film only at the part where a third layer copper wiring 82 is to be formed afterward. After that, dry etching is carried out using the PR film as a mask to partially remove the third wiring layer insulating film hard mask 81*e*, the third wiring layer insulating film 81*b* and the copper diffusion barrier layer 78 to form a wiring groove on the unmasked part.

Next, a copper diffusion barrier metal 84 and a copper film are formed on the entire surface of the MOSFET device including the inside of the formed wiring groove and excess parts of these films are removed by CMP to form a third layer copper wiring 82.

After that, for example, the step of forming a layer insulating film and a copper diffusion barrier layer, the step of forming a wiring groove and a via hole and the step of forming wiring and a via may be carried out repeatedly, to form a multilayer structure as shown in the figure.

In the case of making a more multi-layered structure, it is only required to carry out the step of forming a layer insulating film and a copper diffusion barrier layer, the step of forming a wiring groove and a via hole and the step of forming wiring and a via repeatedly.

Also, in this embodiment, the porous insulating films according to the above first to sixth embodiments are used for the wiring layer and the via layer. However, it is effective to use the porous insulating film according to any one of the first to sixth embodiments for only one of the wiring layer and the via layer, from the viewpoint of decreasing effective specific inductive capacity.

Moreover, even if the insulating films according to the above first to sixth embodiments are laminated step by step or continuously and the upper insulating film is used as a hard mask, this is effective to improve adhesiveness and to reduce the effective specific inductive capacity of the whole multilayer wiring.

Eleventh Embodiment

Explanations will be given of an eleventh embodiment relating to a MOSFET device having a single damascene wiring structure using the insulating film according to any one of the first to sixth embodiments applied to the wiring layer and the via layer. FIG. 39 is a sectional view typically showing one example of a multilayer wiring structure in the MOSFET device.

The procedures for forming the multilayer wiring laminate structure shown in FIG. 39 are almost the same as those explained in the above seventh embodiment. It is however different in the point that after the wiring groove and the via hole are formed, the copper diffusion barrier film 78 is formed after a side wall protective film 87 is formed on each side surface of the wiring groove and the via hole.

Moreover, a protective film of 10 nm or less in thickness is formed on each side wall of the wiring groove and the via hole. When the porous insulating film is dry-etched, the porous insulating film, namely, pores are exposed from the wiring groove side wall part after the etching is finished. At this time, gas penetrates into or adsorbs to the pores during etching or ashing and moisture penetrates into or adsorbs to these pores in a washing step. Each of these phenomena can be a cause of a deterioration in the reliability of the MOSFET device or induction of a rise in the specific inductive capacity of an insulating film. Therefore, it is essential to prevent a gas component or moisture from entering into or adsorbing to the pores as much as possible.

In this embodiment, a protective film (BCB film) 10 nm or less in thickness was formed on each side wall part of the wiring groove and the via hole by a plasma polymerization method using divinylsiloxanebenzocyclobutene monomers as starting material. This protective film can clog pores exposed on the side wall parts of the wiring groove and the via hole to prevent a gas component and moisture from penetrating into or adsorbing to the pores.

In this embodiment, the protective layer is formed on both the wiring layer and the via layer. However, the protective layer may be used for only one of the wiring layer and the via layer.

The above each embodiment is a preferred embodiment of the present invention and the present invention is not limited to these embodiments. For example, in the above each embodiment, examples in which the raw material is gasified to grow an insulating film in a vapor phase are shown. Even if a film is formed in the same manner by a coating method, a porous insulating film having a low dielectric constant can be obtained.

Also, though the above explanations are furnished as to the case of applying RF power to a shower head to form plasma in a reaction chamber, the same insulating film and MOSFET device as those produced in the above embodiments are obtained even if a structure (namely, a remote plasma system) in which plasma is formed in advance outside the reaction chamber and then introduced into the reaction chamber is adopted.

Also, in the above seventh to eleventh embodiments, a MOSFET is taken as an example of the semiconductor device. However, it is needless to say that the present invention can be applied to other semiconductor devices.

The present invention may be variously modified in this manner.

BRIEF DESCRIPTION OF THE DRAWINGS

FIG. 3 is a schematic diagram of a gasifying and supply system usable to gasify and supply a solid raw material where the system is utilized in a process of producing an insulating film according to the embodiments.

FIG. 13 is a graph showing the film-forming speed of an insulating film against RF power according to a second embodiment.

FIG. 14 is a graph showing the specific inductive capacity of an insulating film against RF power according to a second embodiment.

FIG. 18 is a graph of the film-forming speed of an insulating film against the amount of $N_2O$ to be added according to a third embodiment.

FIG. 19 is a graph of the film-forming speed of an insulating film against the flow rate of diluent helium gas according to a third embodiment.

FIG. 30 is a graph showing the film-forming speed of an insulating film according to a sixth embodiment as a function of the supply ratio of a raw material and as a function of $N_2O$ to be supplied.

FIG. 31 is a graph showing the specific inductive capacity of an insulating film according to a sixth embodiment as a function of the supply ratio of a raw material and as a function of $N_2O$ to be supplied.

FIG. 34 is a diagram of a dual damascene wiring structure in a MOSFET device according to a seventh embodiment.

FIG. 35 is a diagram of a dual damascene wiring structure in a MOSFET device according to an eighth embodiment.

EXPLANATIONS OF THE SYMBOLS

Figure 1:
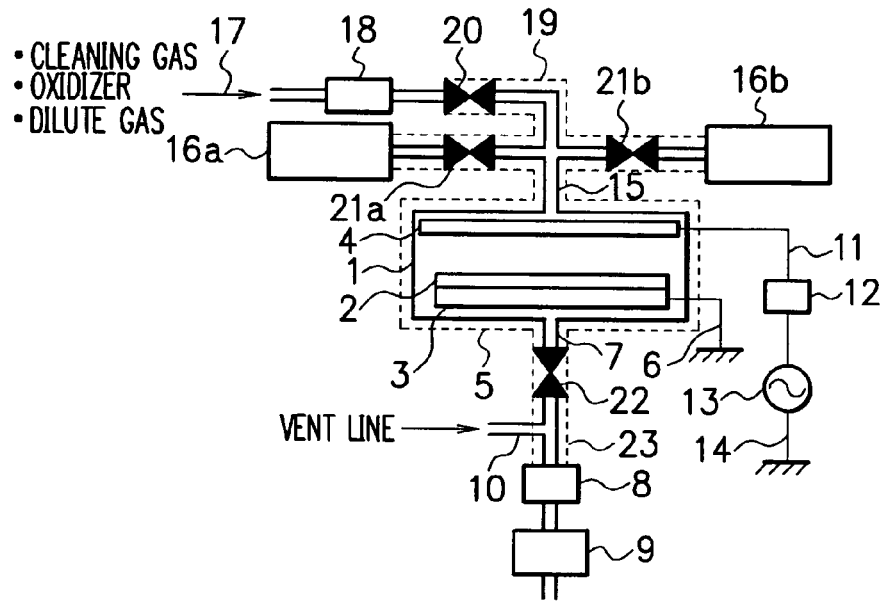
FIG. 1 is a schematic diagram of a film-forming apparatus usable to practice a process of producing an insulating film according to the embodiments.
Figure 2:
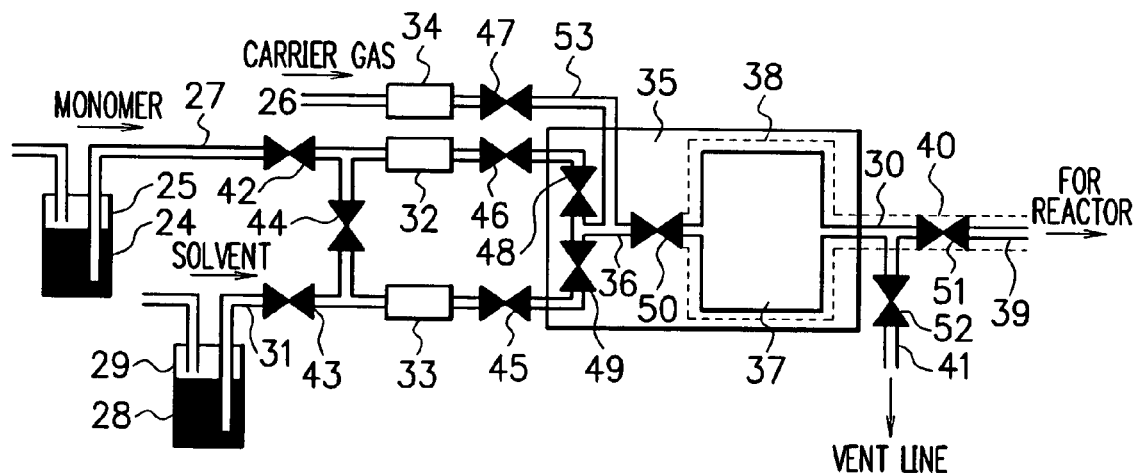
FIG. 2 is a schematic diagram of a gasifying and supply system usable to gasify and supply a liquid raw material where the system is utilized in a process of producing an insulating film according to the embodiments.
Figure 4:
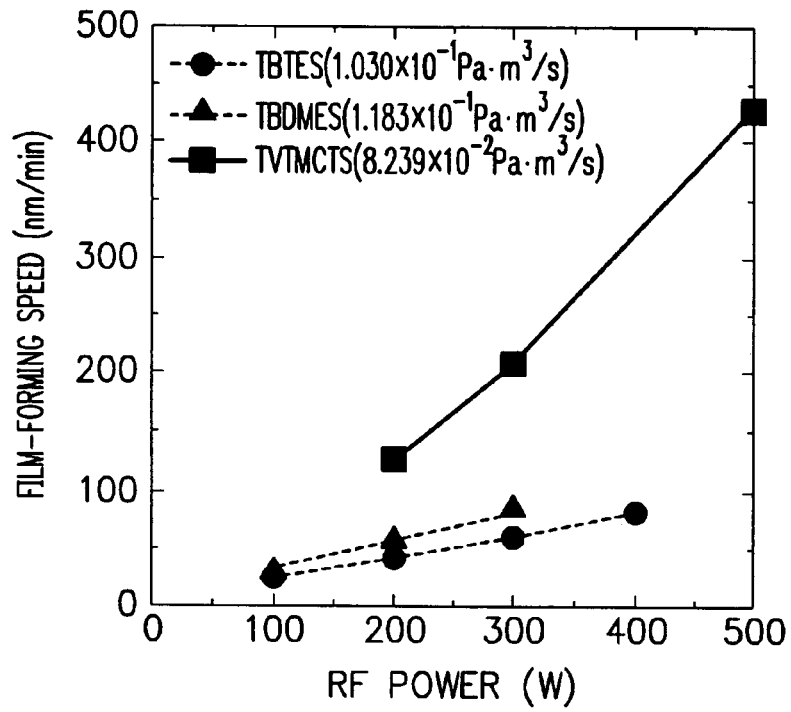
FIG. 4 is a graph showing the RF power dependency of the film-forming speed of an insulating film according to a first embodiment.
Figure 5:
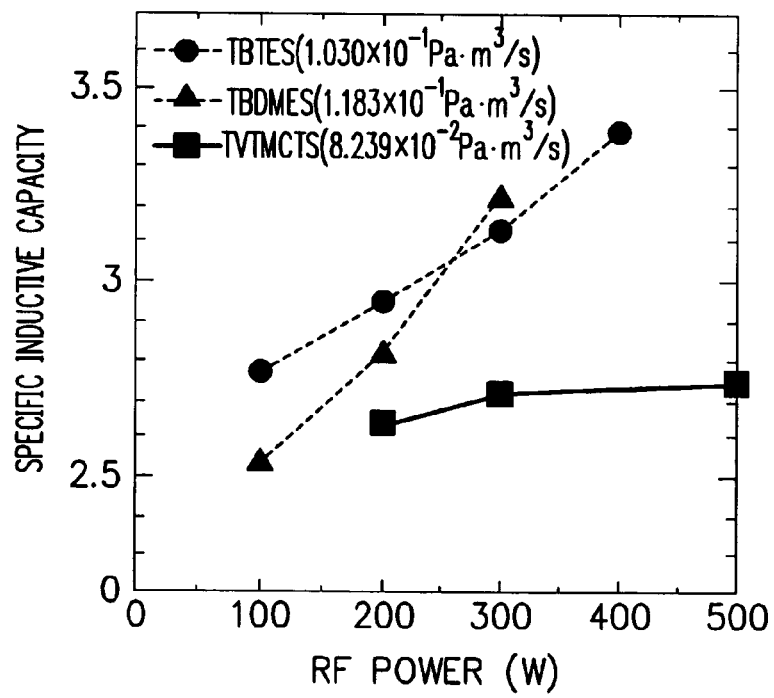
FIG. 5 is a graph showing the RF power dependency of the specific inductive capacity of an insulating film according to a first embodiment.
Figure 6:
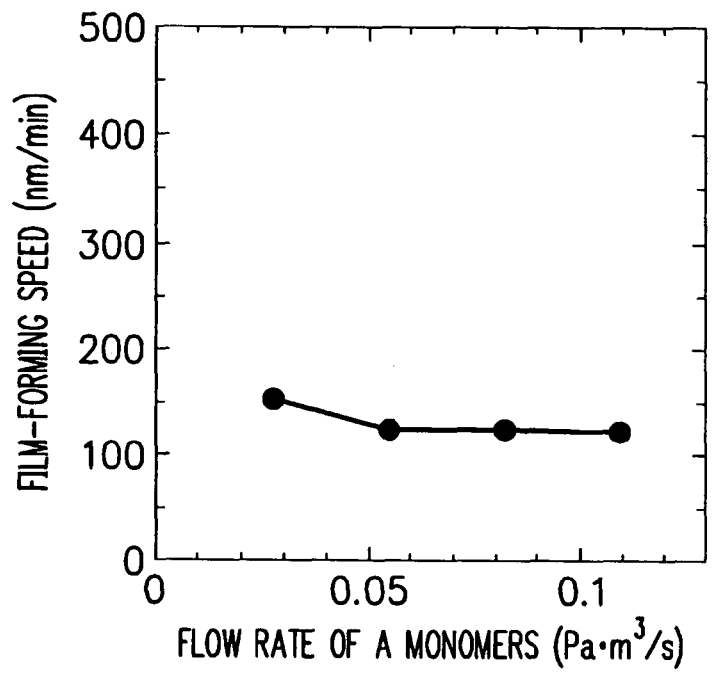
FIG. 6 is a graph showing the film-forming speed of an insulating film against the flow rate of a raw material when RF power is 200 W according to a first embodiment.
Figure 7:
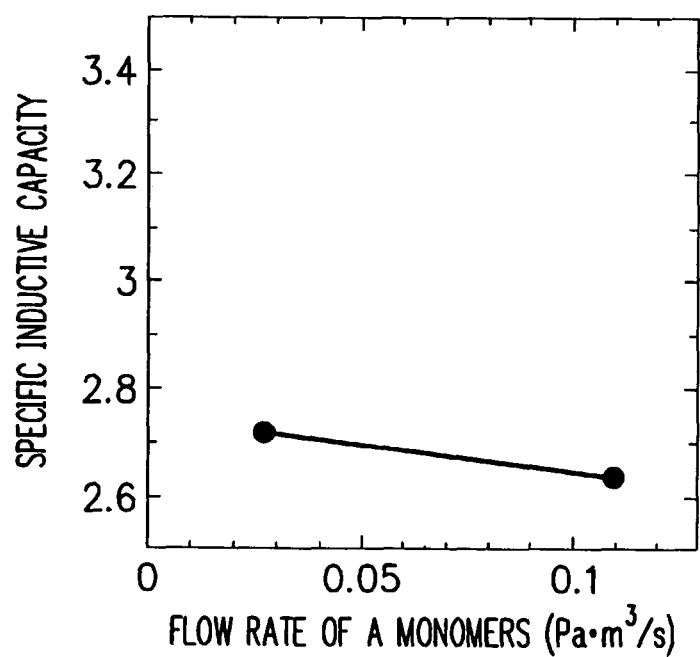
FIG. 7 is a graph showing the specific inductive capacity of an insulating film against the flow rate of a raw material when RF power is 200 W according to a first embodiment.
Figure 8:
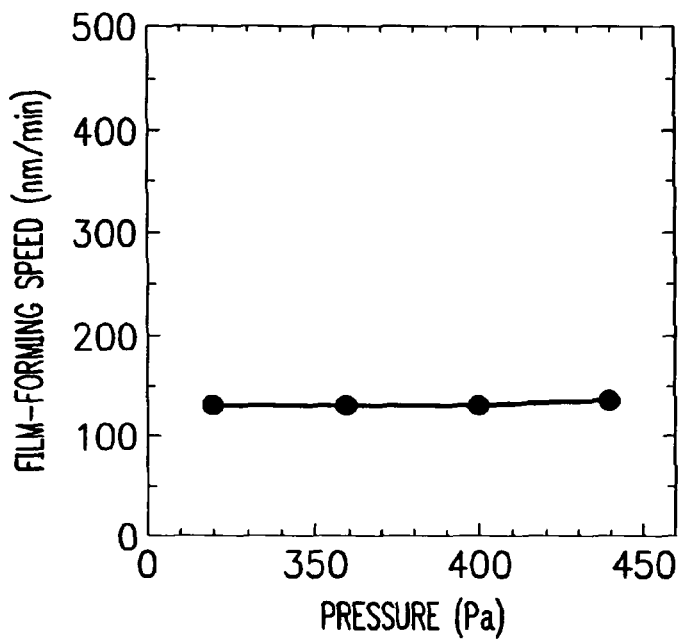
FIG. 8 is a view showing the film-forming speed of an insulating film against the pressure in a reaction chamber when RF power is 200 W according to a first embodiment.
Figure 9:
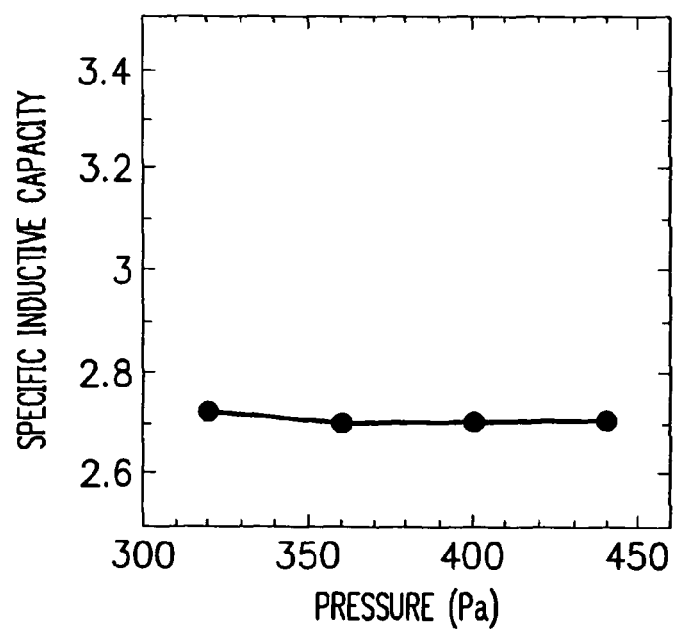
FIG. 9 is a graph showing the specific inductive capacity of an insulating film against the pressure in a reaction chamber when RF power is 200 W according to a first embodiment.
Figure 10:
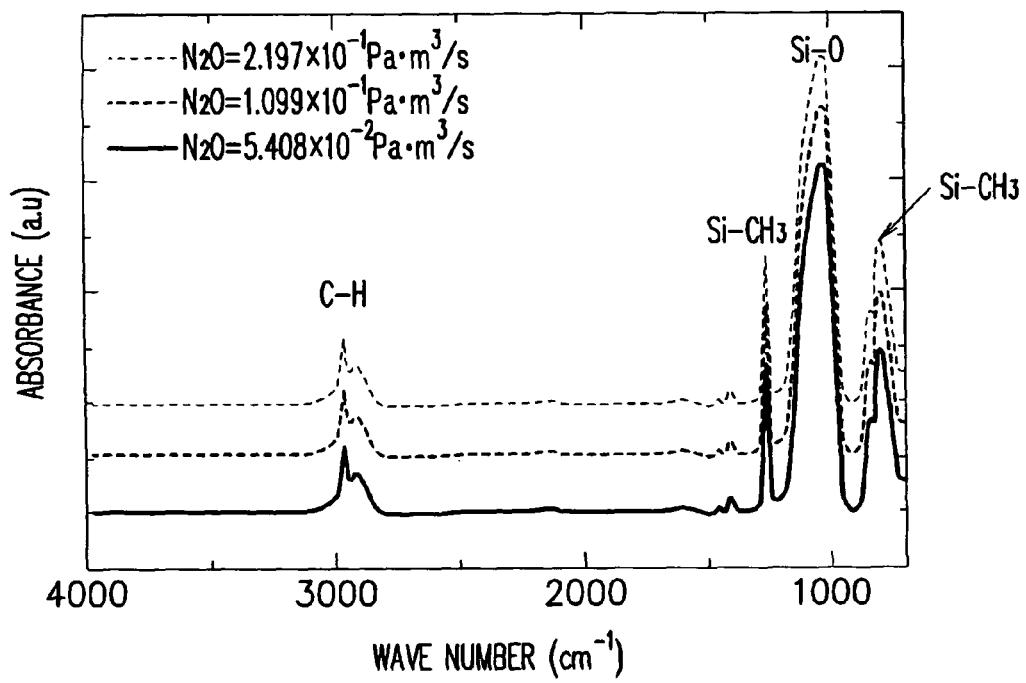
FIG. 10 is a graph showing the results of Fourier-transform infrared spectroscopic analysis of an insulating film according to a first embodiment.
Figure 11:
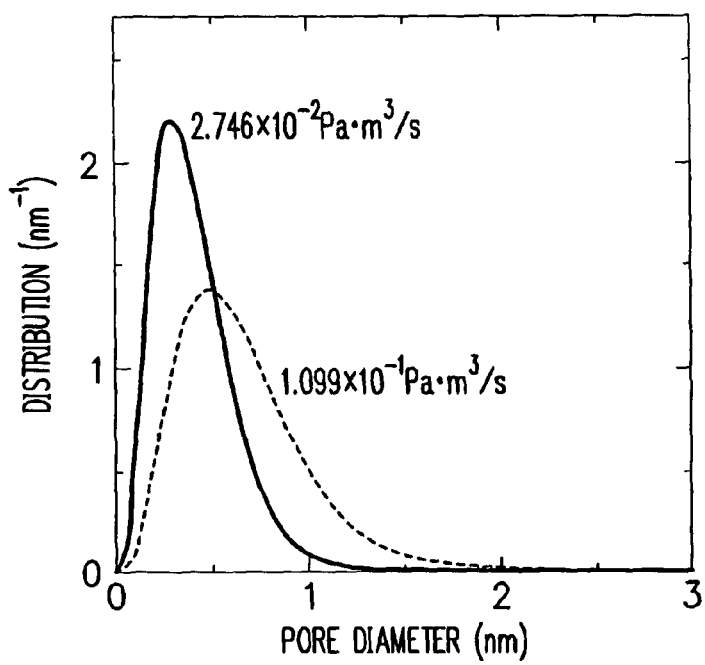
FIG. 11 is a graph showing the results of pore distribution analysis of an insulating film by a small-angle X-ray scattering method according to a first embodiment.
Figure 12:
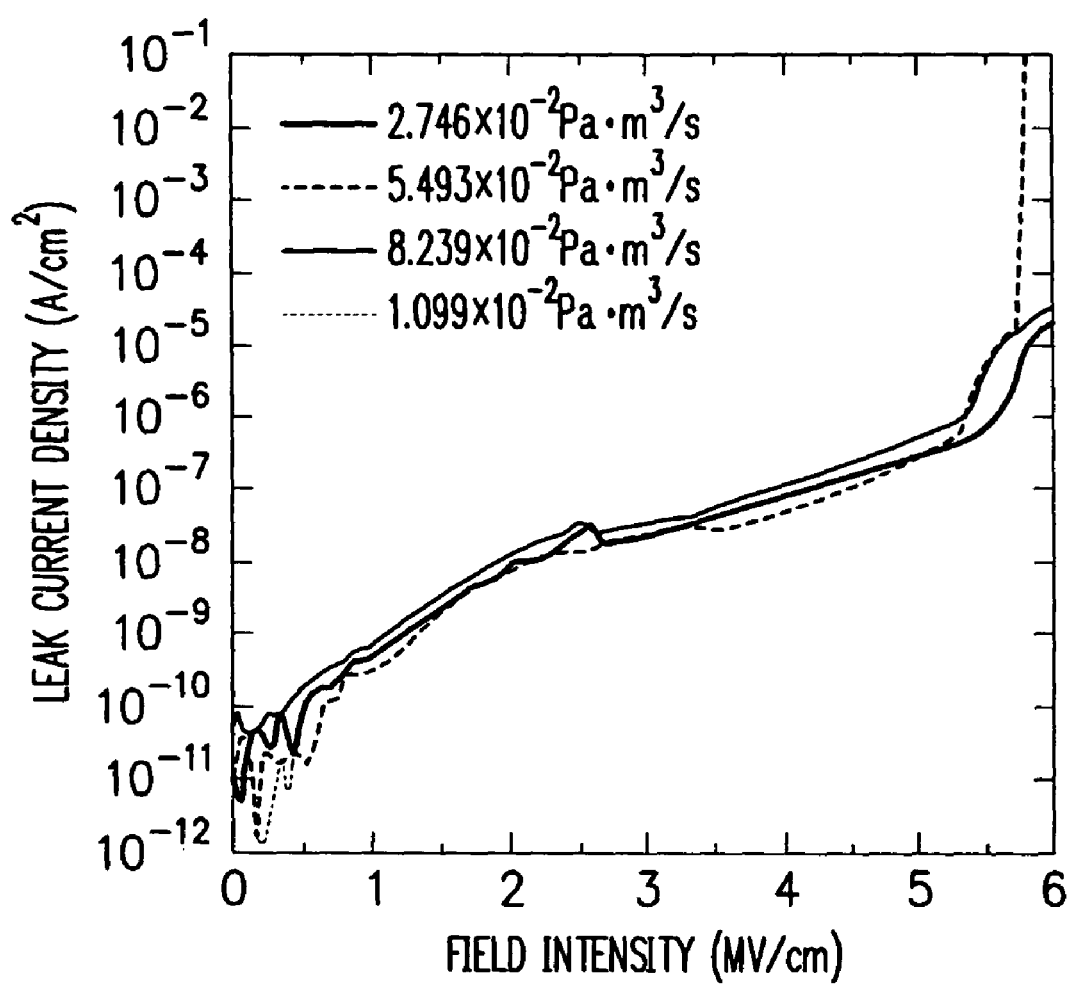
FIG. 12 is a graph showing the current-voltage characteristic of an insulating film against field intensity when RF power is 200 W according to a first embodiment.
Figure 15:
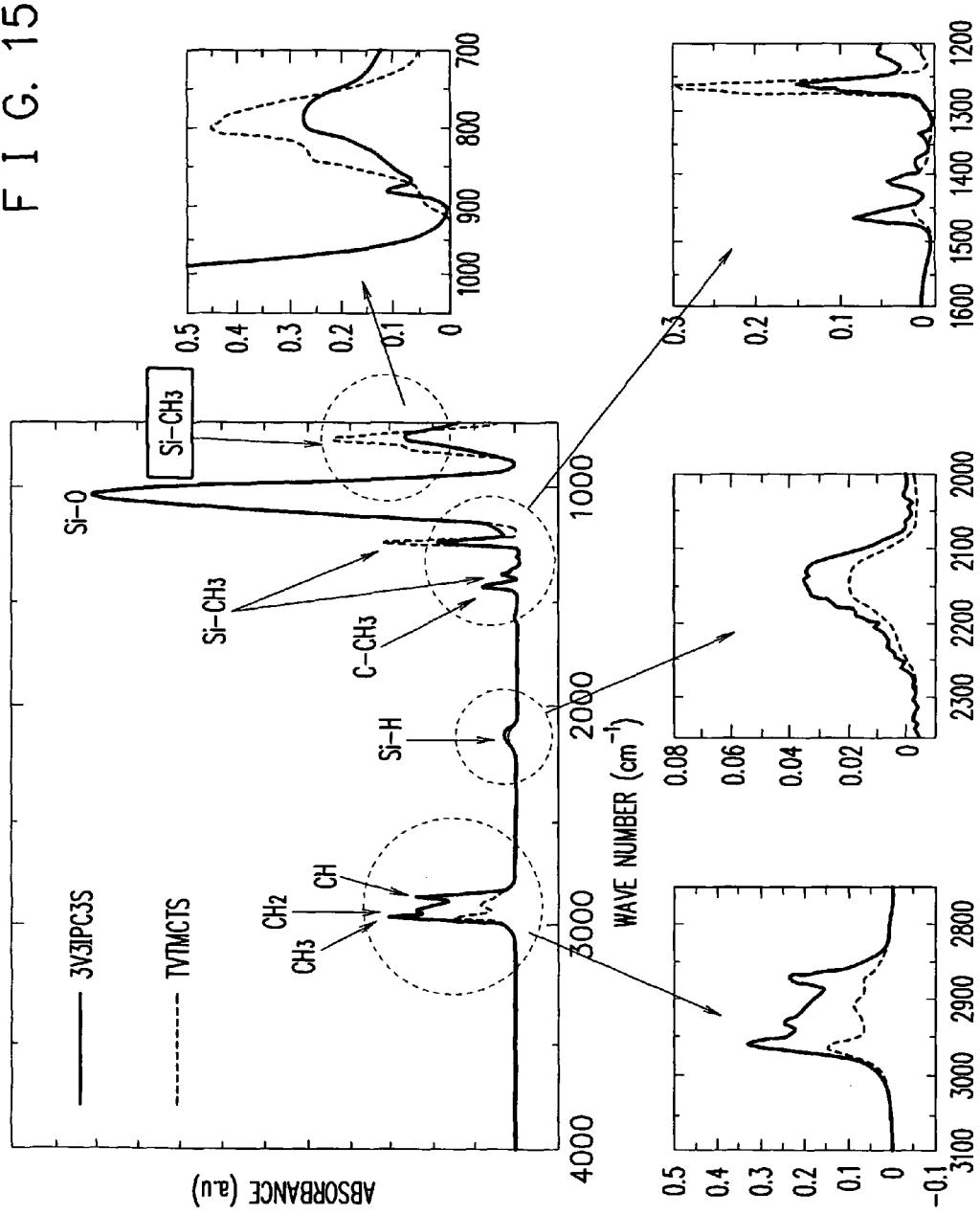
FIG. 15 is a graph showing each FTIR spectrum of insulating films formed using 3V3IPC3S and TVTMCTS when RF power is 200 W according to a second embodiment.
Figure 16:
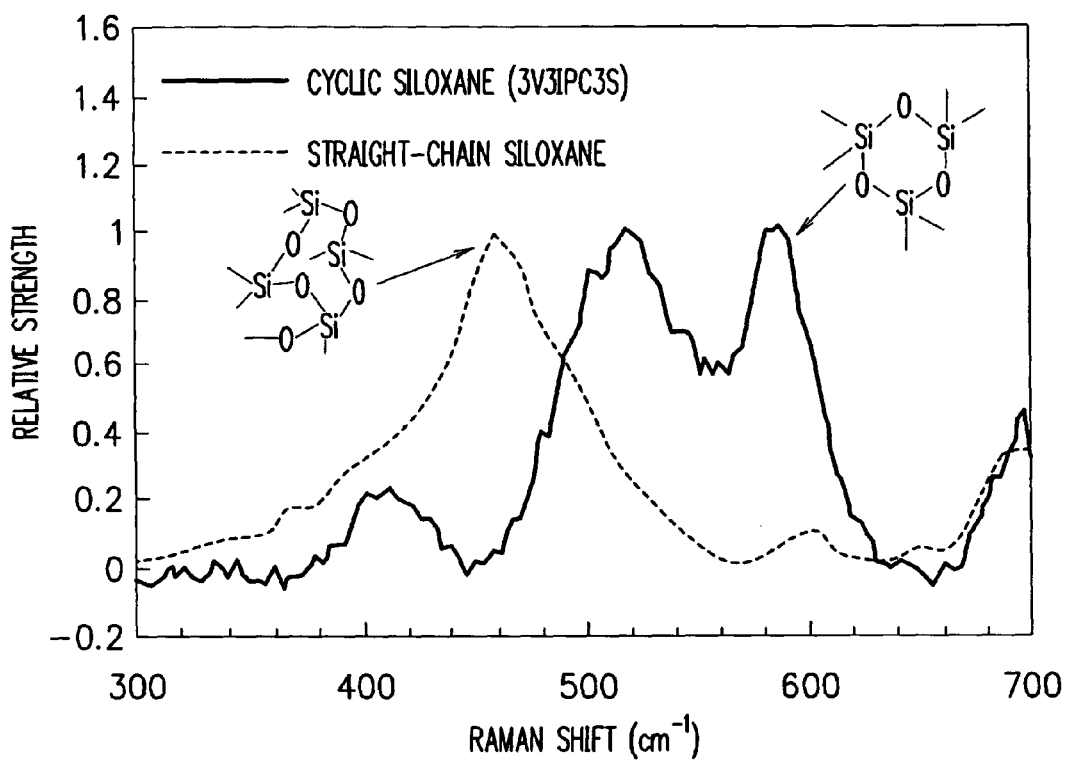
FIG. 16 shows the results of Raman spectroscopic analysis obtained from cyclic organic silica 3V3IPC3S and straight-chain organic silica of an insulating film according to a second embodiment.
Figure 17:
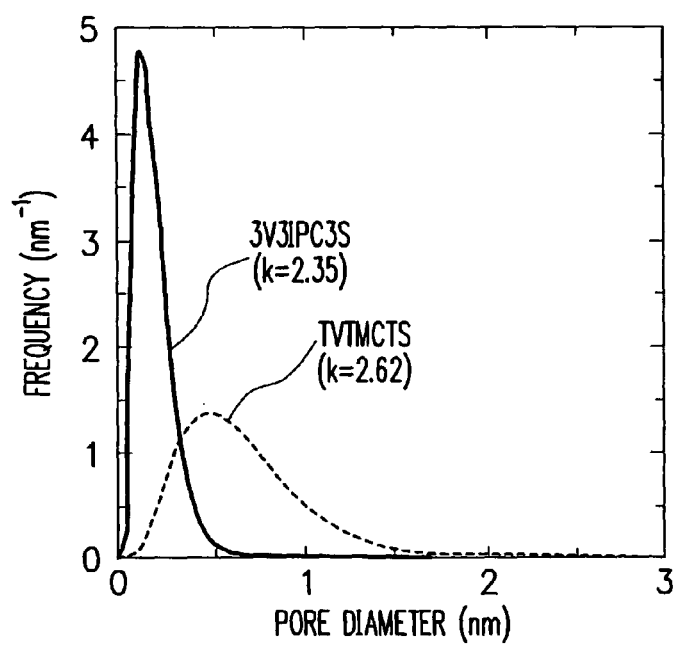
FIG. 17 is a graph showing a pore distribution in a film that is found by a small-angle X-ray scattering method according to a second embodiment.
Figure 20:
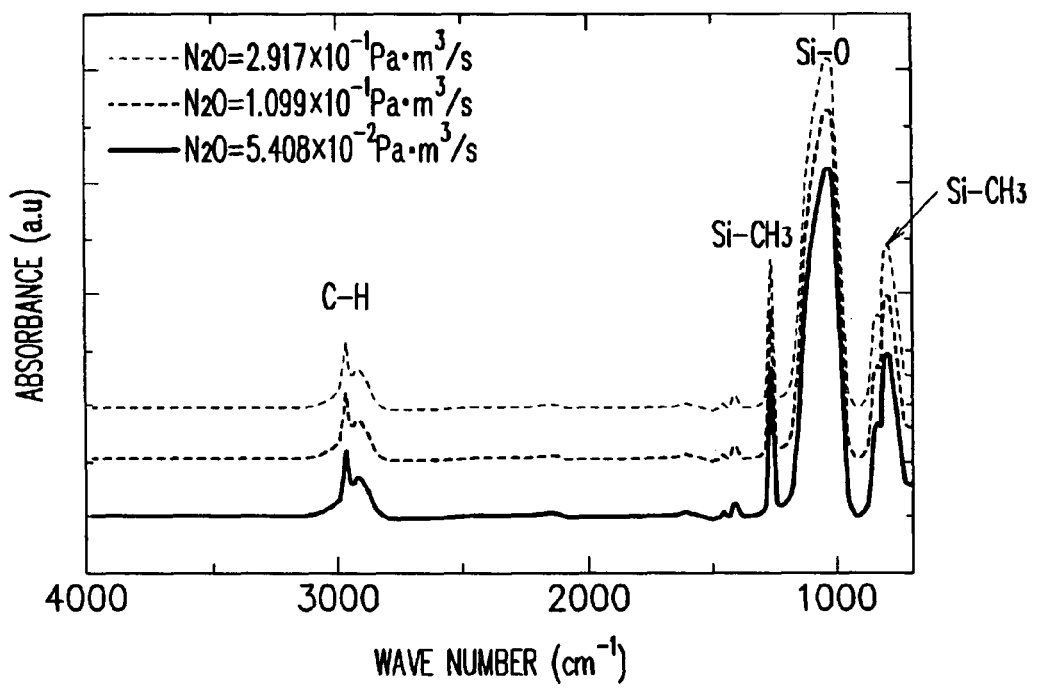
FIG. 20 is a graph showing the results of Fourier-transform infrared spectroscopic analysis of an insulating film according to a third embodiment.
Figure 21:
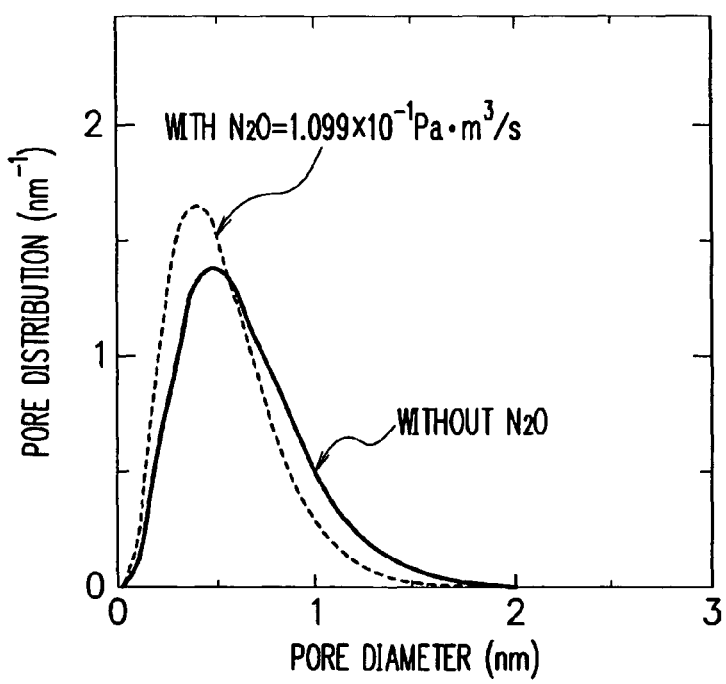
FIG. 21 is a graph showing the results of pore distribution analysis of an insulating film by a small-angle X-ray scattering method according to a third embodiment.
Figure 22:
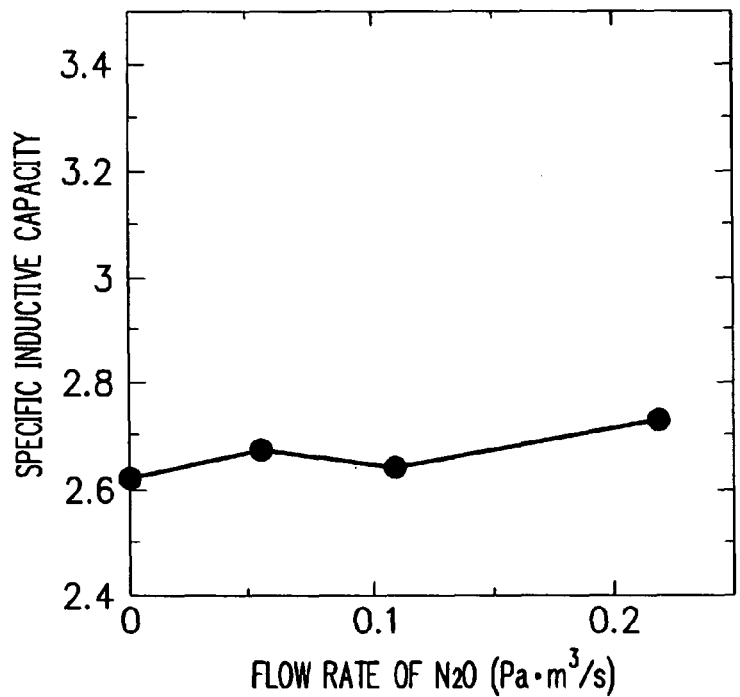
FIG. 22 is a graph showing the specific inductive capacity of an insulating film against the amount of $N_2O$ to be added according to a third embodiment.
Figure 23:
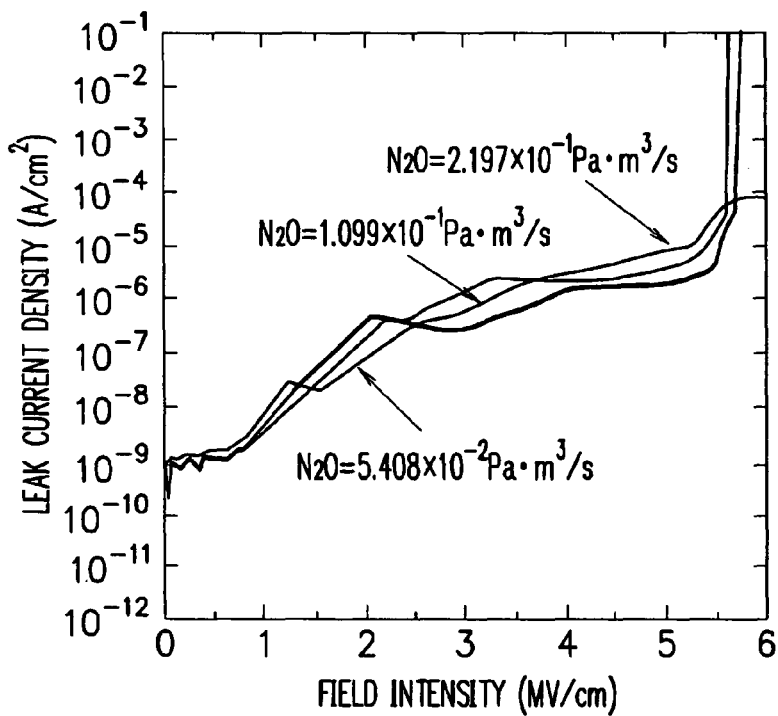
FIG. 23 is a graph showing the current-voltage characteristic of an insulating film against field intensity with the various amounts of $N_2O$ according to a third embodiment.
Figure 24:
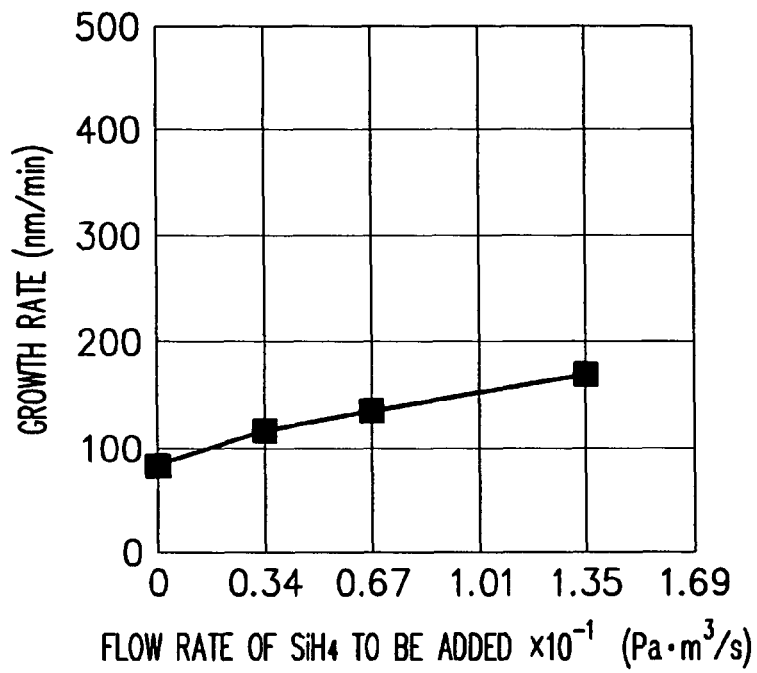
FIG. 24 shows the relation between the film-forming speed of an insulating film and the amount of $SiH_4$ to be added according to a fourth embodiment.
Figure 25:
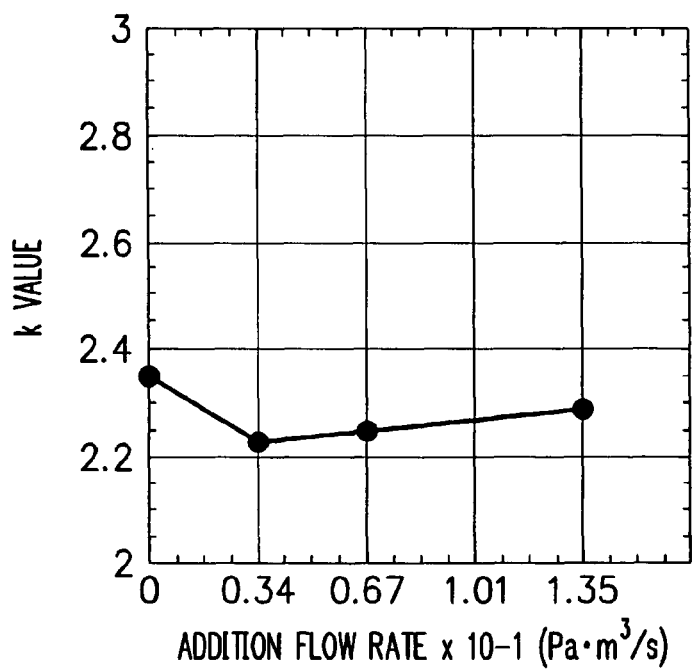
FIG. 25 shows the relation between the specific inductive capacity (k) of an insulating film and the amount of $SiH_4$ to be added according to a fourth embodiment.
Figure 26:
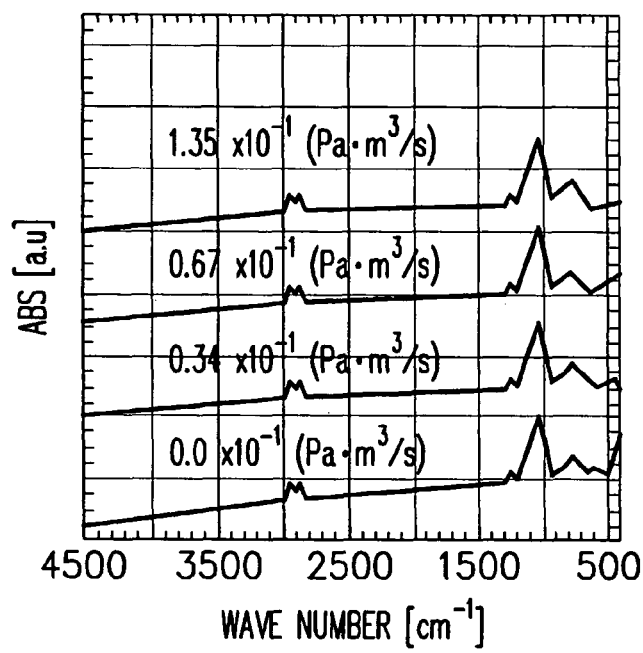
FIG. 26 is a graph showing the results of Fourier-transform infrared spectroscopic analysis (FT-IR) of an insulating film according to a fourth embodiment.
Figure 27:
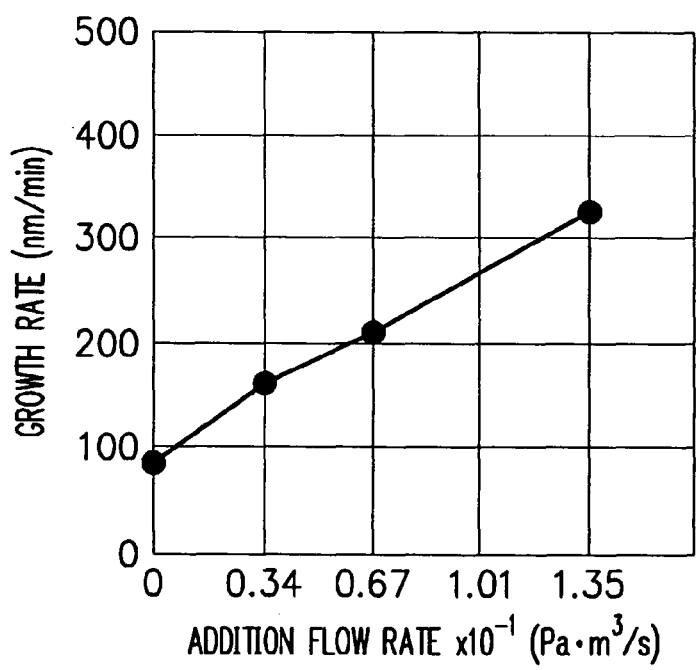
FIG. 27 is a graph showing the relation between the film-forming speed of an insulating film and the amount of $N_2O$ to be added according to a fifth embodiment.
Figure 28:
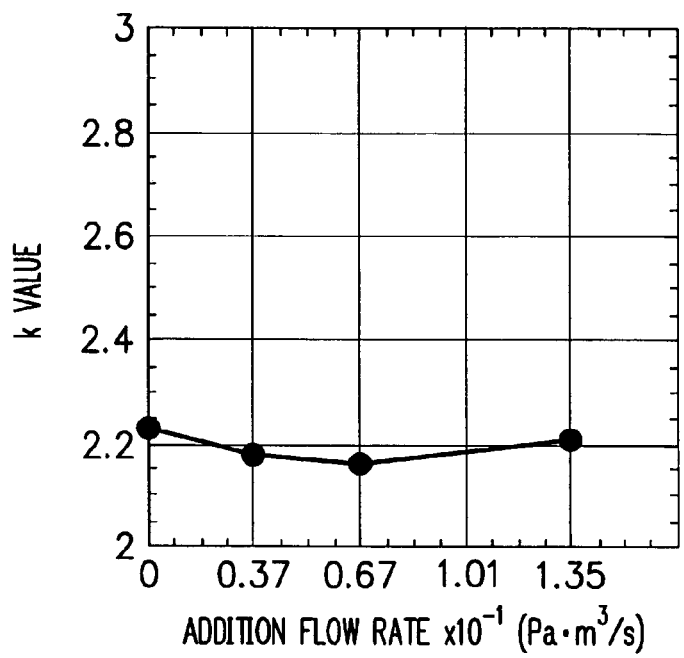
FIG. 28 shows the relation between the specific inductive capacity (k) of an insulating film and the amount of $N_2O$ to be added according to a fifth embodiment.
Figure 29:
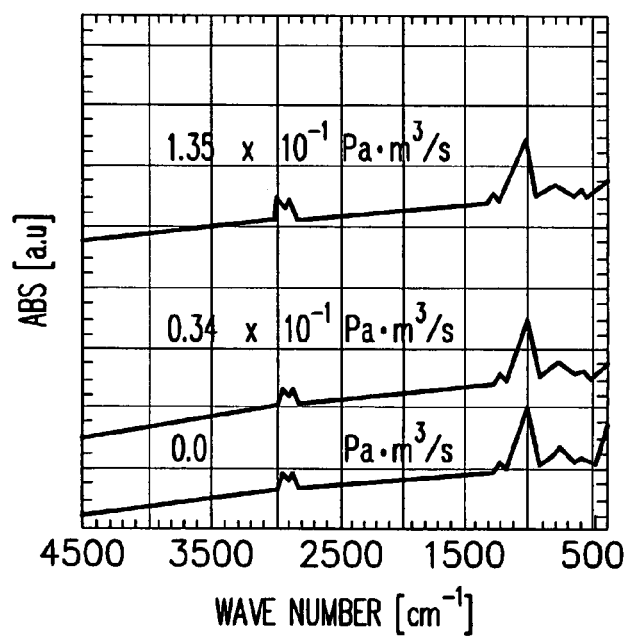
FIG. 29 is a graph showing the results of Fourier-transform infrared spectroscopic analysis (FT-IR) of an insulating film according to a fifth embodiment.
Figure 32:
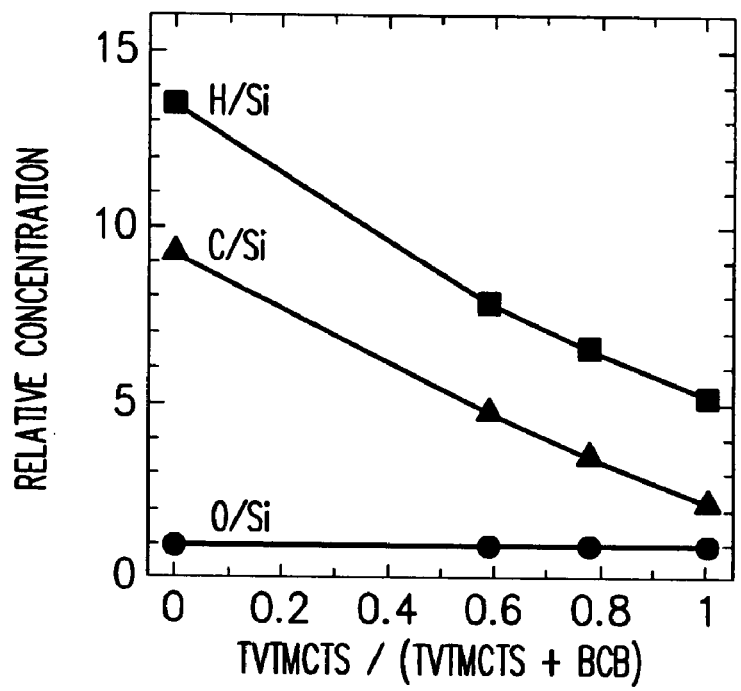
FIG. 32 is a graph showing the results of composition analysis of an insulating film by a Rutherford back scattering/hydrogen forward scattering (RBS/HFS) method as a function of the supply ratio of a raw material according to a sixth embodiment.
Figure 33:
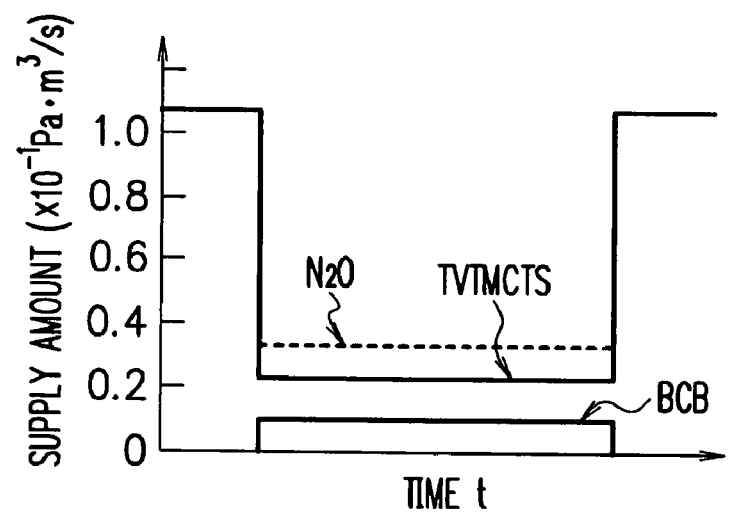
FIG. 33 is a graph schematically showing the film-forming sequence of an insulating film according to a sixth embodiment.
Figure 36:
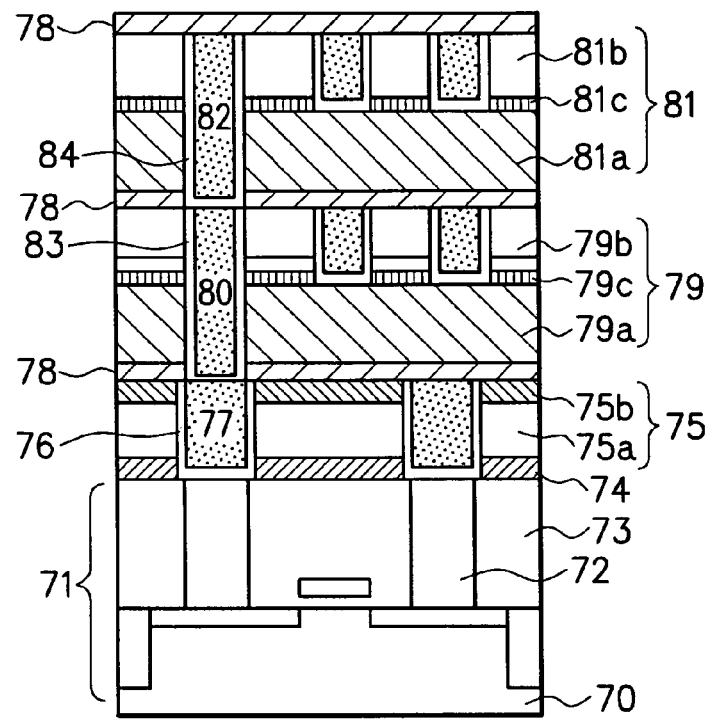
FIG. 36 is a diagram of a dual damascene wiring structure in a MOSFET device according to an eighth embodiment.
Figure 37:
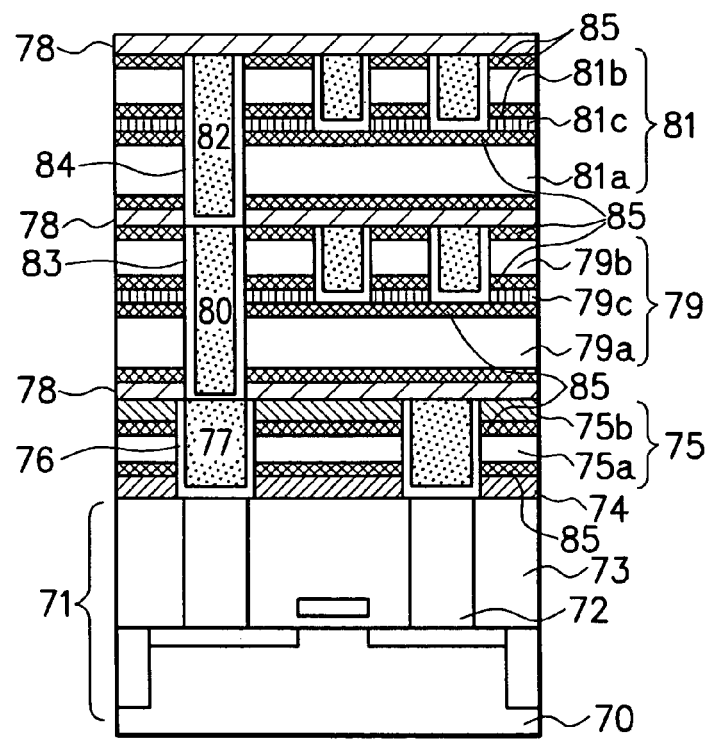
FIG. 37 is a diagram of a dual damascene wiring structure in a MOSFET device according to a ninth embodiment.
Figure 38:
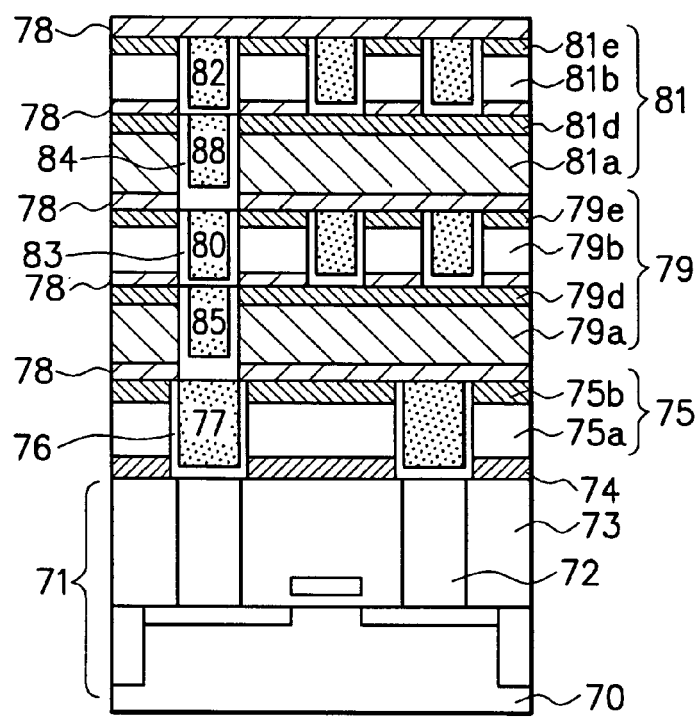
FIG. 38 is a diagram of a single damascene wiring structure in a MOSFET device according to a tenth embodiment.
Figure 39:
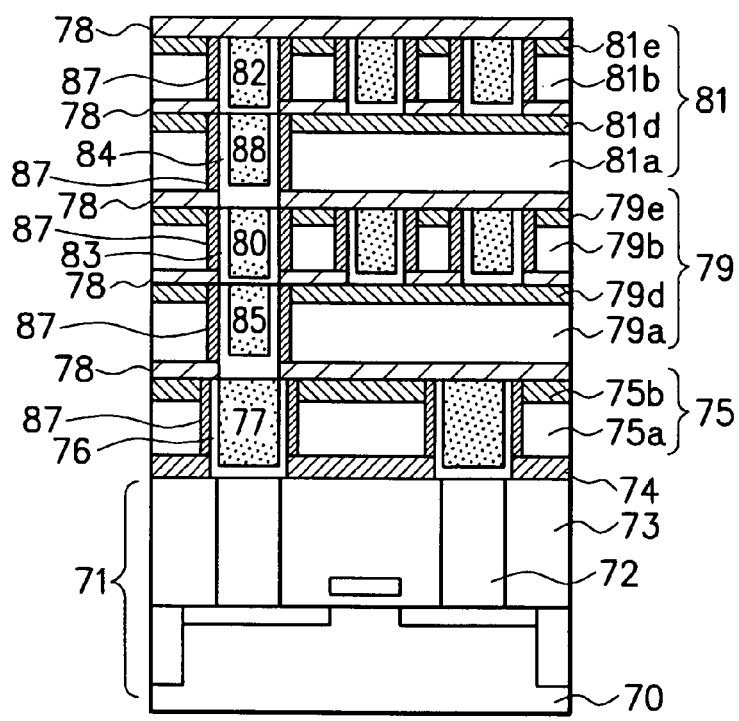
FIG. 39 is a diagram of a single damascene wiring structure in a MOSFET device according to an eleventh embodiment, in which a 10-nm-thick protective film is formed on the side wall of a copper wiring.

| | |
|---|---|
| 1. | Reaction chamber |
| 2. | Semiconductor substrate |
| 3. | Substrate heating part |
| 4. | Shower head |
| 5. | Earth line |
| 6. | Reaction chamber heating heater |
| 7. | Exhaust pipe |
| 8. | Cooling trap |
| 9. | Vacuum pump |
| 10. | Drain pipe |
| 11. | RF cable |
| 12. | Matching controller |
| 13. | RF power source |
| 14. | Earth line |
| 15. | Gasified raw material supply pipe |
| 16a, 16b. | Gasifying and supply system |
| 17. | Cleaning gas, oxidizing gas, diluent gas |
| 18. | Flow controller |
| 19. | Gas pipe |
| 20, 21a, 21b, 22. | Valve |
| 23. | Exhaust pipe heater |
| 24. | Liquid monomer raw material |
| 25. | Raw material tank |
| 26. | Carrier gas |
| 27. | Raw material supply pipe |
| 28. | Washing solvent |
| 29. | Washing solvent tank |
| 30. | Gasified raw material supply pipe |
| 31. | Washing solvent supply pipe |
| 32. | Raw material flow controller |
| 33. | Solvent flow controller |
| 34. | Carrier gas flow controller |
| 35. | Gasification controller |
| 36. | Raw material/carrier gas supply pipe |
| 37. | Gasifying chamber |
| 38. | Heater |
| 39. | Gasified raw material supply pipe |
| 40. | Heater |
| 41. | Drain pipe |
| 42 to 52. | Valve |
| 53. | Carrier gas |
| 54. | Flow controller |
| 55. | Valve |
| 56. | Carrier gas supply pipe |
| 57. | Heater |
| 58. | Gasifying chamber |
| 59. | Raw material |
| 60. | Gasified raw material supply pipe |
| 61. | Valve |
| 62. | Flow controller |
| 63. | Valve |
| 64. | Gasified raw material supply pipe |
| 65. | Heater |
| 66. | Valve |
| 67. | Gasified raw material supply pipe |
| 68. | Valve |
| 69. | Drain pipe |
| 70. | Silicon substrate |
| 71. | MOSFET |
| 72. | Contact plug |
| 73. | Inorganic layer insulating film |
| 74. | Copper diffusion barrier film |
| 75. | First layer insulating film |
| 75a. | First layer porous insulating film |
| 75b. | First layer hard mask |
| 76. | First layer copper diffusion barrier metal |
| 77. | First layer copper wiring |
| 78. | Copper diffusion barrier film |
| 79. | Second layer insulating film |
| 79a. | First via layer insulating film |
| 79b. | Second layer insulating film |
| 79c. | Etching stopper film |
| 79d. | Second via layer insulating film hard mask |
| 79e. | Second wiring layer insulating film hard mask |
| 80. | Second layer copper wiring |
| 81. | Third layer insulating film |
| 81a. | Second via layer insulating film |
| 81b. | Second wiring layer insulating film |
| 81c. | Etching stopper film |
| 81d. | Second via layer insulating film hard mask |
| 81e. | Third wiring layer insulating film hard mask |
| 82. | Third layer copper wiring |
| 83, 84. | Copper diffusion barrier metal |
| 85. | First via |
| 86. | Second via |
| 87. | Copper wiring side wall protective film |

The invention claimed is:

1. A method of producing a porous insulating film, comprising the step of:
   introducing gas containing vapor of cyclic organic silica compounds, which have silicon and oxygen skeletons and have at least one unsaturated hydrocarbon group bound with a side chain of one of said silicon and oxygen skeletons, and which is diluted with an inert gas, into plasma to grow a porous insulating film on a semiconductor substrate, wherein said plasma is plasma of mixture gas of rare gas and hydrogenated silicon gas.

2. The method of producing a porous insulating film according to claim 1, wherein said cyclic organic silica compounds are cyclosiloxane monomers represented by the following formula (2):

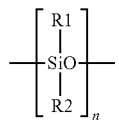

(2) Cyclosiloxane monomer where $R_1$ and $R_2$ are respectively any one of the group consisting of hydrogen, an alkyl group, an alkoxide group, an amino group, alkene, alkyne, a phenyl group and a phenol group, provided that $R_1$ and $R_2$ may be the same or different, provided that at, least one of the side chain groups is an unsaturated hydrocarbon group, and n is an integer of 2 or more.

3. The method of producing a porous insulating film according to claim 2, wherein said cyclic organic silica compounds are trivinylcyclotrisiloxane derivative monomers represented by the following formula (3):

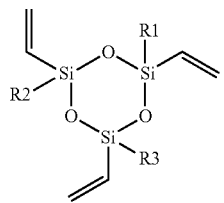

(3) Trivinylcyclotrisiloxane derivative.

4. The method of producing a porous insulating film according to claim 2, wherein said cyclic organic silica compound is tetravinyltetramethylcyclotetrasiloxane monomers represented by the following formula (4),

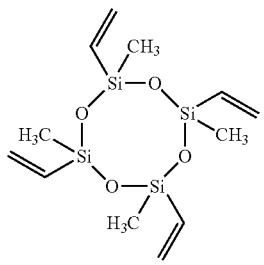

(4) Tetravinyltetramethylcyclotetrasiloxane.

5. The method of claim 1, wherein the introduced gas consists of a vapor of cyclic organic silica compounds and the inert gas.

6. A porous insulating film produced by the method of producing a porous insulating film according to claim 1.

7. The porous insulating film according to claim 6, comprising at least silicon, carbon, oxygen and hydrogen and having a Raman spectrum corresponding to at least three-membered silica skeleton in the Raman spectroscopic analysis.

8. The porous insulating film according to claim 6, wherein ratios of elements in the film is: O/Si=0.8 to 1.2, C/Si=1.5 to 10.0 and H/Si=4.0 to 15.0.

9. The porous insulating film according to claim 6, wherein the diameter of pores contained in the film is 3 nm or less.

10. The porous insulating film according to claim 6, wherein at least a part of pores contained in the film have almost the same diameters as a skeleton of said cyclic organic silica compounds.

11. A semiconductor device using the porous insulating film according to claim 6 as a layer insulating film off multi-layer wiring.

12. The semiconductor device according to claim 11, wherein in the vicinity of a interface between the porous insulating film and a non-porous insulating film, a relative concentration of carbon atom in at least the porous insulating film changes stepwise or continuously.

13. The semiconductor device according to claim 11, wherein said cyclic organic silica compounds are cyclosiloxane monomers represented by said formula (2), where $R_1$ and $R_2$ are any one selected from the group consisting of hydrogen, an alkyl group, an alkoxide group, an amino group, alkene, alkyne, a phenyl group and a phenol group, provided that $R_1$ and $R_2$ may be the same or different, provided that at least one of side chain groups is an unsaturated hydrocarbon group, and n is an integer of 2 or more.

14. The semiconductor device according to claim 13, wherein said cyclic organic silica compounds are tetravinyltetramethylcyolotetrasiloxane monomers represented by said formula (4).

15. The semiconductor device according to claim 13, wherein said cyclic organic silica compounds are trivinylcyclotrisiloxane derivative monomers represented by said formula (3).

16. A method of producing a porous insulating film, comprising the step of:

introducing vapor of cyclic organic silica compounds, which have silicon and oxygen skeletons and have at least one unsaturated hydrocarbon group bound with a side chain of one of said silicon and oxygen skeletons, and which is diluted with an inert gas, and vapor of straight-chain organic silica compounds, which have silicon and oxygen skeletons and have any one selected from the group consisting of hydrogen, a hydrocarbon group and a hydrocarbon oxide group bound with a side chain of the skeleton, and which is diluted with an inert gas, into plasma to grow a porous insulating film on a semiconductor substrate, wherein said plasma is plasma of mixture gas of rare gas and hydrogenated silicon gas.

17. The method of producing a porous insulating film according to claim 16, wherein said straight-chain organic silica compounds have a structure represented by the following formula (1):

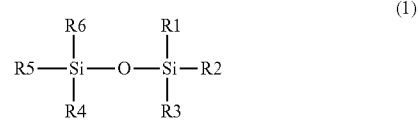

where $R_1$ to $R_6$, which may be the same or different, respectively represent any one selected from the group consisting of hydrogen, a hydrocarbon group and a hydrocarbon oxide group; or

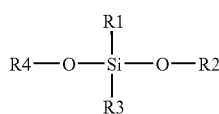

where $R_1$ to $R_4$, which may be the same or different, respectively represent any one selected from the group consisting of hydrogen, a hydrocarbon group and a hydrocarbon oxide group; or

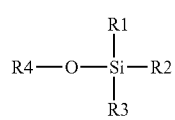

where $R_1$ to $R_4$, which may be the same or different, respectively represent any one selected from the group consisting of hydrogen, a hydrocarbon group and a hydrocarbon oxide group; or

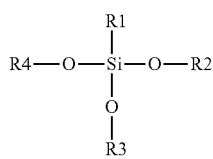

where $R_1$ to $R_4$, which may be the same or different, respectively represent any one selected from the group consisting of hydrogen, a hydrocarbon group and a hydrocarbon oxide group.

18. The method of producing a porous insulating film according to claim 16, wherein a supply ratio of said cyclic organic silica compounds to said straight-chain organic silica compounds is changed during film formation.

19. The method of producing a porous insulating film according to claim 16, wherein said cyclic organic silica compounds are tetravinyltetramethyl-cyclotetrasiloxane monomers represented by the formula (4) and said straight-chain organic silica compounds are divinylsiloxanebenzocyclobutene monomers represented by the following formula (5):

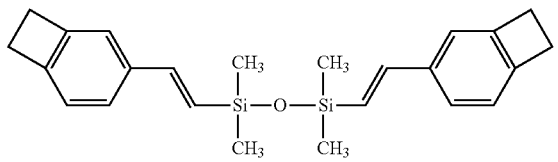

(5) Divinylsiloxanebenzocyclobutene.

20. A porous insulating film produced by the method of producing a porous insulating film according to claim 16.

21. A semiconductor device using the, porous insulating film produced by the method of claim 20.

22. The semiconductor device according to claim 21, wherein said straight-chain organic silica compounds have, a structure represented by said formula (1).

23. The method of claim 16, wherein said cyclic organic silica compounds have a saturated hydrocarbon group bound with another side chain of said skeleton, and wherein said saturated hydrocarbon group has at least two carbon atoms.

24. The method of claim 16, wherein the introduced, gas consists of a vapor of cyclic organic silica compounds and the inert gas.

25. The semiconductor device according to claim 22, wherein said straight-chain organic silica compounds are divinylsiloxanebenzocyclobutene monomers represented by formula (5):

[formula 10]

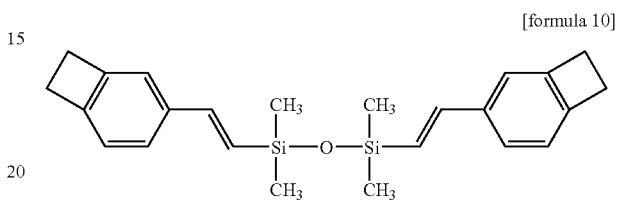

(5) Divinylsiloxanebenzocyclobutene.

26. A porous insulating film having a distribution of pore diameter with a single peak, wherein the specific inductive capacity is equal to or greater than 2.1 and equal to or smaller than 2.7, and wherein pores within said porous insulating film are enclosed within silica skeletons formed from polymerized cyclic organic silica molecules, and wherein a concentration of carbon in the vicinity of the surface of the porous insulating film changes continuously or stepwise.

27. The porous insulating film according to claim 26, wherein a ratio of elements in the film is C/Si=1.5 to 10.0.

28. The porous insulating film according to claim 26, wherein a pore diameter at the maximum frequently appearance is equal to or smaller than 1 nm.

29. The porous insulating film according to claim 26, comprising three membered silica.

30. A semiconductor device using the porous insulating film according to claim 26 as a layer insulating film.

31. The porous insulating filth of claim 26, wherein said cyclic organic silica molecules have a saturated hydrocarbon group bound with another side chain of said skeleton, and wherein said saturated hydrocarbon group has at least two carbon atoms.

32. The porous insulating film according to claim 27, wherein a ratio of elements in the film is O/Si=0.8 to 1.2.

33. The porous insulating film according to claim 32, wherein a ratio of elements in the film is H/Si=4.0 to 15.0.

34. The semiconductor device of claim 30, further comprising a non-porous insulating film which is in contact with the porous insulating film, wherein a concentration of carbon in the vicinity of the interface between the porous insulating film, and the non-porous insulating film changes continuously or stepwise.

35. The semiconductor device of claim 30, further comprising a wiring layer and a via layer, wherein a layer of insulating film of the wiring layer is the porous insulating film, and a carbon concentration of the porous insulating film is higher than the carbon concentration of the layer of insulating film of the via layer.

36. The semiconductor device of claim 30, further comprising a wiring layer and a via layer, wherein a layer of insulating film of the wiring layer or a layer of insulating film of the via layer is the porous insulating film.

37. The semiconductor device of claim 30, further comprising a wiring layer, wherein the porous insulating film is located between a wire of the wiring layer and other wiring of the wiring layer.

38. A method of producing a porous insulating film, comprising the step of:
introducing gas containing vapor of cyclic organic silica compounds which have silicon and oxygen skeletons and have at least one unsaturated hydrocarbon group bound with a side chain of one of said silicon and oxygen skeletons, and which is diluted with an inert gas, into plasma to grow a porous insulating film on a semiconductor substrate, wherein said cyclic organic silica compounds have a saturated hydrocarbon group bound with another side chain of said skeleton, and wherein said saturated hydrocarbon group has at least two carbon atoms.

39. The method of claim 38, wherein the cyclic organic silica compounds enter into a polymerization reaction by plasma energy and thermal energy from a substrate heating part to grow said porous insulating film.

40. The method of claim 38, wherein a raw material of the cyclic organic silica compounds is heated under reduced pressure to be gasified.

41. The method of claim 38, wherein a composition ratio C/Si of the porous insulating film is 2.11 smaller than or equal to a composition ratio C/Si of the cyclic Organic silica compounds.

42. The method of claim 38, wherein a composition ratio O/Si of the porous insulating film is 0.12 greater than or equal to a composition ratio O/Si of the cyclic organic silica compounds.

43. The method of claim 38, wherein a composition ratio H/Si of the porous insulating film is 3.90 smaller than or equal to a composition ratio H/Si of the cyclic organic silica compounds.

44. The method of claim 38, further comprising the step of introducing oxidizer gas with the vapor of cyclic organic silica compounds into plasma.

45. The method of claim 38, wherein the saturated hydrocarbon group has at least three carbon atoms and has a branched structure.

46. The method of claim 38, wherein the saturated hydrocarbon group is an ethyl group (—$CH_2CH_3$) or a propyl group (—$CH_2CH_2CH_3$).

47. The method of claim 38, wherein the cyclic organic silica compounds have a six-membered ring structure consisting of three silicon atoms and three oxygen atoms.

48. The method of claim 39, wherein a temperature of the substrate heating part is from 200 to 450° C.

49. The method of claim 39, wherein the polymerization reaction runs under a condition that a power density of plasma formation is from 0.141 W/cm² to 0.424 W/cm².

50. The method of claim 44, wherein a flow rate of the oxidizer gas is from 0.3-fold to 1.2-fold of a flow rate of the vapor of cyclic organic silica compounds.

51. The method of claim 44, wherein the flow rate of the oxidizer gas is from $3.38 \times 10^{-2}$ Pa·m³/s to $1.35 \times 10^{-1}$ Pa·m³/s.

52. The method of claim 44, wherein the oxidizer gas is selected from $N_2O$, oxygen, carbon dioxide, an alcohol ROH where R is a hydrocarbon, or phenol PhOH where Ph is a phenyl group, and a mixture of these.

53. The method of claim 52, wherein the alcohol is selected from methyl alcohol, ethyl alcohol, normal propyl alcohol, isopropyl alcohol, normal butyl alcohol and isobutyl alcohol.

54. The method of claim 45, wherein the saturated hydrocarbon group is an isopropyl group (—$CH(CH_3)_2$ or a tertiary butyl group (—$C(CH3)_3$).

55. The method of claim 47, wherein the cyclic organic silica compounds are trivinyltriisopropylcyclotrisiloxane monomers represented by formula (6):

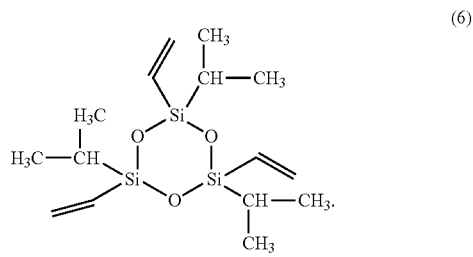

56. A porous insulating film produced by the method comprising the step of:
introducing gas containing vapor of cyclic organic silica compounds which have silicon and oxygen skeletons and have at least one unsaturated hydrocarbon group bound with a side chain of one of said silicon and oxygen skeletons, and which is diluted with an inert gas, into plasma to grow a porous insulating film on a semiconductor substrate, wherein said cyclic organic silica compounds have a saturated hydrocarbon group bound with another side chain of said skeleton, and wherein said saturated hydrocarbon group has at least two carbon atoms.

57. The porous insulating film of claim 56, wherein the cyclic organic silica compounds have a six-membered ring structure consisting of three silicon atoms and three oxygen atoms.

58. The porous insulating film of claim 56, wherein a diameter of pores in the porous insulating film is smaller than 0.5 nm.

59. The porous insulating film of claim 56, wherein pores in the porous insulating film have the same diameters as skeletons of the cyclic organic silica compounds.

60. The porous insulating film of claim 57, having a spectrum corresponding to at least a three-membered silica skeleton when analyzed by Raman spectroscopy.

61. The porous insulating film produced of claim 57 wherein the cyclic organic silica compounds are trivinyltriisopropylcyclotrisiloxane monomers represented by formula (6):

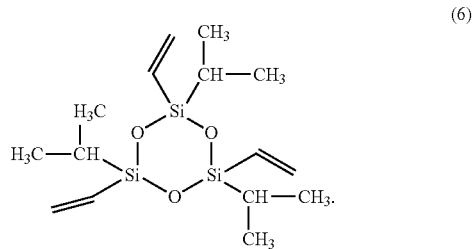

62. The porous insulating film of claim 61, wherein a C/Si composition ratio of the porous, insulating film is from 2.89 to 3.33.

63. The porous insulating film of claim 61, wherein a O/Si composition ratio of the porous insulating film is from 1.12 to 1.21.

64. The porous insulating film of claim 61, wherein a H/Si composition ratio of the porous insulating film is from 6.10 to 7.74.

65. The porous insulating film of claim 61, wherein a specific inductive capacity of the porous insulating film is from 2.3 to 2.6.

66. A semiconductor device comprising
multilayer wiring with a porous insulating film layer, wherein said porous insulating film layer is produced by a method comprising the step of:
introducing gas containing vapor of cyclic organic silica compounds, which have silicon and oxygen skeletons and have a least one unsaturated hydrocarbon group bound with a side chain of one of said silicon and oxygen skeletons, and which is diluted with an inert gas, into plasma to grow a porous insulating film on a semiconductor substrate, wherein said cyclic organic silica compounds have a saturated hydrocarbon group bound with another side chain of said skeleton, and wherein said saturated hydrocarbon group has at least two carbon atoms.

67. The semiconductor device of claim 66, further comprising a non-porous insulating film which is in contact with the porous insulating film, wherein the concentration of carbon in the vicinity of an interface between the porous insulating film and the non-porous insulating film changes continuously or stepwise.

68. The semiconductor device of claim 66, further comprising a wiring layer and a via layer, wherein a layer of insulating film of the wiring layer is the porous insulating film, and the carbon concentration of the porous insulating film is higher than the carbon concentration of the layer insulating film of the via layer.

69. The semiconductor device of claim 66, further comprising a wiring layer and a via layer, wherein at least either of a layer of insulating film of the wiring layer and a layer of insulating film of the via layer is the porous insulating film.

70. The semiconductor device of claim 66, further comprising a wiring layer, wherein the porous insulating film is between a wire of the wiring layer and other wire of the wiring layer.

* * * * *